(12) United States Patent
Wang

(10) Patent No.: US 8,391,410 B2
(45) Date of Patent: Mar. 5, 2013

(54) METHODS AND APPARATUS FOR CONFIGURING A PILOT SYMBOL IN A WIRELESS COMMUNICATION SYSTEM

(75) Inventor: Michael Mao Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 710 days.

(21) Appl. No.: 11/535,940

(22) Filed: Sep. 27, 2006

(65) Prior Publication Data

US 2007/0082696 A1 Apr. 12, 2007

Related U.S. Application Data

(63) Continuation-in-part of application No. 11/193,053, filed on Jul. 29, 2005, now Pat. No. 7,583,584.

(60) Provisional application No. 60/592,999, filed on Jul. 29, 2004.

(51) Int. Cl.
| | |
|---|---|
| H04L 27/20 | (2006.01) |
| H03K 7/04 | (2006.01) |
| H03K 7/06 | (2006.01) |
| H03K 9/04 | (2006.01) |
| H03K 9/06 | (2006.01) |
| H04L 27/18 | (2006.01) |

(52) U.S. Cl. ........ 375/308; 375/239; 375/279; 375/302; 375/329

(58) Field of Classification Search .......... 375/239, 375/279, 329, 308
See application file for complete search history.

(56) References Cited

U.S. PATENT DOCUMENTS

| | | | | |
|---|---|---|---|---|
| 5,177,766 | A | * | 1/1993 | Holland et al. ............... 375/141 |
| 5,315,592 | A | | 5/1994 | Conant et al. |
| 5,943,330 | A | * | 8/1999 | Hottinen ....................... 370/335 |
| 6,145,111 | A | | 11/2000 | Crozier et al. |
| 6,154,484 | A | * | 11/2000 | Lee et al. ....................... 375/130 |
| 6,172,993 | B1 | | 1/2001 | Kim et al. |
| 6,208,663 | B1 | | 3/2001 | Schramm et al. |

(Continued)

FOREIGN PATENT DOCUMENTS

| | | |
|---|---|---|
| AU | 2007300037 | 4/2008 |
| CN | 1345493 A | 4/2002 |

(Continued)

OTHER PUBLICATIONS

"Forward Link Only Air Interface Specification for Terrestrial Mobile Multimedia Multicast: TIA-1099" EIMIA Standards, Telecomm, Industry Assoc., Aug. 1, 2006, XP017005609, Arlington, VA, Secs. 5.2.1.2..9.2.7, 5.2.1.2.9.2.8, 5.2.1.2.10.

(Continued)

Primary Examiner — Erin File
(74) Attorney, Agent, or Firm — Arent Fox, LLP

(57) ABSTRACT

Methods and apparatus for constructing a pilot symbol for a communication frame transmitted in a wireless communication system, such as an OFDM system, are disclosed. In particular, the methods and apparatus generate at least one pseudo-random noise sequence having at least a predetermined length, where the at least one pseudo-random noise sequence represents a system configuration of a wireless system. A time domain symbol sequence is modulated with the at least one pseudo-random noise sequence to create a timing acquisition pilot symbol. The modulated acquisition pilot symbol is further masked to a prescribed frequency profile and placed in a frame for wireless transmission. Accordingly, different system configurations can be communicated from a transmitter to a receiver with the acquisition pilot symbol modulated with correspondingly different pseudo-random noise sequences, while affording low complexity required to process the acquisition pilot symbol and a minimum peak to average power ratio when using QPSK modulation.

30 Claims, 34 Drawing Sheets

U.S. PATENT DOCUMENTS

| | | | |
|---|---|---|---|
| 6,243,379 B1 | 6/2001 | Veerina et al. | |
| 6,298,463 B1 | 10/2001 | Bingeman et al. | |
| 6,304,581 B1 | 10/2001 | Chen et al. | |
| 6,311,306 B1 | 10/2001 | White et al. | |
| 6,392,572 B1 | 5/2002 | Shiu et al. | |
| 6,421,333 B1 | 7/2002 | Jalali | |
| 6,580,497 B1* | 6/2003 | Asaka et al. | 356/28.5 |
| 6,597,726 B2 | 7/2003 | Ozluturk | |
| 6,611,551 B1 | 8/2003 | Jones, IV et al. | |
| 6,667,962 B1* | 12/2003 | Lee et al. | 370/335 |
| 6,697,990 B2 | 2/2004 | El-Gamal et al. | |
| 6,738,370 B2 | 5/2004 | Ostman | |
| 6,747,948 B1 | 6/2004 | Sarraf et al. | |
| 6,754,170 B1 | 6/2004 | Ward | |
| 6,956,842 B1 | 10/2005 | Okumura et al. | |
| 6,961,388 B2 | 11/2005 | Ling et al. | |
| 6,973,118 B1 | 12/2005 | Ikeda et al. | |
| 7,002,900 B2 | 2/2006 | Walton et al. | |
| 7,031,251 B2 | 4/2006 | Chen et al. | |
| 7,039,000 B2 | 5/2006 | You et al. | |
| 7,093,185 B2 | 8/2006 | Kim et al. | |
| 7,120,696 B1* | 10/2006 | Au et al. | 709/229 |
| 7,145,940 B2 | 12/2006 | Gore et al. | |
| 7,154,936 B2 | 12/2006 | Bjerke et al. | |
| 7,170,849 B1 | 1/2007 | Arivoli et al. | |
| 7,248,652 B2 | 7/2007 | Sayeed | |
| 7,251,282 B2 | 7/2007 | Maltsev et al. | |
| 7,251,768 B2 | 7/2007 | Giannakis et al. | |
| 7,289,459 B2 | 10/2007 | Hayashi et al. | |
| 7,298,787 B2 | 11/2007 | Priotti | |
| 7,324,590 B2 | 1/2008 | Abrishamkar et al. | |
| 7,411,898 B2 | 8/2008 | Erlich et al. | |
| 7,457,350 B2 | 11/2008 | Baker et al. | |
| 7,583,584 B2 | 9/2009 | Wang et al. | |
| 2002/0122383 A1 | 9/2002 | Wu et al. | |
| 2002/0131481 A1* | 9/2002 | Ozluturk | 375/147 |
| 2002/0167924 A1* | 11/2002 | Agrawal et al. | 370/335 |
| 2003/0174686 A1 | 9/2003 | Willenegger et al. | |
| 2004/0199846 A1 | 10/2004 | Matsumoto et al. | |
| 2004/0203885 A1 | 10/2004 | Quaid | |
| 2004/0218570 A1* | 11/2004 | Black et al. | 370/335 |
| 2005/0016201 A1 | 1/2005 | Ivanov et al. | |
| 2005/0111524 A1* | 5/2005 | Baker et al. | 375/147 |
| 2005/0122928 A1 | 6/2005 | Vijayan et al. | |
| 2005/0135308 A1 | 6/2005 | Vijayan et al. | |
| 2005/0135517 A1 | 6/2005 | Coffey et al. | |
| 2005/0195763 A1* | 9/2005 | Kadous et al. | 370/328 |
| 2006/0034163 A1* | 2/2006 | Gore et al. | 370/208 |
| 2006/0109781 A1 | 5/2006 | Wang et al. | |
| 2006/0117167 A1* | 6/2006 | Evrard et al. | 712/208 |
| 2006/0123310 A1 | 6/2006 | Wang et al. | |
| 2006/0133388 A1 | 6/2006 | Wang et al. | |
| 2006/0209927 A1 | 9/2006 | Khandekar et al. | |
| 2006/0215538 A1 | 9/2006 | Murthy et al. | |
| 2006/0280228 A1* | 12/2006 | Daniele et al. | 375/142 |
| 2007/0025738 A1* | 2/2007 | Moore | 398/189 |
| 2007/0036065 A1 | 2/2007 | Wang | |
| 2007/0081484 A1 | 4/2007 | Wang | |
| 2007/0082696 A1 | 4/2007 | Wang | |
| 2007/0232251 A1 | 10/2007 | Murthy et al. | |
| 2008/0317142 A1 | 12/2008 | Wang et al. | |
| 2009/0161776 A1 | 6/2009 | Wang et al. | |

FOREIGN PATENT DOCUMENTS

| | | |
|---|---|---|
| EP | 0938208 | 8/1999 |
| EP | 1222828 A1 | 7/2002 |
| EP | 1304812 A1 | 4/2003 |
| JP | 09261209 | 10/1997 |
| JP | 10210000 A | 8/1998 |
| JP | 2000013356 A | 1/2000 |
| JP | 2000031838 A | 1/2000 |
| JP | 2000068975 | 3/2000 |
| JP | 2001217861 | 8/2001 |
| JP | 2001268048 A | 9/2001 |
| JP | 2001320345 A | 11/2001 |
| JP | 2001339657 A | 12/2001 |
| JP | 2002057640 A | 2/2002 |
| JP | 2002111621 A | 4/2002 |
| JP | 2003124904 A | 4/2003 |
| JP | 2003518816 T | 6/2003 |
| JP | 2003188848 A | 7/2003 |
| JP | 2003521842 A | 7/2003 |
| JP | 2003524929 A | 8/2003 |
| JP | 2003309535 A | 10/2003 |
| JP | 2005536097 T | 11/2005 |
| KR | 20010088148 | 9/2001 |
| KR | 2004-61482 | 7/2004 |
| NZ | 211474 | 2/1989 |
| NZ | 503592 A | 2/2002 |
| RU | 2134017 C1 | 7/1999 |
| RU | 2137310 C1 | 9/1999 |
| RU | 2178953 C2 | 1/2002 |
| RU | 2003109329 A | 1/2005 |
| SU | 1327296 A1 | 7/1987 |
| TW | I228893 | 3/2005 |
| TW | I237511 | 8/2005 |
| TW | I244349 | 11/2005 |
| WO | 0035102 | 6/2000 |
| WO | WO0034799 A1 | 6/2000 |
| WO | WO0036208 A1 | 6/2000 |
| WO | WO0049780 A1 | 8/2000 |
| WO | WO0065726 | 11/2000 |
| WO | WO0074248 A1 | 12/2000 |
| WO | WO0105059 A1 | 1/2001 |
| WO | WO0147157 A2 | 6/2001 |
| WO | WO02065647 A1 | 8/2002 |
| WO | 02099994 | 12/2002 |
| WO | WO2004015948 A1 | 2/2004 |
| WO | WO2004038987 A2 | 5/2004 |
| WO | WO2004039027 | 5/2004 |
| WO | 2004082200 | 9/2004 |
| WO | WO2005022797 | 3/2005 |
| WO | WO2005043829 | 5/2005 |
| WO | WO2005076641 A1 | 8/2005 |
| WO | WO2006016212 A1 | 2/2006 |
| WO | WO2006069319 | 6/2006 |
| WO | WO2006086878 A1 | 8/2006 |
| WO | 2006099222 | 9/2006 |
| WO | 2006099326 | 9/2006 |

OTHER PUBLICATIONS

Murali R Chari et al: "FLO Physical Layer: An Overview" IEEE transactions on Broadcasting, vol. 53, No. 1, Mar. 1, 2007, pp. 145-160, XP011172013, IEEE Service Center, Piscataway, NJ, US, Issn: 0018-9316, Abstract; Figures 8,11,13, Sections IV.C.4), IV.C.8), IV.C.9 Standards.

Nevdyaev, L.M., Telecommunication Technologies, Moscow, Communication and Business, 2002, p. 347.

Tia:"Forward Link Only Air Interface Specification Rev. 1.1", INTERNET CITATION, pp. 114-130, Jan. 10, 2006 http://ftp.tiaonline.org/TR-47/TR471/Working/20060110-Arlington-meeting1/TR471-20060110-004a-FLO%20AIS.pdf.

Arshad K et al: "Performance of Wireless OFDM System Channel Estimation with Different Pilot Patterns" Spread Spectrum Techniques and Applications, 2004 IEEE Eighth International Symposium on Sydney, Australia Aug. 30-Sep. 2, 2004, Piscataway, NJ, USA, IEEE, Aug. 30, 2004, pp. 179-183, XP010754933.

Comsa C et al: "System level design of baseband OFDM for wireless LAN" Signals, Circuits and Systems, 2003. SCS 2003. International Symposium on Jul. 10-11, 2003, Piscataway, NJ, USA, IEEE, vol. 1, Jul. 10, 2003, pp. 313-316, XP010654936.

Muramatsu et al.:"Perfect reconstruction deinterlacer banks for field scalable video compression," International Conference on Image Processing, pp. 2279-2282, XP010786240, Oct. 24, 2004.

Parthasarathy et al.: "Reliable transmission of high-quality video over ATM network's," IEEE Transactions on Image Processing, vol. 8, No. 3, XP011026288, Mar. 1999.

Tia: "Forward Link Only Air Interface Specification" Rev. 1.1. Physical Layer, FLO Forum technical Contribution to TR47, Dec. 22, 2005. pp. 5-8 to 5-24.

Eroz et al.: "On the Design of Prunable Interleavers for Turbo codes." IEEE Vehicular Technology Conference, pp. 1669-1673, XP010342111, 1999.

Zhongren Cao et al.: "Efficient Structure-Based Carrier Frequency Offset Estimation for Interleaved OFDMA Uplink," IEEE, pp. 3361-3365, XP-010643069, 2003.

International Search Report—PCT/US07/079787, International Search Authority—European Patent Office—Feb. 27, 2008.

Hill "A First Course on Coding Theory", 1986 Oxford University Press, Chapter 2, pp. 11-13.

Patterson & Hennessey, "Computer Organization and Design" 1994, Morgan Kaufmann Publishers, Figure 5.11 and description thereof and discussion, pp. 280-285.

Taiwan Search Report—TW096136065—TIPO—Jan. 31, 2011.

Written Opinion—PCT/US07/079787, International Search Authority—European Patent Office—Feb. 27, 2008.

Taiwan Search Report—TW096136065—TIPO—May 24, 2012.

Taiwan Search Report—TW097128538—TIPO—Mar. 27, 2012.

\* cited by examiner

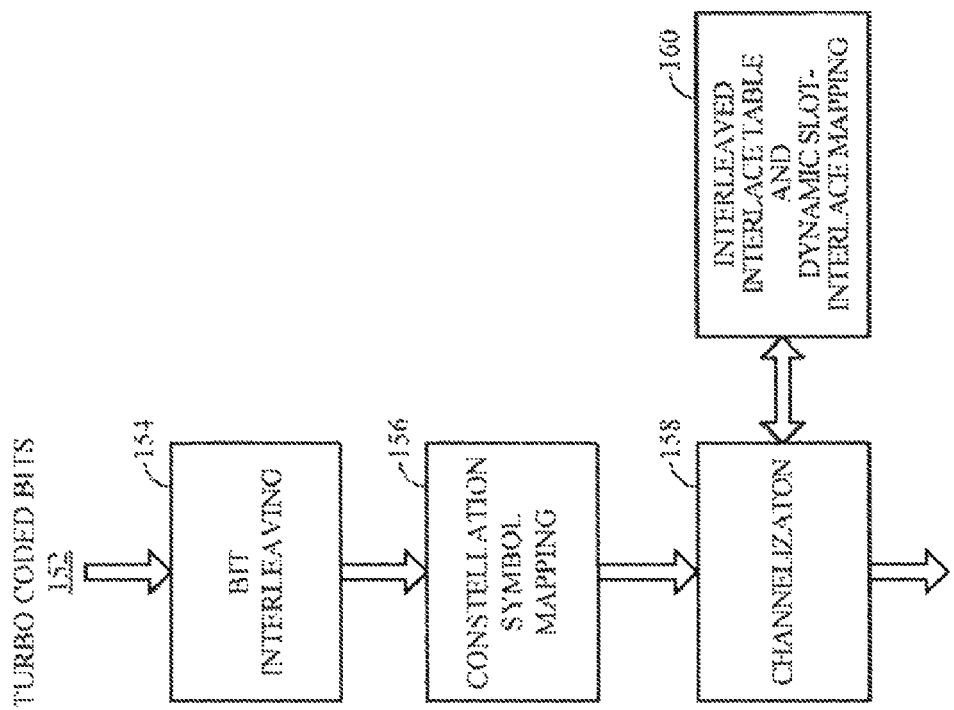
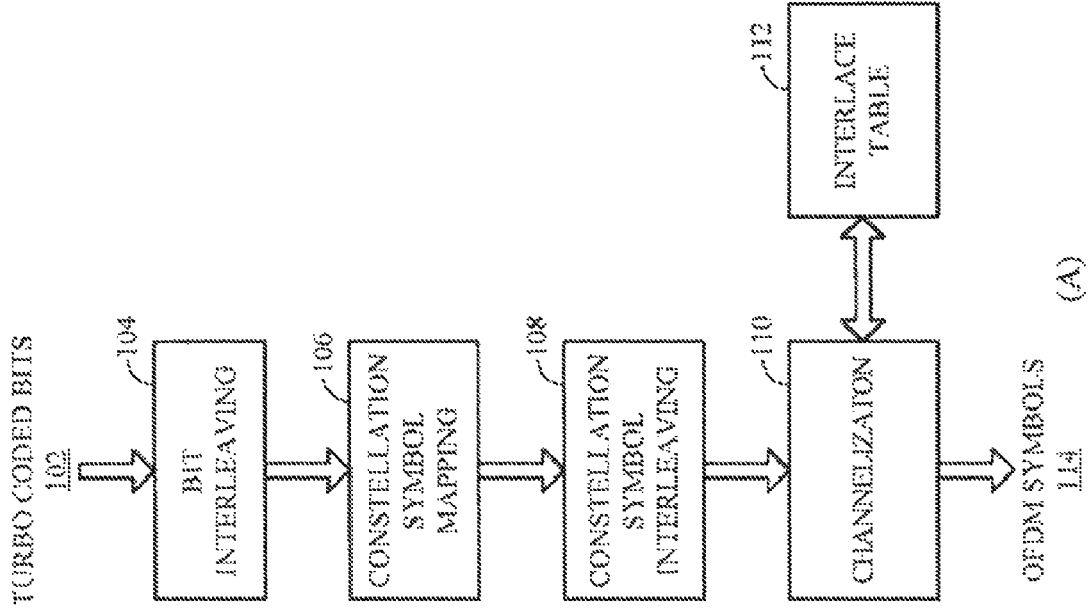
FIG. 1

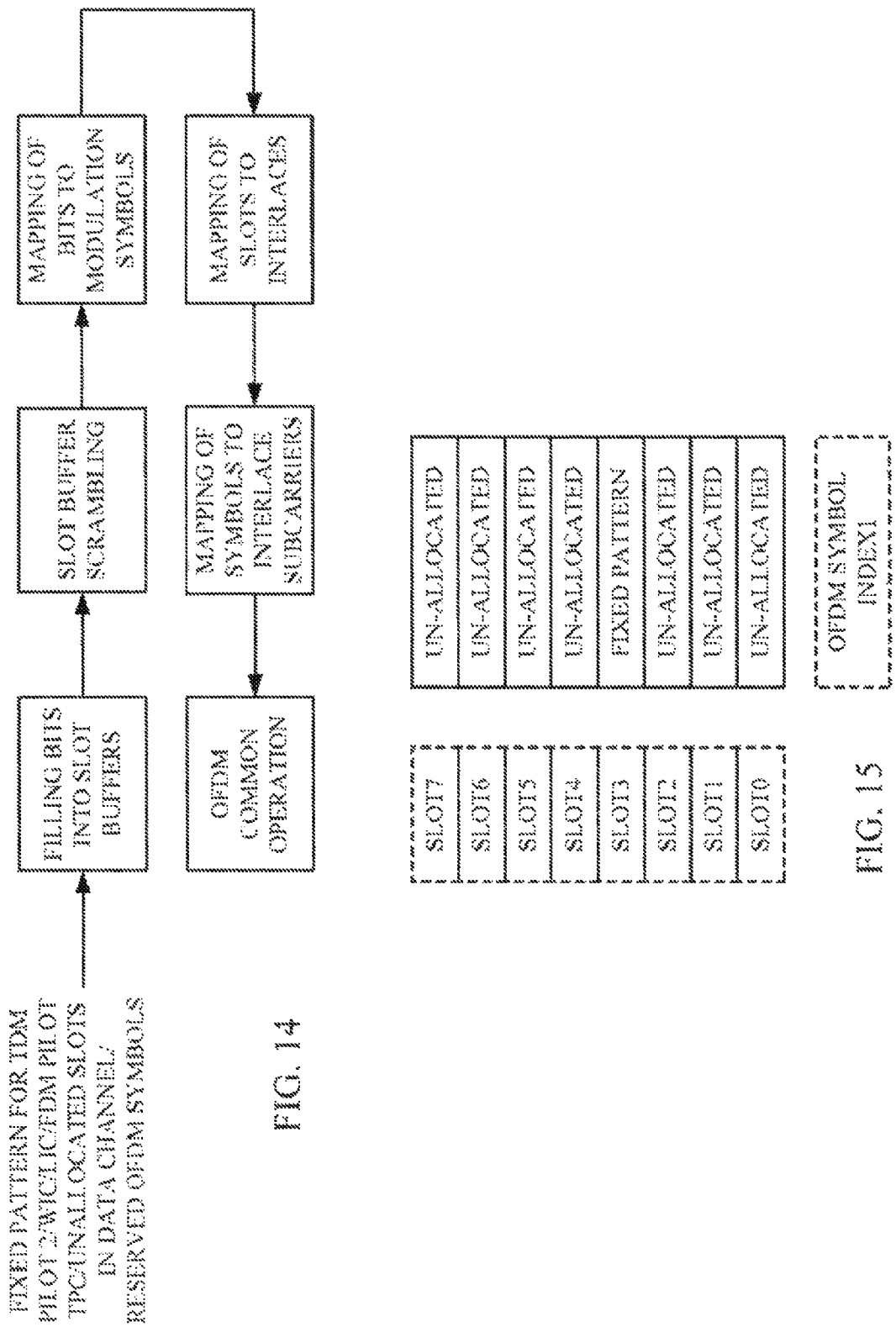

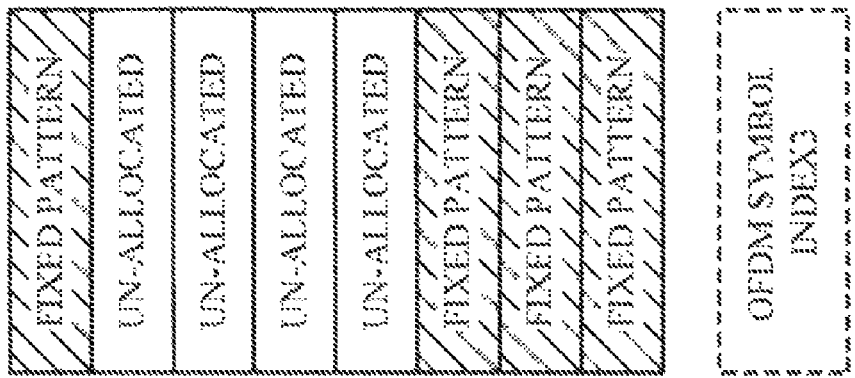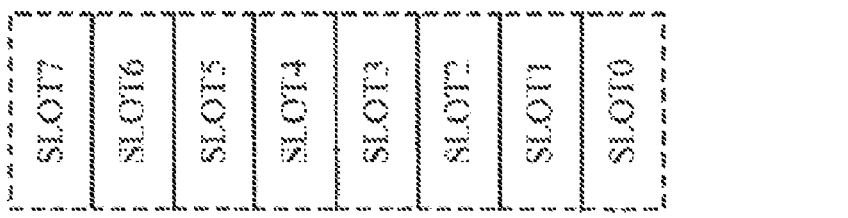
FIG. 18
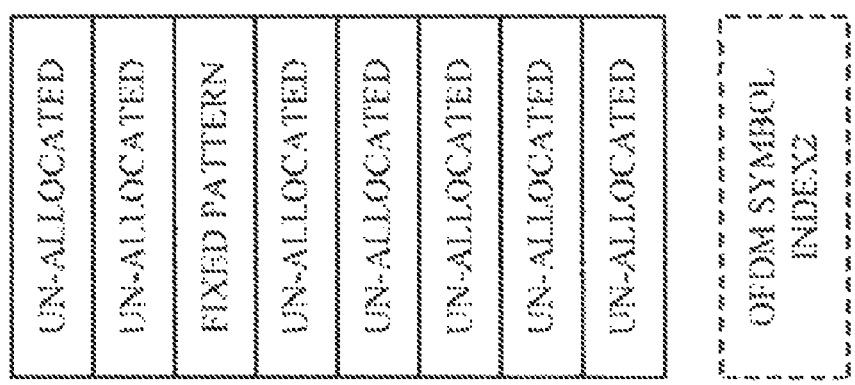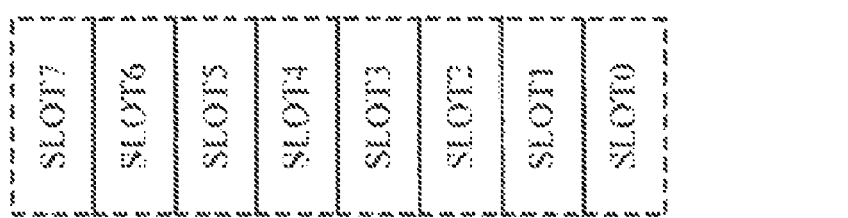
FIG. 17

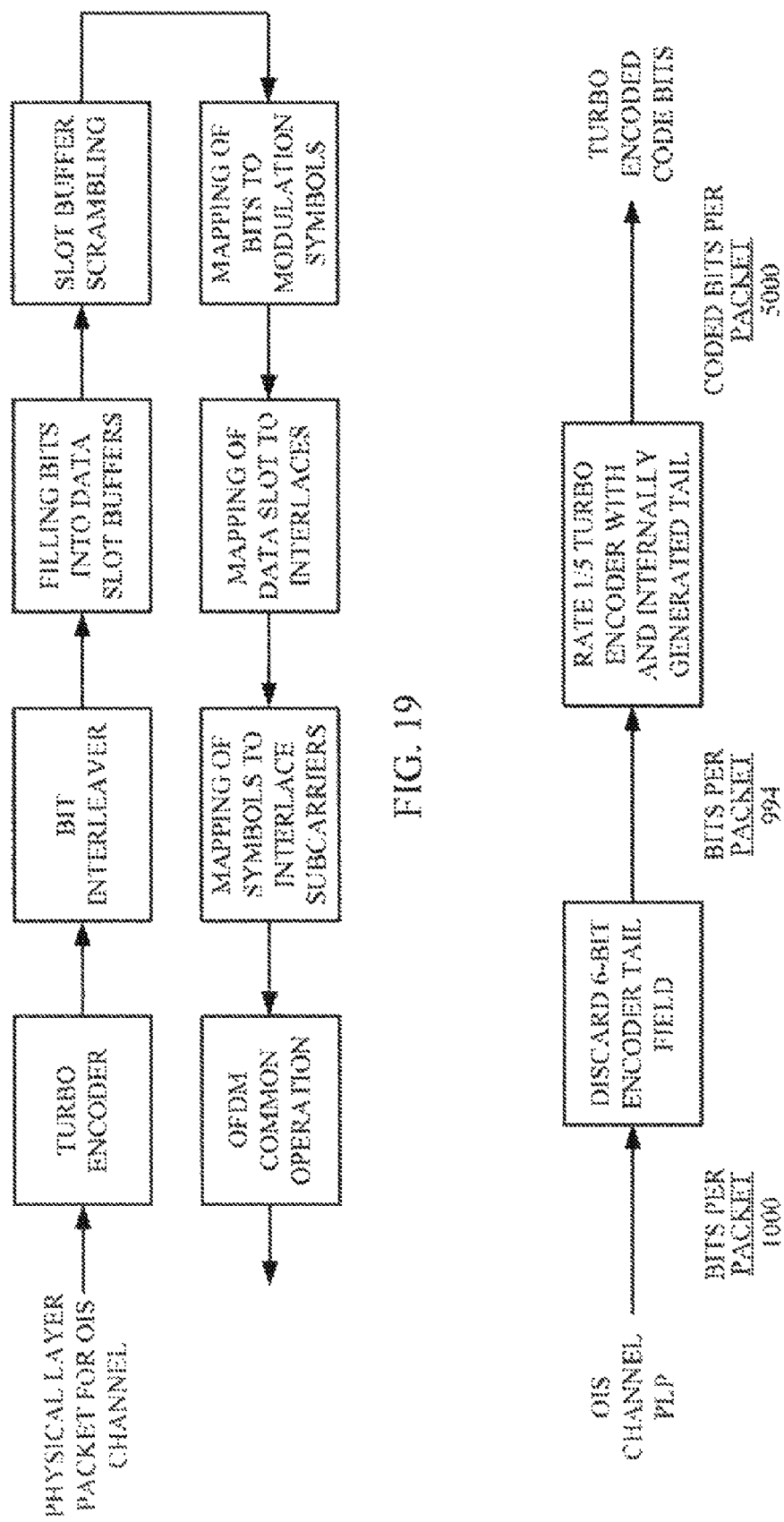

| | OFDM SYMBOL INDEX 5 | OFDM SYMBOL INDEX 6 | OFDM SYMBOL INDEX 7 | OFDM SYMBOL INDEX 8 | OFDM SYMBOL INDEX 9 |
|---|---|---|---|---|---|
| DATA SLOT 7 | TEP 2 | TEP 3 | TEP 5 | TEP 6 | TEP 7 |
| DATA SLOT 6 | TEP 2 | TEP 3 | TEP 4 | TEP 6 | TEP 7 |
| DATA SLOT 5 | TEP 1 | TEP 3 | TEP 4 | TEP 6 | TEP 7 |
| DATA SLOT 4 | TEP 1 | TEP 3 | TEP 4 | TEP 5 | TEP 7 |
| DATA SLOT 3 | TEP 1 | TEP 2 | TEP 4 | TEP 5 | TEP 7 |
| DATA SLOT 2 | TEP 1 | TEP 2 | TEP 4 | TEP 5 | TEP 6 |
| DATA SLOT 1 | TEP 1 | TEP 2 | TEP 3 | TEP 5 | TEP 6 |

FIG. 24

| | OFDM SYMBOL INDEX 12 | OFDM SYMBOL INDEX 13 | OFDM SYMBOL INDEX 14 | OFDM SYMBOL INDEX 15 | OFDM SYMBOL INDEX 16 |
|---|---|---|---|---|---|
| DATA SLOT 7 | TEP 2 | TEP 3 | TEP 5 | TEP 6 | TEP 7 |
| DATA SLOT 6 | TEP 2 | TEP 3 | TEP 4 | TEP 6 | TEP 7 |
| DATA SLOT 5 | TEP 1 | TEP 3 | TEP 4 | TEP 6 | TEP 7 |
| DATA SLOT 4 | TEP 1 | TEP 3 | TEP 4 | TEP 5 | TEP 7 |
| DATA SLOT 3 | TEP 1 | TEP 2 | TEP 4 | TEP 5 | TEP 7 |
| DATA SLOT 2 | TEP 1 | TEP 2 | TEP 4 | TEP 5 | TEP 6 |
| DATA SLOT 1 | TEP 1 | TEP 2 | TEP 3 | TEP 5 | TEP 6 |

FIG. 25

METHODS AND APPARATUS FOR CONFIGURING A PILOT SYMBOL IN A WIRELESS COMMUNICATION SYSTEM

CROSS-REFERENCE TO RELATED APPLICATIONS

The present Application for Patent is a Continuation-in-Part of patent application Ser. No. 11/193,053, entitled "SYSTEM AND METHOD FOR TIME DIVERSITY" filed Jul. 29, 2005, now U.S. Pat. No. 7,583,584, which claims priority from Provisional Application No. 60/592,999 entitled "METHOD OF CHANNEL INTERLEAVING IN AN OFDM WIRELESS COMMUNICATIONS SYSTEM," filed Jul. 29, 2004, and related to U.S. patent application Ser. No. 11/511,950, entitled "METHOD AND APPARATUS FOR COMMUNICATING NETWORK IDENTIFIERS IN A COMMUNICATION SYSTEM," filed Aug. 28, 2006, and U.S. patent application Ser. No. 11/535,947, entitled "METHODS AND APPARATUS FOR TRANSMITTING A FRAME STRUCTURE IN A WIRELESS COMMUNICATION SYSTEM, filed Sep. 27, 2006, all of which are assigned to the assignee hereof and hereby expressly incorporated by reference herein.

BACKGROUND

1. Field

The present disclosure related generally to wireless communications, and more specifically to methods and apparatus for configuring a pilot symbol for use in a wireless communication system.

2. Background

Orthogonal frequency division multiplexing (OFDM) is a technique for broadcasting high rate digital signals. In OFDM systems, a single high rate data stream is divided into several parallel low rate substreams, with each substream being used to modulate a respective subcarrier frequency. It should be noted that although the present invention is described in terms of quadrature amplitude modulation, it is equally applicable to phase shift keyed modulation systems.

The modulation technique used in OFDM systems is referred to as quadrature amplitude modulation (QAM), in which both the phase and the amplitude of the carrier frequency are modulated. In QAM modulation, complex QAM symbols are generated from plural data bits, with each symbol including a real number term and an imaginary number term and with each symbol representing the plural data bits from which it was generated. A plurality of QAM bits are transmitted together in a pattern that can be graphically represented by a complex plane. Typically, the pattern is referred to as a "constellation". By using QAM modulation, an OFDM system can improve its efficiency.

It happens that when a signal is broadcast, it can propagate to a receiver by more than one path. For example, a signal from a single transmitter can propagate along a straight line to a receiver, and it can also be reflected off of physical objects to propagate along a different path to the receiver. Moreover, it happens that when a system uses a so-called "cellular" broadcasting technique to increase spectral efficiency, a signal intended for a received might be broadcast by more than one transmitter. Hence, the same signal will be transmitted to the receiver along more than one path. Such parallel propagation of signals, whether man-made (i.e., caused by broadcasting the same signal from more than one transmitter) or natural (i.e., caused by echoes) is referred to as "multipath". It can be readily appreciated that while cellular digital broadcasting is spectrally efficient, provisions must be made to effectively address multipath considerations.

Fortunately, OFDM systems that use QAM modulation are more effective in the presence of multipath conditions (which, as stated above, must arise when cellular broadcasting techniques are used) than are QAM modulation techniques in which only a single carrier frequency is used. More particularly, in single carrier QAM systems, a complex equalizer must be used to equalize channels that have echoes are strong as the primary path, and such equalization is difficult to execute. In contrast, in OFDM systems the need for complex equalizers can be eliminated altogether simply by inserting a guard interval of appropriate length at the beginning of each symbol. Accordingly, OFDM systems that use QAM modulation are preferred when multipath conditions are expected.

In a typical trellis coding scheme, the data stream is encoded with a convolutional encoder and then successive bits are combined in a bit group that will become a QAM symbol. Several bits are in a group, with the number of bits per group being defined by an integer "m" (hence, each group is referred to as having an "m-ary" dimension). Typically, the value of "m" is four, five, six, or seven, although it can be more or less.

After grouping the bits into multi-bit symbols, the symbols are interleaved. By "interleaving" is meant that the symbol stream is rearranged in sequence, to thereby randomize potential errors caused by channel degradation. To illustrate, suppose five words are to be transmitted. If, during transmission of a non-interleaved signal, a temporary channel disturbance occurs. Under these circumstances, an entire word can be lost before the channel disturbance abates, and it can be difficult if not impossible to know what information had been conveyed by the lost word.

In contrast, if the letters of the five words are sequentially rearranged (i.e., "interleaved") prior to transmission and a channel disturbance occurs, several letters might be lost, perhaps one letter per word. Upon decoding the rearranged letters, however, all five words would appear, albeit with several of the words missing letters. It will be readily appreciated that under these circumstances, it would be relatively easy for a digital decoder to recover the data substantially in its entirety. After interleaving the m-ary symbols, the symbols are mapped to complex symbols using QAM principles noted above, multiplexed into their respective sub-carrier channels, and transmitted.

SUMMARY

According to an aspect of the present disclosure, a method for constructing an acquisition pilot symbol is disclosed. The method includes generating at least one pseudo-random noise sequence having at least a predetermined length, where the at least one pseudo-random noise sequence represents a system configuration of a wireless system, and modulating a time domain symbol sequence with the at least one pseudo-random noise sequence to create the acquisition pilot symbol. The method further includes masking the acquisition pilot symbol to a prescribed frequency profile, and placing the modulated and masked acquisition pilot symbol in a frame for wireless transmission.

According to another aspect of the present disclosure, a transmitter for constructing the acquisition pilot system and a frame within which the symbol is placed is disclosed. The transmitter includes a pseudo-random noise sequence generator configured to generate a pseudo-random noise sequence that corresponds to predefined system information to be communicated to a receiver. The transmitter further includes a modulator configured to construct an acquisition pilot symbol by modulating a time domain symbol sequence with the pseudo-random noise sequence, a spectrum mask unit configured to mask the acquisition pilot symbol to a prescribed frequency profile; and an assembly unit configured to place the modulated acquisition pilot symbol in a frame for wireless transmission.

According to still another aspect of the present disclosure, a processor for use in a wireless communication device is disclosed. The processor includes a pseudo-random noise sequence generator configured to generate a pseudo-random noise sequence that corresponds to predefined system information to be communicated to a receiver; a modulator configured to construct an acquisition pilot symbol by modulating a time domain symbol sequence with the pseudo-random noise sequence, a spectrum mask unit configured to mask the acquisition pilot symbol to a prescribed frequency profile, and an assembly unit configured to place the modulated acquisition pilot symbol in a frame for wireless transmission.

According to yet another aspect of the present disclosure a processor for use in a wireless communication device is disclosed. The processor includes means for generating at least one pseudo-random noise sequence having at least a predetermined length, where the at least one pseudo-random noise sequence represents a system configuration of a wireless system and means for modulating a time domain symbol sequence with the at least one pseudo-random noise sequence to create the acquisition pilot symbol. Additionally, the processor includes means for masking the acquisition pilot symbol to a prescribed frequency profile, and means for placing the modulated and masked acquisition pilot symbol in a frame for wireless transmission.

According to one more aspect of the present disclosure a computer-readable medium encoded with a set of instructions is disclosed. The instructions include an instruction for generating at least one pseudo-random noise sequence having at least a predetermined length, where the at least one pseudo-random noise sequence represents a system configuration of a wireless system; an instruction for modulating a time domain symbol sequence with the at least one pseudo-random noise sequence to create the acquisition pilot symbol; an instruction for masking the acquisition pilot symbol to a prescribed frequency profile; and an instruction for placing the modulated and masked acquisition pilot symbol in a frame for wireless transmission.

BRIEF DESCRIPTION OF THE DRAWINGS

FIG. 1a shows a channel interleaver in accordance with an embodiment;

FIG. 1b shows a channel interleaver in accordance with another embodiment;

FIG. 5 shows a channelization diagram with all one's shifting sequence resulting in long runs of good and poor channel estimates for a particular slot, in accordance with an embodiment; and FIG. 6 shows a Channelization diagram with all two's shifting sequence resulting in evenly spread good and poor channel estimate interlaces.

FIG. 14 shows a block diagram illustrating fixed pattern processing of TDM Pilot 2/WIC/LIC/FDM Pilot/TPC/Unallocated Slots in Data Channel/Reserved OFDM Symbol in a transmitter.

FIG. 15 is an example of slot allocation in a Wide Area Identification channel.

FIG. 17 shows a block diagram of n exemplary LIC slot allocation.

FIG. 18 shows a block diagram of an exemplary TDM Pilot 2 slot allocation.

FIG. 19 shows a block diagram illustrating OIS Physical Layer Packet processing in a transmitter FIG. 20 shows a block diagram of an exemplary Wide-area/Local-area OIS Channel Encoder.

FIG. 24 shows a block diagram of a Wide-area OIS channel Turbo encoded packet mapping to data slot buffers.

FIG. 25 shows a Local-area OIS Turbo Encoded Packet Mapping to Data Slot Buffers.

DETAILED DESCRIPTION

Figure 2A:
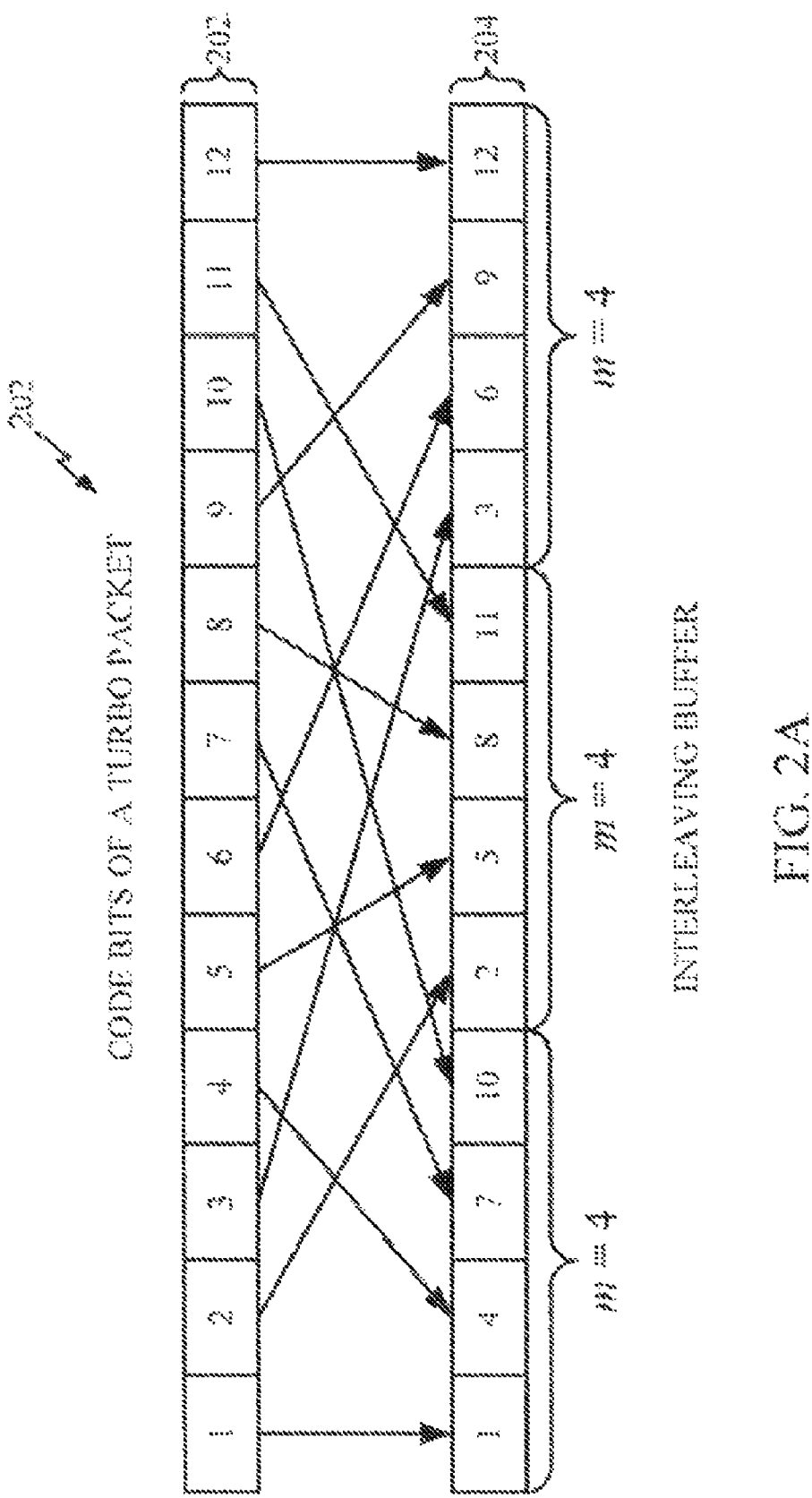
FIG. 2a shows code bits of a turbo packet placed into an interleaving buffer in accordance with an embodiment.

In an embodiment, a channel interleaver comprises a bit interleaver and a symbol interleaver. FIG 1 shows two types of channel interleaving schemes. Both schemes use bit interleaving and interlacing to achieve maximum channel diversity.

FIG. 1a shows a channel interleaver in accordance with an embodiment. FIG. 1b shows a channel interleaver in accordance with another embodiment. The interleaver of FIG. 1b uses bit-interleaver solely to achieve m-ary modulation diversity and uses a two-dimension interleaver interlace table and run-time slot-to-interlace mapping to achieve frequency diversity which provides better interleaving performance without the need for explicit symbol interleaving.

FIG. 1a shows Turbo coded bits 102 input into bit interleaving block 104. Bit interleaving block 104 outputs interleaved bits, which are input into constellation symbol mapping block 106. Constellation symbol mapping block 106 outputs constellation symbol mapped bits, which are input into constellation symbol interleaving block 108. Constellation symbol interleaving block 108 outputs constellation symbol interleaved bits into channelization block 110. Channelization block 110 interlaces the constellation symbol interleaved bits using an interlaced table 112 and outputs OFDM symbols 114.

FIG. 1b shows Turbo coded bits 152 input into bit interleaving block 154. Bit interleaving block 154 outputs interleaved bits, which are input into constellation symbol mapping block 156. Constellation symbol mapping block 15 outputs constellation symbol mapped bits, which are input into channelization block 158. Channelization block 158 channelizes the constellation symbol interleaved bits using an interleaved interlace table and dynamic slot-interlace mapping 160 and outputs OFDM symbols 162.

Bit Interleaving for Modulation Diversity

Figure 2B:
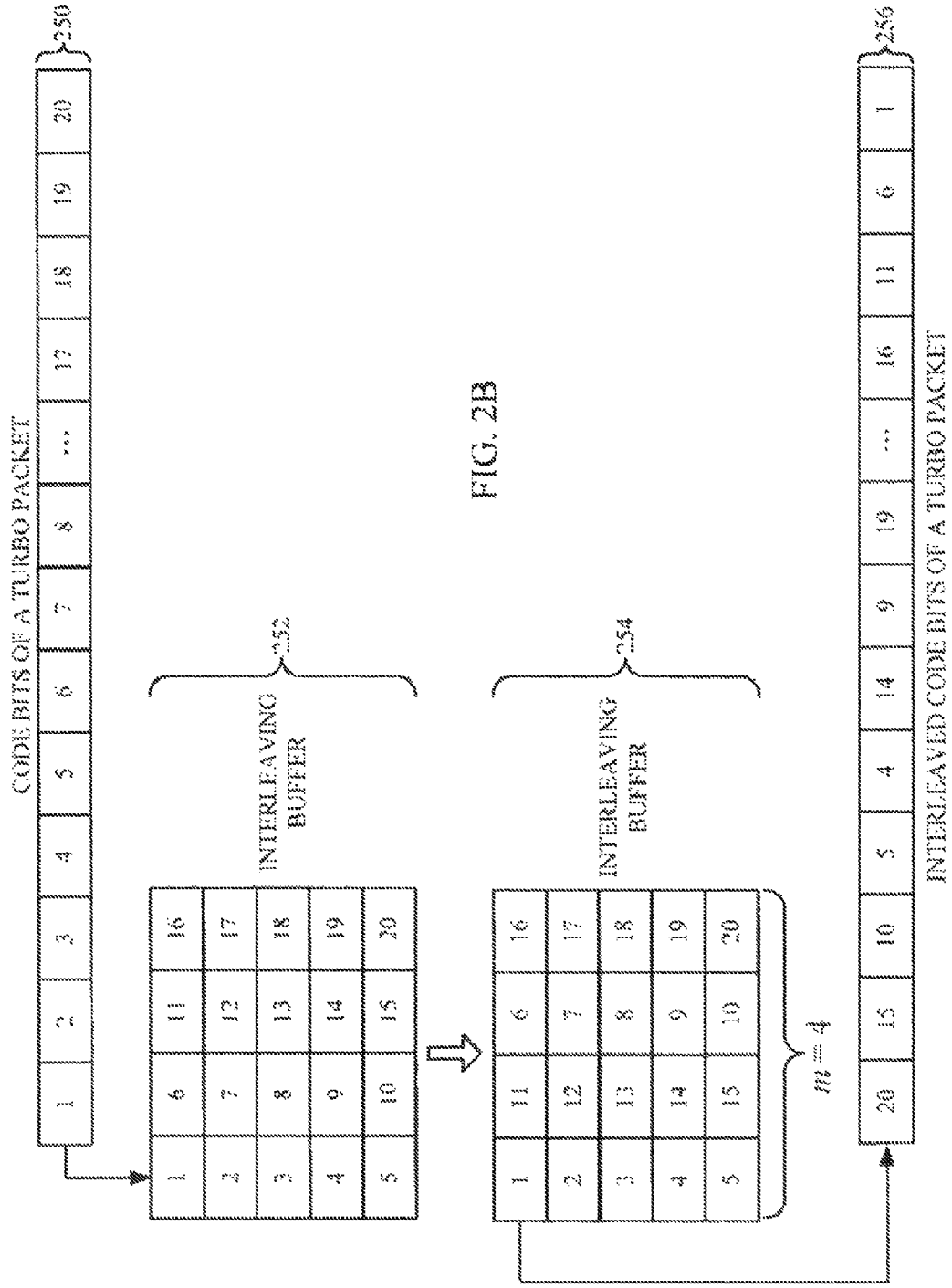
FIG. 2b shows an interleaver buffer arranged into an N/m rows by m columns matrix in accordance with an embodiment.

The interleaving of FIG. 1b uses bit interleaving 154 to achieve modulation diversity. The code bits 152 of a turbo packet are interleaved in such a pattern that adjacent code bits are mapped into different constellation symbols. For example, for 2m-Ary modulation, the N bit interleaved buffer are divided into N/m blocks. Adjacent code bits are written into adjacent blocks sequentially and then are read out one by one from the beginning of the buffer to the end in the sequential order, as shown in FIG. 2a (Top). This guarantees that adjacent code bits be mapped to different constellation symbols. Equivalently, as is illustrated in FIG. 2b (Bottom), the interleaver buffer is arranged into an N/m rows by m columns matrix. Code bits are written into the buffer column by column and are read out row by row. To avoid the adjacent code bit to be mapped to be the same bit position of the constellation symbol due to the fact that certain bits of a constellation symbol are more reliable than the others for 16 QAM depending on the mapping, for example, the first and third bits are more reliable than the second and fourth bits, rows shall be read out from left to right and right to left alternatively.

FIG. 2a shows code bits of a turbo packet 202 placed into an interleaving buffer 204 in accordance with an embodiment. FIG. 2b is an illustration of bit interleaving operation in accordance with an embodiment. Code bits of a Turbo packet 250 are placed into an interleaving buffer 252 as shown in FIG. 2b. The interleaving buffer 252 is transformed by swapping the second and third columns, thereby creating interleaving buffer 254, wherein m=4, in accordance with an embodiment. Interleaved code bits of a Turbo packet 256 are read from the interleaving buffer 254.

For simplicity, a fixed m=4 may be used, if the highest modulation level is 16and if code bit length is always divisible by 4. In this case, to improve the seperation for QPSK, the middle two columns are swapped before being read out. This procedure is depicted in FIG. 2b (Bottom). It would be apparent to those skilled in the art that any two columns may be swapped. It would also be apparent to those skilled in the art that the columns may be placed in any order, It would also be apparent to those skilled in the art that the rows may be placed in any order.

In another embodiment, as a first step, the code bits of a turbo packet 202 are distributed into groups. Note that the embodiments of both FIG. 2a and FIG. 2b also distributed the code bits into groups. However, rather than simply swapping rows or columns, the code bits within each group are shuffled according to a group bit order for each given group. Thus, the order of four groups of 16 code bits after being distributed into groups may be {1, 5, 9, 13} {2, 6, 10, 14} {3, 7, 11, 15} {4, 8, 12, 16} using a simple linear ordering of the groups and the order of the four groups of 16code bits after shuffling may be {13, 9, 5, 1} {2, 10, 6, 14} {11, 7, 15, 3} {12, 8, 4, 16}. Note that swapping rows or columns would be a regressive case of this intra-group shuffling.

Interleaved Interlace for Frequency Diversity

In accordance with an embodiment, the channel interleaver uses interleaved interlace for constellation symbol interleaving to achieve frequency diversity. This eliminates the need for explicit constellation symbol interleaving. The interleaving is performed at two levels.

Within or Intra Interlace Interleaving: In an embodiment, 500 subcarriers of an interlace are interleaved in a bit-reversal fashion.

Between or Inter Interlace Interleaving: In an embodiment, eight interlaces are interleaved in a bit-reversal fashion.

It would be apparent to those skilled in the art that the number of subcarriers can be other than 500. It would also be apparent to those skilled in the art that the number of interlaces can be other than eight.

Note that since 500 is not power of 2, a reduced-set bit reversal operation shall be used in accordance with an embodiment. The following code shows the operation.

```
vector<int> reducedSetBitRev(int n)
{
    int m=exponent(n);
    vector<int> y(n);
```

```
    for (int i=0, j=0; i<n; i++,j++)
    {
        int k;
        for (; (k=bitRev(j,m))>=n; j++);
        y[i]=k;
    }
    return y;
}
``` where n=500, m is the smallest integer such that $2^m > n$ which is 8, and bitRev is the regular bit reversal operation.

Figure 3:
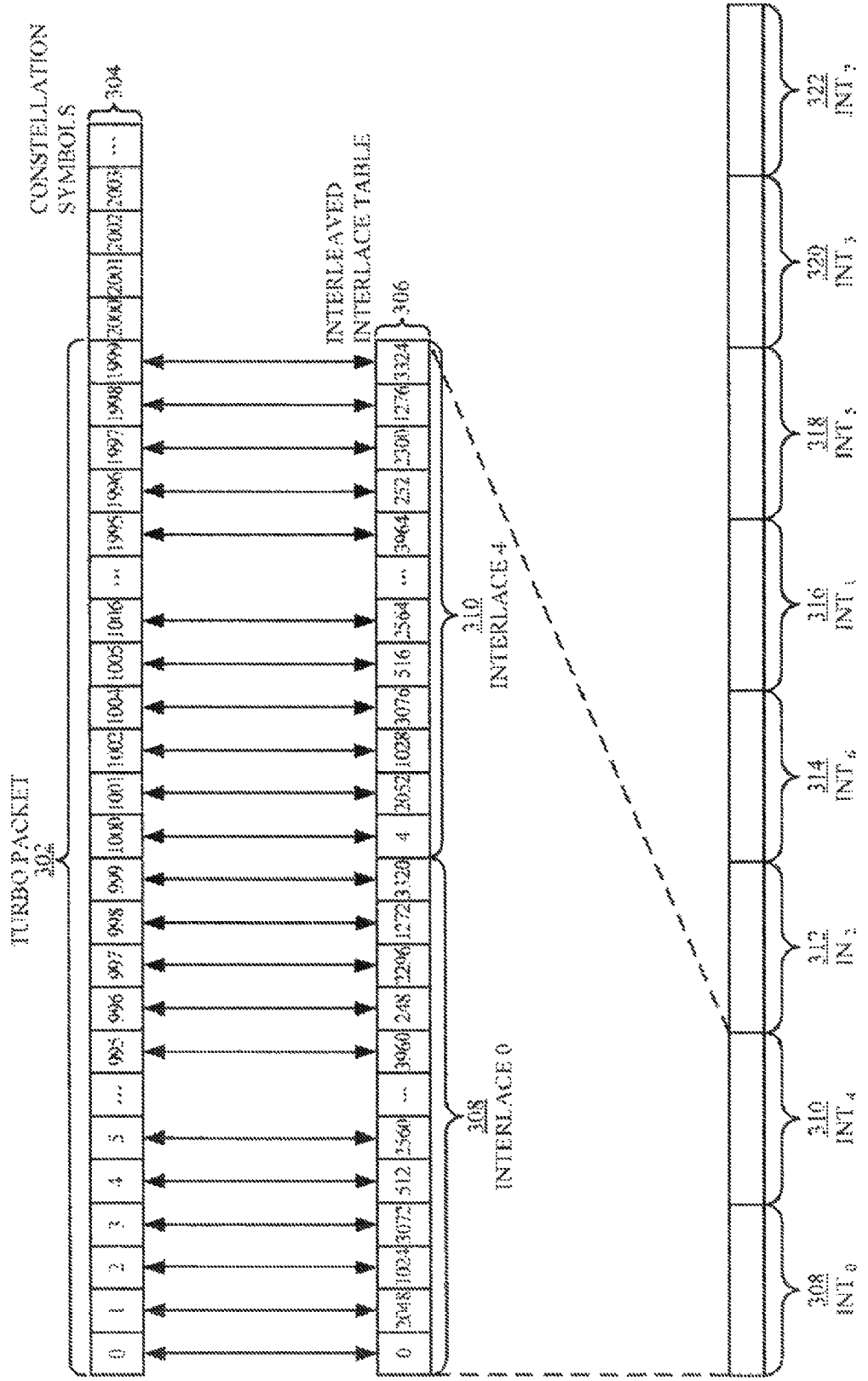
FIG. 3 illustrates an interleaved interlace table in accordance with an embodiment.

The symbols of the constellation symbol sequence of a data channel is mapped into the corresponding subcarriers in a sequential linear fashion according to the assigned slot index, determined by a Channelizer, using the interlace table as is depicted in FIG. 3, in accordance with an embodiment.

FIG. 3 illustrates an interleaved interlace table in accordance with an embodiment. Turbo packet 302, constellation symbols 304, and interleaved interlace table 306 are shown. Also shown are interlace 3 (308), interlace 4 (310), interlace 2 (312), interlace 6 (314), interlace 1 (316), interlace 5 (318), interlace 3 (320), and interlace 7 (322).

In an embodiment, one out of the eight interlaces is used for pilot, i.e., Interlace 2 and Interlace 6 is used alternatively for pilot. As a result, the Channelizer can use seven interlaces for scheduling. For convenience, the Channelizer uses Slot as a scheduling unit. A slot is defined as one interlace of an OFDM symbol. An Interlace Table is used to map a slot to a particular interlace. Since eight interlaces are used, there are then eight slots. Seven slots will be set aside for use for Channelization and one slot for Pilot. Without loss of generality, Slot 0 is used for the Pilot and Slots 1 to 7 are used for Channelization, as is shown in FIG. 4 where the vertical axis is the slot index 402, the horizontal axis is the OFDM symbol index 404 and the bold-faced entry is the interlace index assigned to the corresponding slot at an OFDM symbol time.

Figure 4:
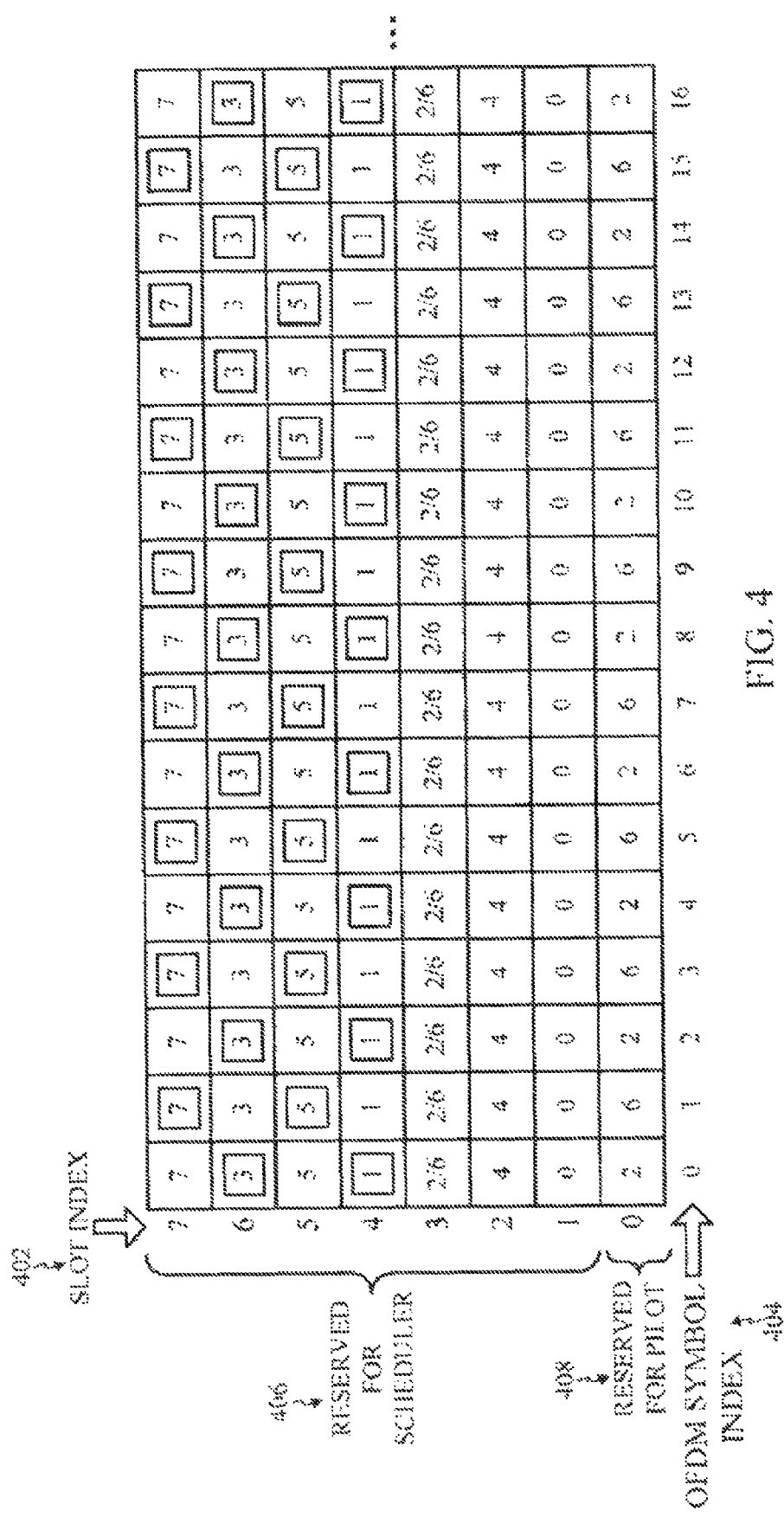
FIG. 4 shows a channelization diagram in accordance with an embodiment.

FIG. 4 shows a channelization diagram in accordance with an embodiment. FIG. 4 shows the slot indices reversed for the scheduler 406 and the slot index reserved for the Pilot 408. The bold faced entries are interlace index numbers. The member with square is the interlace adjacent to pilot and consequently with good channel estimate.

The number surrounded with a square is the interlace adjacent to the pilot and consequently with good channel estimate. Since the Scheduler always assigns a chunk of contiguous slots and OFDM symbols to a data channel, it is clear that due to the inter-interlace interleaving, the contiguous slots that are assigned to a data channel will be mapped to discontinuous interlaces. More frequency diversity gain can then be achieved.

However, this static assignment (i.e., the slot to physical interface mapping table does not change over time where the scheduler slot table does not include the pilot slot) does suffer one problem. That is, if a data channel assignment block (assuming rectangular) occupies multiple OFDM symbols, the interlaces assigned to the data channel does not change over the time, resulting in loss of frequency diversity. The remedy is simply cyclically shifting the Scheduler interlace table (i.e., excluding the Pilot interface) from OFDM symbol to OFDM symbol.

Figure 5:
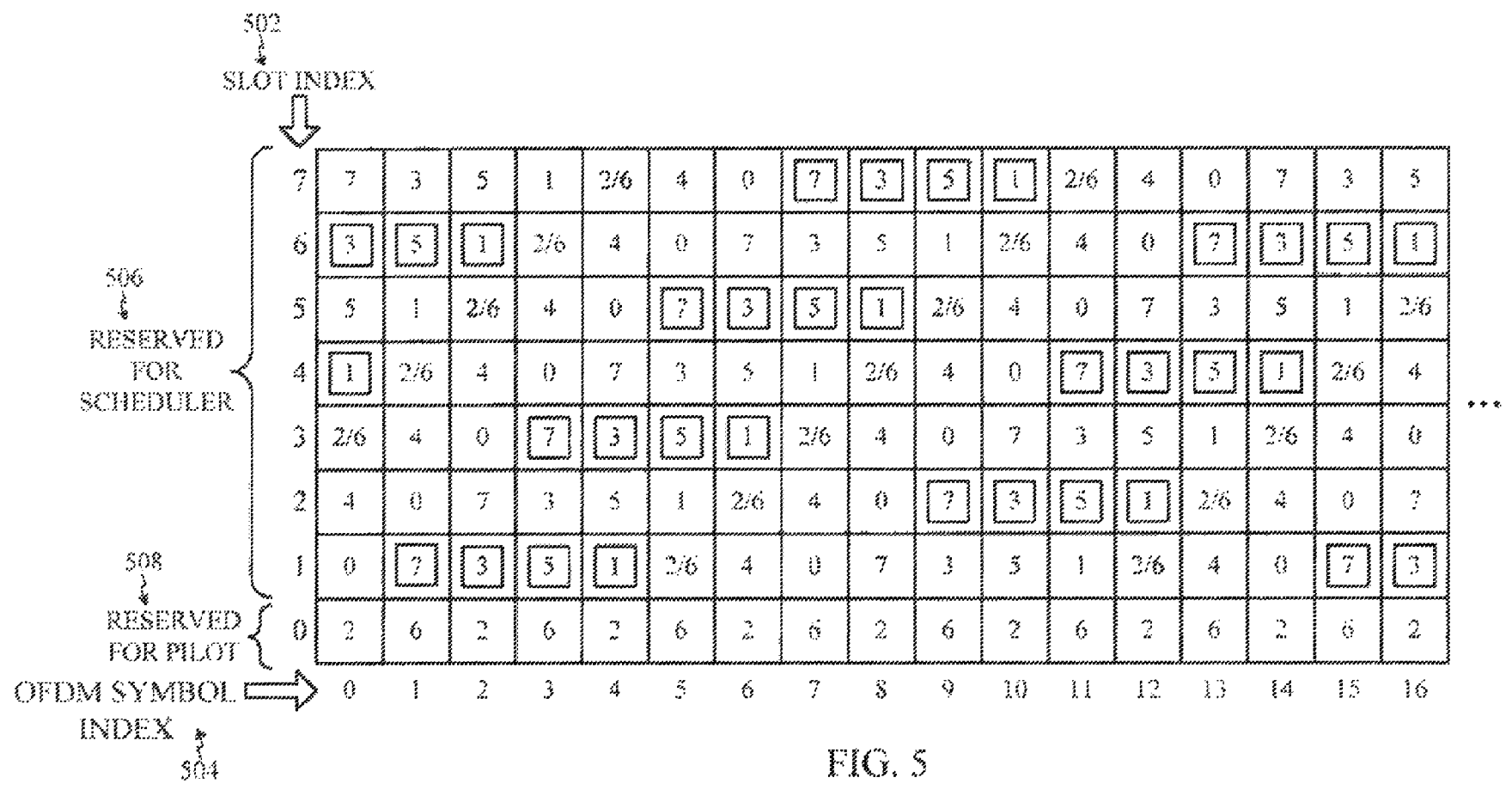

FIG. 5 depicts the operation of shifting the Scheduler interlace table once per OFDM symbol. This scheme successfully destroys the static interlace assignment problem, i.e., a particular slot is mapped to different interlaces at different OFDM symbol time.

FIG. 5 shows a channelization diagram with all one's shifting sequence resulting in long runs of good and poor channel estimates for a particular slot 502, in accordance with an embodiment. FIG. 5 shows the slot indices reserved for the scheduler 506 and the slot index reserved for the Pilot 508. Slot symbol index 504 is shown on the horizontal axis.

Figure 6:
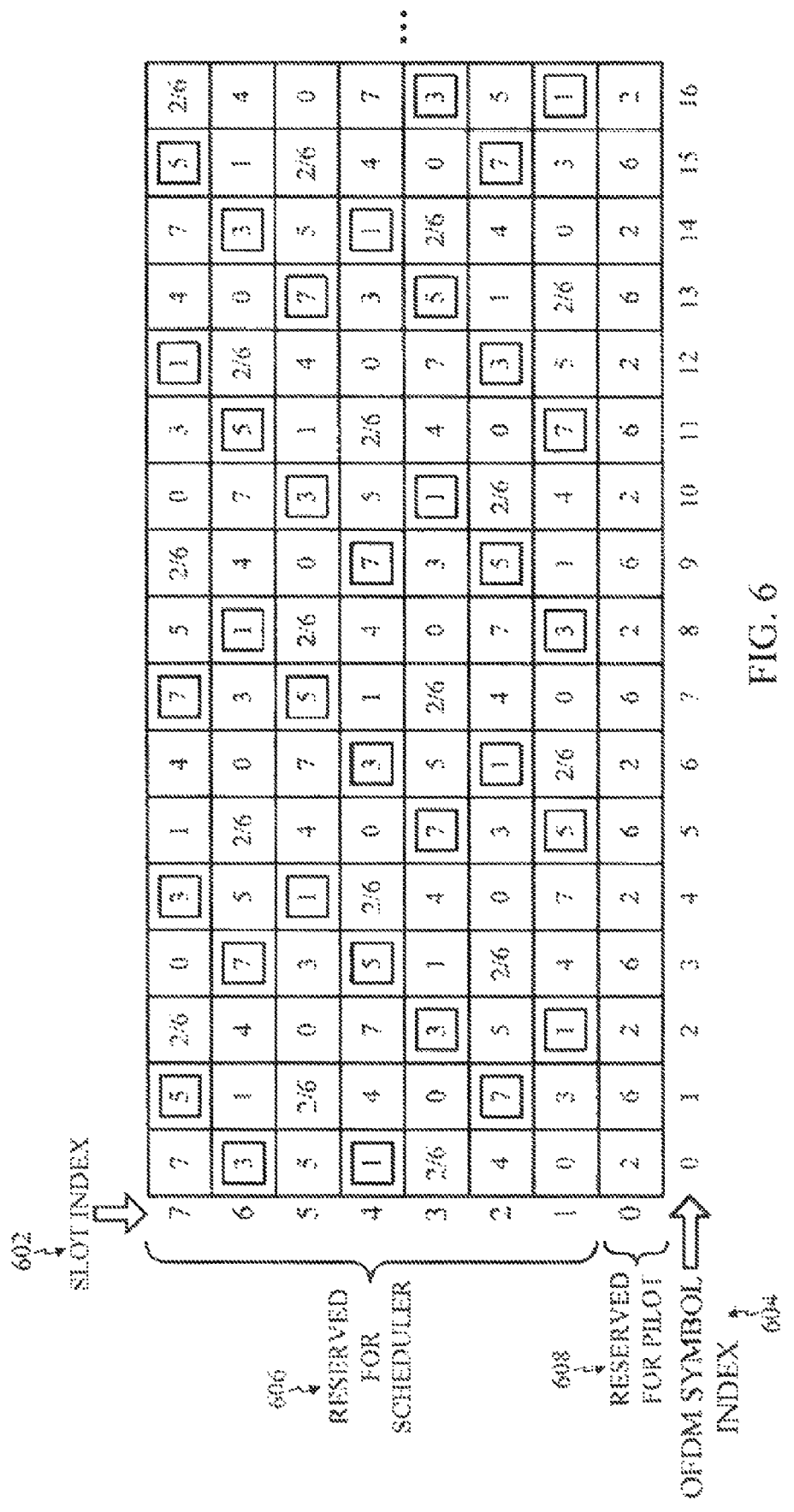

However, it is noticed that slots are assigned four continuous interlaces with good channel estimates followed by long runs of interlaces with poor channel estimates in contrast to the preferred patterns of short runs of good channel estimate interlaces and short runs of interlaces with poor channel estimates. In the figures, the interlace that is adjacent to the pilot interlace is marked with a square. A solution to the long runs of good and poor channel estimates problem is to use a shifting sequence other than the all one's sequence. There are many sequences can be used to fulfill this task. The simplest sequence is the all two's sequence, i.e., the Scheduler interlace table is shifted twice instead of once per OFDM symbol. The result is shown in FIG. 6 which significantly improves the Channelizer interlace pattern. Note that this pattern repeats every 2×7=14 OFDM symbols, where 2 is the Pilot interlace staggering period and 7 is the Channelizer interlace shifting period.

To simplify the operation at both transmitters and receivers, a simple formula can be used to determine the mapping from slot to interlace at a given OFDM symbol time $$i = R'\{(N-((R \times t)\%N)+s-1)\%N\}$$

where
  N=I−1 is the number of interlaces used for traffic data scheduling, wherein I is the total number of interlaces;
  $i \in \{0,1,\ldots,I-1\}$, excluding the pilot interlace, is the interlace index that Slot s at OFDM symbol t maps to;
  t=0,1,...,T−1 is the OFDM symbol index in a super frame, where T is the total number of OFDM symbols in a frame1;
  s=1,2,...,S−1 is the slot index where S is the total number of slots;
  R is the number of shifts per OFDM symbol;
  R' is the reduced-set bit-reversal operator. That is, the interlace used by the Pilot shall be excluded from the bit-reversal operation.

Example: In an embodiment, I=8, R=2. The corresponding Slot-Interlace mapping formula becomes $$i = R'\{(7-((2 \times t)\%7)+s-1)\%7\}$$

where R' corresponds to the following table:
x ⇒ R' {x}
0 ⇒ 0
1 ⇒ 4
2 ⇒ 2 or 6
3 ⇒ 1
4 ⇒ 5
5 ⇒ 3
6 ⇒ 7
This table can be generated by the following code:

```
int reducedSetBitRev(int x, int exclude, int n)
{
    int m=exponent(n);
    int y;
    for (int i=0; j=0; i<=x; i++; j++)
    {
        for (; (y=bitRev(j, m))==exclude; j++);
```

-continued

```
    }
    return y;
}
where m=3 and bitRev is the regular bit reversal operation.
```

[1] OFDM symbol index in a superframe instead of in a frame gives additional diversity to frames since the number of OFDM symbols in a frame in the current design is not divisible by 14.

For OFDM symbol t=11, Pilot uses Interlace 6. The mapping between Slot and Interlace becomes:

Slot 1 maps to interlace of R'{(7−(2×11)%7+1−1)%7}=R{6}=7;
Slot 2 maps to interlace of R'{(7−(2×11)%7+2−1)%7}=R{0}=0;
Slot 3 maps to interlace of R'{(7−(2×11)%7+3−1)%7}=R{1}=4;
Slot 4 maps to interlace of R'{(7−(2×11)%7+4−1)%7}=R{2}=2;
Slot 5 maps to interlace of R'{(7−(2×11)%7+5−1)%7}=R{3}=1;
Slot 6 maps to interlace of R'{(7−(2×11)%7+6−1)%7}=R{4}=5;
Slot 7 maps to interlace of R'{(7−(2×11)%7+7−1)%7}=R{5}=3.

The resulting mapping agrees with the mapping in FIG. 6. FIG. 6 shows a Channelization diagram with all two's shifting sequence resulting in evenly spread good and poor channel estimate interlaces.

In accordance with an embodiment, an interleaver has the following features:

The bit interleaver is designed to taking advantage of m-Ary modulation diversity by interleaving the code bits into different modulation symbols;

The "symbol interleaving" designed to achieve frequency diversity by INTRA-interlace interleaving and INTER-interlace interleaving;

Additional frequency diversity gain and channel estimation gain are achieved by changing the slot-interlace mapping table from OFDM symbol to OFDM symbol. A simple rotation sequence is proposed to achieve this goal.

Figure 7:
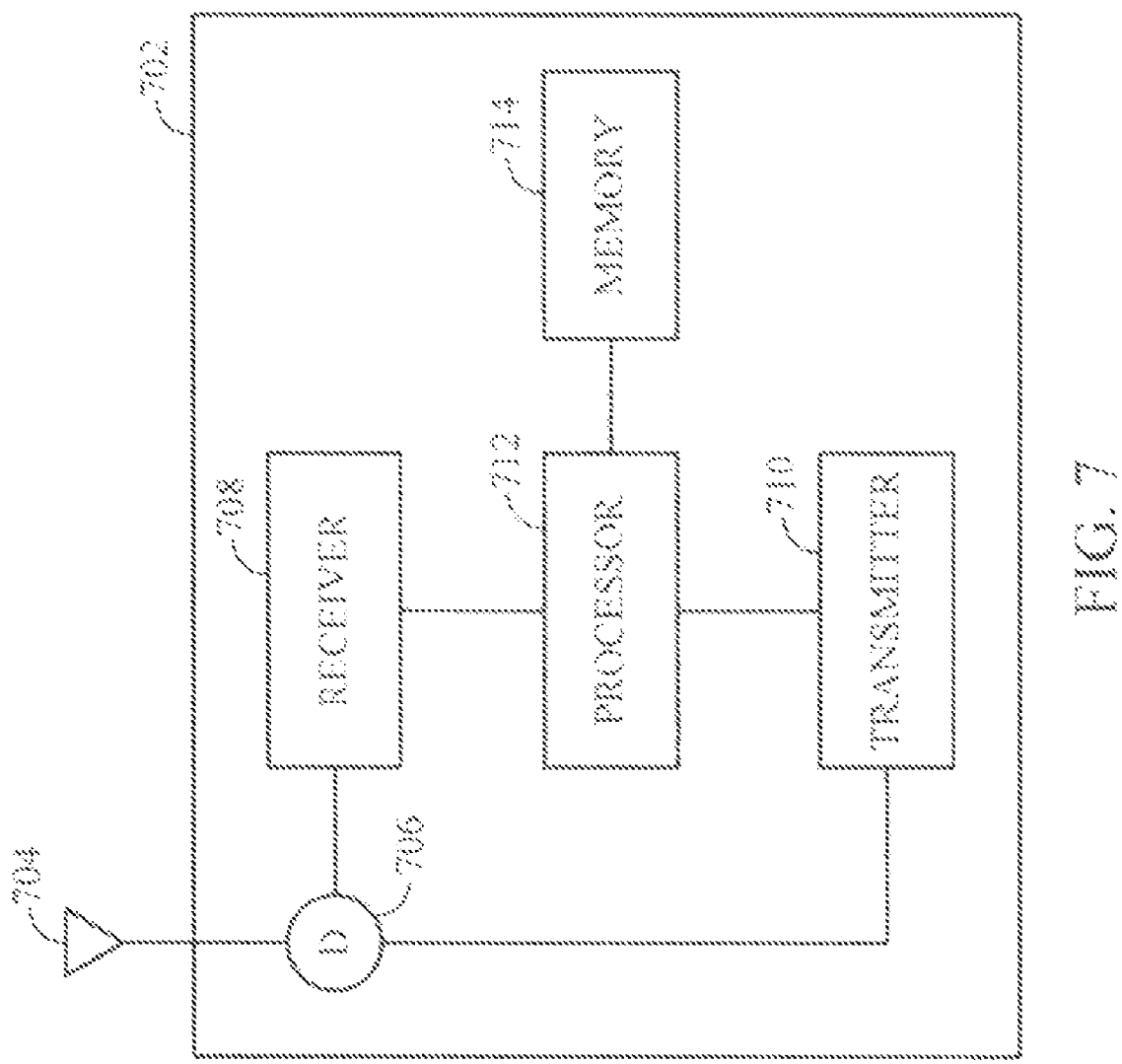
FIG. 7 shows a wireless device configured to implement interleaving in accordance with an embodiment.

FIG. 7 shows a wireless device configured to implement interleaving in accordance with an embodiment. Wireless device 702 comprises an antenna 704, duplexer 706, a receiver 708, a transmitter 710, processor 712, and memory 714. Processor 712 is capable of performing interleaving in accordance with an embodiment. The processor 712 uses memory 714 for buffers or data structures to perform its operations.

The following description includes details of further embodiments.

The transmission unit of the Physical layer is a Physical layer packet. A Physical layer packet has a length of 1000 bits. A Physical layer packet carries one MAC layer packet.

Physical Layer Packet Format

The Physical layer packet shall use the following format:

| Field | Length (bits) |
|---|---|
| MAC Layer Packet | 976 |
| FCS | 16 |
| Reserved | 2 |
| TAIL | 6 | where the MAC Layer Packet is a MAC layer packet from the OIS, Data or Control Channel MAC protocol; FCS is a Frame check sequence; Reserved is reserved bits which the FLO network shall set this field to zero and the FLO device shall ignore this field; and TAIL is encoder tail bits, which shall be set to all '0's.

The following table illustrates the format of the Physical layer packet:

| Physical Layer Packet (1000 Bits) | | | |
|---|---|---|---|
| MAC Layer Packet | FCS | Reserved | TAIL |
| 976 bits | 16 Bits | 2 Bits | 6 Bits |

Bit Transmission Order

Each field of the Physical layer packet shall be transmitted in sequence such that the most significant bit (MSB) is transmitted first and the least significant bit (LSB) is transmitted last. The MSB is the left-most bit in the figures of the document.

Computation of the FCS Bits

The FCS computation described here shall be used for computing the FCS field in the Physical layer packet.

The FCS shall be a CRC calculated using the standard CRC-CCITT generator polynomial:

$$g(x)=x^{16}+x^{12}+x^5+1.$$

Figure 8:
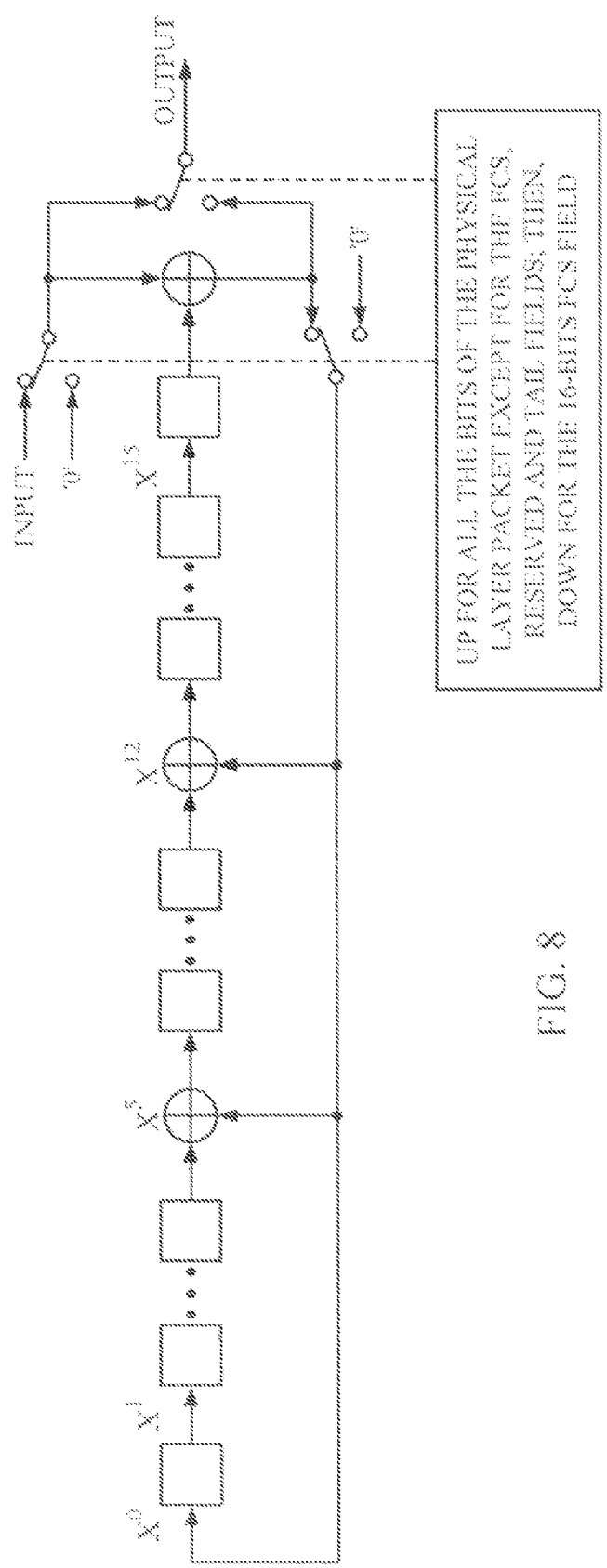
FIG. 8 shows a block diagram of an exemplary frame check sequence computation for a physical layer packet.

The FCS shall be equal to the value computed according to the following described procedure also illustrated in FIG. 8.

All shift-register elements shall be initialized to '1's. It is noted that initialization of the register to ones causes the CRC for all-zero data to be non-zero.

The switches shall be set in the up position.

The register shall be clocked once for each bit of the physical layer packet except for the FCS, Reserved, and TAIL bits. The physical layer packet shall be read from the MSB to LSB.

The switches shall be set in the down position so that the output is a modulo-2 addition with a '0' and the successive shift-register inputs are '0's.

The register shall be clocked an additional 16 times for the 16 FCS bits.

The output bits constitute all fields of the Physical layer packets except the Reserved and TAIL fields.

FLO Network Requirements

The following discussion section defines requirements specific to the FLO network equipment and operation.

Transmitter

The following requirements shall apply to the FLO network transmitter. The transmitter shall operate in one of eight 6 MHz wide bands, but may also supports transmit bandwidths of 5, 7, and 8 MHz. Each 6 MHz wide transmit band allocation is called a FLO RF Channel. Each FLO RF Channel shall be denoted by an index j={1,2, ... 8}. The transmit band and the band center frequency for each FLO RF channel index shall be as specified in Table 1 below.

TABLE 1

FLO RF Channel Number and the Transmit Band Frequencies

| FLO RF Channel Number j | FLO Transmit Band (MHz) | Band Center Frequency $f_C$ (MHz) |
|---|---|---|
| 1 | 698-704 | 701 |
| 2 | 704-710 | 707 |

TABLE 1-continued

FLO RF Channel Number and the Transmit Band Frequencies

| FLO RF Channel Number j | FLO Transmit Band (MHz) | Band Center Frequency $f_C$ (MHz) |
|---|---|---|
| 3 | 710-716 | 713 |
| 4 | 716-722 | 719 |
| 5 | 722-728 | 725 |
| 6 | 728-734 | 731 |
| 7 | 734-740 | 737 |
| 8 | 740-746 | 743 |

The maximum frequency difference between the actual transmit carrier frequency and the specified transmit frequency shall be less than $\pm 2 \times 10^{-9}$ of the band center frequency in Table 1.

It is noted that in Band Spectral Characteristics and out of Band Spectrum Mask are to be determined.

Power Output Characteristics are such that the transmit ERP shall be less than 46.98 dBW, which corresponds to 50 kW.

OFDM Modulation Characteristics

The modulation used on the air-link is Orthogonal Frequency Division Multiplexing (OFDM). The smallest transmission interval corresponds to one OFDM symbol period. The OFDM transmit symbol is comprised of many separately modulated sub-carriers. The FLO system shall use 4096 sub-carriers, numbered 0 through 4095. These sub-carriers are divided into two separate groups.

The first group of sub-carriers is guard Sub-carriers Of the available 4096 sub-carriers, 96 shall be unused. These unused sub-carriers are called guard sub-carriers. No energy shall be transmitted on the guard sub-carriers. Sub-carriers numbered 0 through 47, 2048, and 4049 through 4095 shall be used as guard sub-carriers.

The second group is active Sub-carriers. The active sub-carriers shall be a group of 4000 sub-carriers with indices k ∈{48 ... 2047, 2049 ... 4048}. Each active sub-carrier shall carry a modulation symbol.

Concerning sub-carrier spacing in the FLO system, the 4096 sub-carriers shall span a bandwidth of 5.55 MHz at the center of the 6 MHz FLO RF Channel. The sub-carrier spacing, $(\Delta f)_{sc}$ shall be given by:

$$(\Delta f)_{SC} = \frac{5.55 \times 10^6}{4096} = 1.35498046875 \text{ kHz}$$

Concerning sub-carrier frequency, the frequency of the sub-carrier with index i in the $k^{th}$ FLO RF Channel (see Table 1 above), $f_{sc}(k,i)$, shall be computed as per the following equation:

$$f_{sc}(k,i) = f_c(k) + (i-2048) \times (\Delta f)_{sc}$$

where $f_c(k)$ is the center frequency for the $k^{th}$ FLO RF Channel, and $(f)_{sc}$ is the sub-carrier spacing.

Sub-Carrier Interlaces

The active sub-carriers shall be sub-divided into 8 interlaces indexed from 0 through 7. Each interlace shall consist of 500 sub-carriers. The sub-carriers in an interlace shall be spaced $[8 \times (\Delta f)_{sc}]$ Hz apart (with the exception of interlace zero, where two sub-carriers in the middle of this interlace are separated by $16 \times (\Delta f)_{sc}$, since the sub-carrier with index 2048 is not used) in frequency, with $(\Delta f)_{sc}$ being the sub-carrier spacing.

The sub-carriers in each interlace shall span 5.55 MHz of the FLO RF Channel bandwidth. An active sub-carrier with index i shall be allocated to interlace $I_j$, where j=i mod 8. The sub-carrier indices in each interlace shall be arranged sequentially in ascending order. The numbering of sub-carriers in an interlace shall be in the range 0, 1, . . . 499.

Frame and Channel Structure

The transmitted signal is organized into superframes. Each superframe shall have duration $T_{SP}$ equal to 1s, and shall consist of 1200 OFDM symbols. The OFDM symbols in a superframe shall be numbered 0 through 1199. The OFDM symbol interval $T_S$ shall be 833.33 . . . μs. The OFDM symbol consists of a number of time-domain baseband samples, called OFDM chips. These chips shall be transmitted at a rate of $5.55 \times 10^6$ per second.

Figure 9:
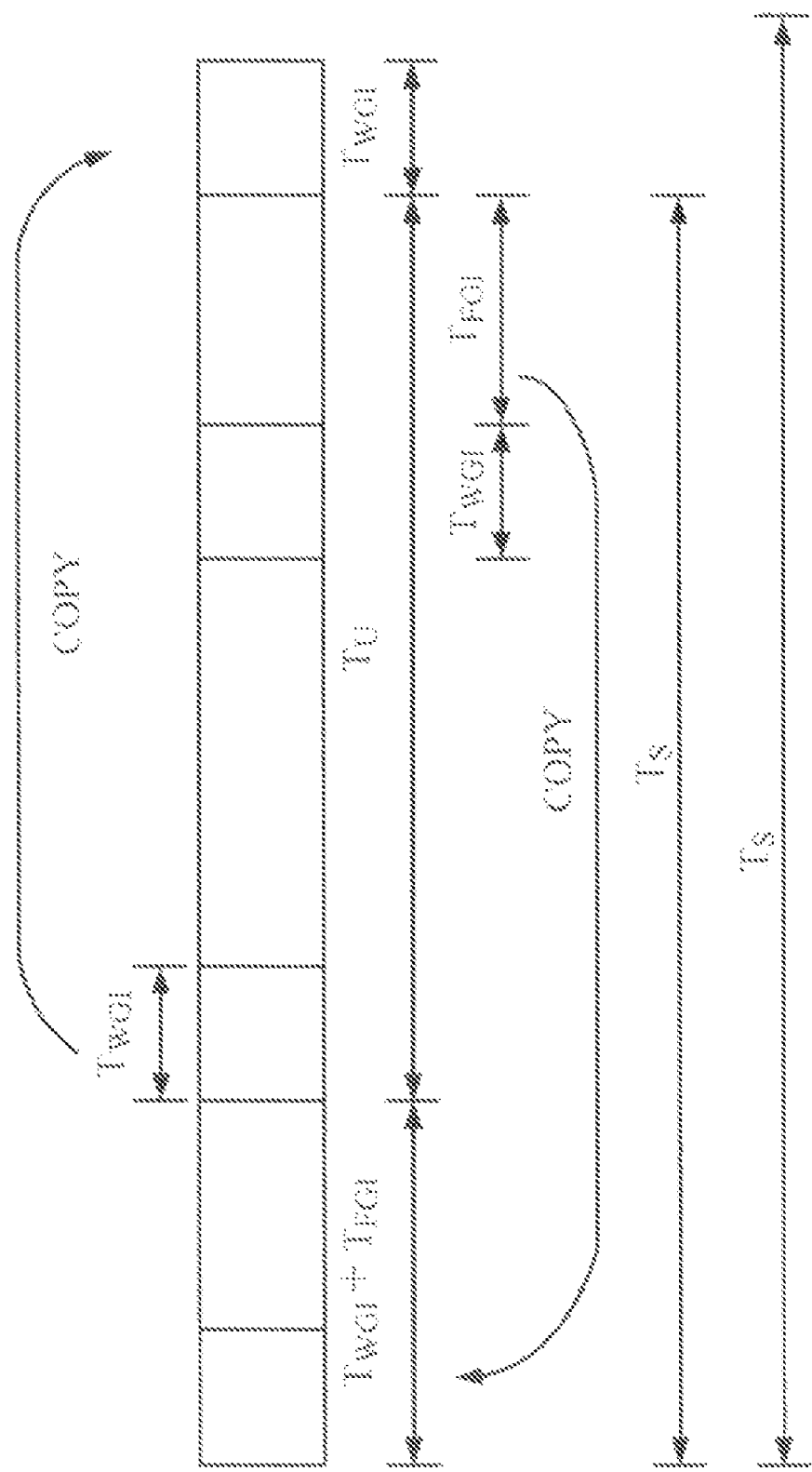
FIG. 9 shows a diagram of the duration of an exemplary OFDM symbol.

The total OFDM symbol interval $T_S'$ is comprised of four parts: a useful part with duration $T_G$, a flat guard interval with duration $T_{FGI}$ and two windowed intervals of duration $T_{WGI}$ on the two sides, as illustrated in FIG. 9. There shall be an overlap of $T_{WGI}$ between consecutive OFDM symbols (see FIG. 9).

The effective OFDM symbol interval shall be $T_S = T_{WGI} + T_{FGI} T_G$, $$\begin{cases} T_U = 4096 \text{ chips} = \frac{4096}{5.55 \times 10^6} = 738.018018\ldots \mu s \\ T_{FGI} = 512 \text{ chips} = \frac{512}{5.55 \times 10^6} = 92.252282\ldots \mu s \\ T_{WGI} = 17 \text{ chips} = \frac{17}{5.55 \times 10^6} = 3.063063\ldots \mu s \end{cases}$$

The total symbol duration in FIG. 9 shall be $T_S' = T_S + T_{WGI}$.

The effective OFDM symbol duration shall henceforth be referred to as the OFDM symbol interval. During an OFDM symbol interval, a modulation symbol shall be carried on each of the active sub-carriers.

Figure 10:
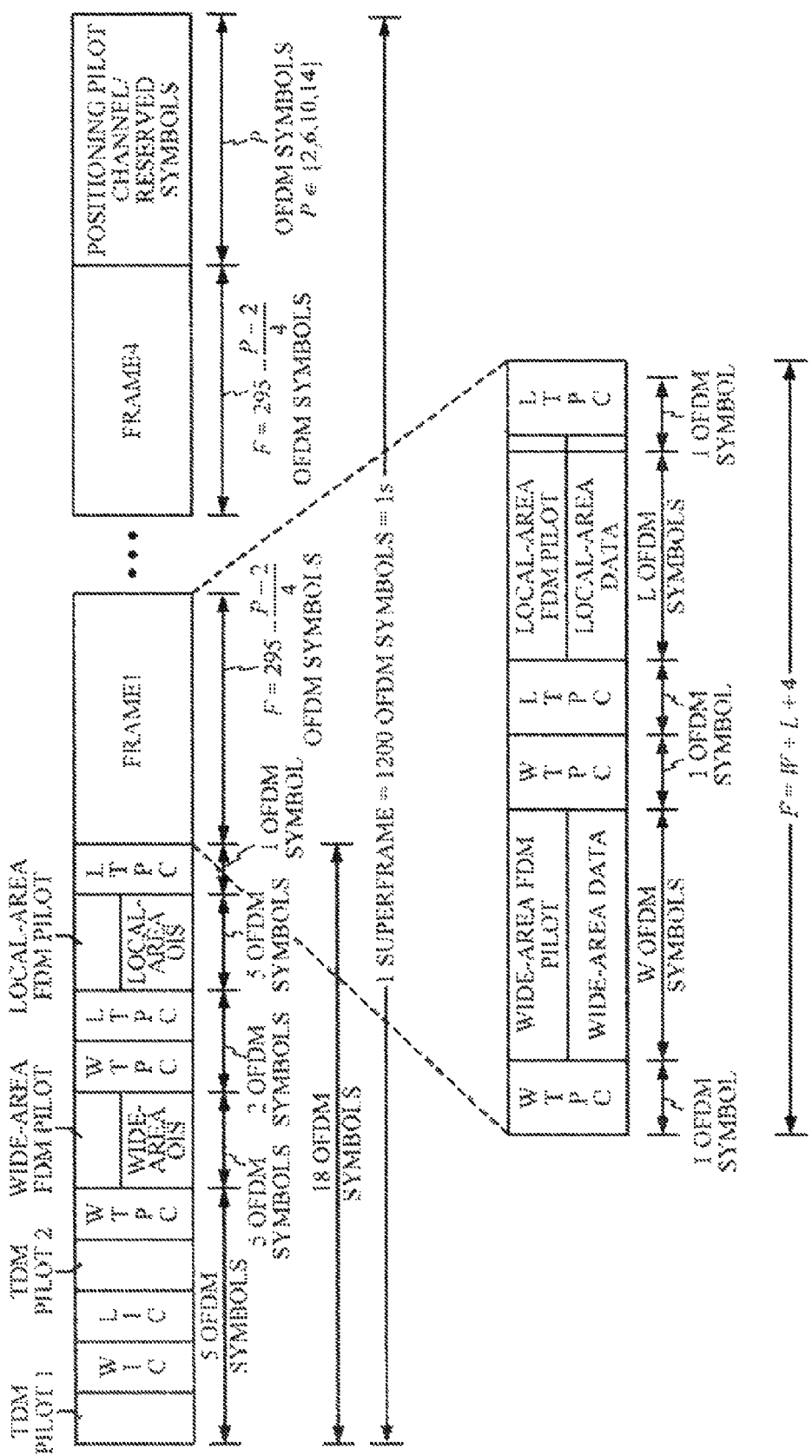
FIG. 10 shows the structure of an exemplary superframe and channel structure.

The FLO Physical layer channels are the TDM Pilot Channel, the FDM Pilot Channel, the OIS Channel, and the Data Channel. The TDM Pilot Channel, the OIS Channel, and the Data Channel shall be time division multiplexed over a superframe. The FDM Pilot Channel shall be frequency division multiplexed with the OIS Channel and the Data Channel over a superframe as illustrated in FIG. 10.

The TDM Pilot Channel is comprised of the TDM Pilot 1 Channel, the Wide-area Identification Channel (WIC), the Local-area Identification Channel (LID), the TDM Pilot 2 Channel, the Transition Pilot Channel (TPC) and the Positioning Pilot Channel (PPC). The TDM Pilot 1 Channel, the WIC, the LIC and the TDM Pilot 2 Channel, shall each span one OFDM symbol and appear at the beginning of a superframe. A Transition Pilot Channel (TPC) spanning one OFDM symbol shall precede and follow each Wide-area and Local-area Data or OIS Channel transmission. The TPC flanking the Wide-area Channel (Wide-area OIS or Wide-area Data) is called the Wide-area Transition Pilot Channel (WTPC). The TPC flanking the Local-area channel (Local-area OIS or Local-area Data Channel) transmission is called the Local-area Transition Pilot Channel (LTPC). The WTPC and the LTPC shall each occupy 10 OFDM symbols and together occupy 20 OFDM symbols in a superframe. The PPC shall have variable duration and its status (presence or absence and duration) shall be signaled over the OIS Channel. When present, it shall span 6, 10, or 14 OFDM symbols at the end of the superframe. When PPC is absent, two OFDM symbols shall be reserved at the end of the superframe.

The OIS Channel shall occupy 10 OFDM symbols in a superframe and shall immediately follow the first WTPC OFDM symbol in a superframe. The OIS Channel is comprised of the Wide-area OIS Channel and the Local-area OIS Channel. The Wide-area OIS Channel and the Local-area OIS Channel shall each have duration of 5 OFDM symbols and shall be separated by two TPC OFDM symbols.

The FDM Pilot Channel shall span 1174, 1170, 1166, or 1162 OFDM. These values correspond to either 2 Reserved OFDM symbols or 6, 10 and 14 PPC OFDM symbols, respectively, being present in each superframe symbols in a superframe. It is noted that these values correspond to either 2 Reserved OFDM symbols or 6, 10 and 14 PPC OFDM symbols, respectively, being present in each superframe. The FDM Pilot channel is frequency division multiplexed with Wide-area and Local-area OIS and Data Channels.

The Data Channel shall span 1164, 1160, 1156 or 1152 OFDM symbols. It is noted that these values correspond to either 2 Reserved OFDM symbols or 6, 10 and 14 PPC OFDM symbols, respectively, being present in each superframe. The Data Channel transmission plus the 16 TPC OFDM symbol transmissions immediately preceding or following each data channel transmission are divided into 4 frames.

Let frame parameters be set where P is the number of OFDM symbols in the PPC or the number of Reserved OFDM symbols in the case where the PPC is absent in a superframe; W is the number of OFDM symbols associated with the Wide-area Data Channel in a frame; L is the number of OFDM symbols associated with the Local-area Data Channel in a frame; and F is the number of OFDM symbols in a frame. These frame parameters may then be related by the following set of equations:

$$F = 295 - \frac{P-2}{4}$$
$$F = W + L + 4$$

FIG. 10 illustrates the superframe and the channel structure in terms of P, W, and L. When the PPC is absent, each frame shall span 295 OFDM symbols and have duration $T_F$ equal to 245.8333 ms. It is noted there are two Reserved OFDM symbols at the end of each superframe. When the PPC is present at the end of the superframe, each frame shall span a variable number of OFDM symbols as specified in Table 3 below.

TABLE 3

Frame Duration for Different Numbers of PPC OFDM Symbols

| Number of PPC OFDM Symbols | Frame Duration (F) in units of OFDM symbols | Frame Duration in ms |
|---|---|---|
| 6 | 294 | 245 |
| 10 | 293 | 244.166... |
| 14 | 292 | 243.333... |

The Data Channel during each frame shall be time division multiplexed between the Local-area Data Channel and the Wide-area Data Channel. The fraction of the frame allocated to Wide-area Data is $$\frac{W}{W+L} \times 100\%$$

and may vary from 0 to 100%.

The Physical layer packets transmitted over the OIS Channel are called OIS packets and the Physical layer packets transmitted over the Data Channel are called Data packets.

Flow Components and Layered Modulation

The audio or video content associated with a flow multicast over the FLO network may be sent in two components, i.e. a base (B) component that enjoys widespread reception and an enhancement (E) component that improves upon the audio-visual experience provided by the base component over a more limited coverage area.

The base and the enhancement component Physical layer packets are jointly mapped to modulation symbols. This FLO feature is known as layered modulation.

MediaFLO Logical Channel

The Data packets transmitted by the Physical layer are associated with one or more virtual channels called MediaFLO Logical Channels (MLC). An MLC is a decodable component of a FLO service that is of independent reception interest to a FLO device. A service may be sent over multiple MLCs. However, the base and enhancement component of an audio or video flow associated with a service shall be transmitted over a single MLC.

FLO Transmit Modes

The combination of modulation type and the inner code rate is called the "transmit mode". The FLO system shall support the twelve transmit modes listed in Table 4 found below.

In the FLO network, the transmit mode is fixed when an MLC is instantiated and is changed infrequently. This restriction is imposed in order to maintain a constant coverage area for each MLC.

TABLE 4

FLO Transmit Modes

| Mode Number | Modulation | Turbo Code Rate |
|---|---|---|
| 0 | QPSK | 1/3 |
| 1 | QPSK | 1/2 |
| 2 | 16-QAM | 1/3 |
| 3 | 16-QAM | 1/2 |
| 4 | 16-QAM | 2/3 |
| 5[2] | QPSK | 1/5 |
| 6 | Layered Modulation with energy ratio 4 | 1/3 |
| 7 | Layered Modulation with energy ratio 4 | 1/2 |
| 8 | Layered Modulation with energy ratio 4 | 2/3 |
| 9 | Layered Modulation with energy ratio 6.25 | 1/3 |
| 10 | Layered Modulation with energy ratio 6.25 | 1/2 |
| 11 | Layered Modulation with energy ratio 6.25 | 2/3 |

[2]This mode is used for the OIS channel only.

FLO Slots

In the FLO network, the smallest unit of bandwidth allocated to a MLC over an OFDM symbol corresponds to a group of 500 modulation symbols. This group of 500 modulation symbols is called a slot. The scheduler function (in the MAC layer) allocates slots to MLC's during the data portion of the superframe. When the scheduler function allocates bandwidth for transmission to a MLC in an OFDM symbol, it does so in integer units of slots.

There are 8 slots during every OFDM symbol except for the TDM Pilot 1 Channel in a superframe. These slots shall be numbered 0 through 7. The WIC and LIC channels shall each occupy 1 slot. The TDM Pilot 2 Channel shall occupy 4 slots. The TPC (Wide-area and Local-area) shall occupy all 8 slots. The FDM Pilot Channel shall occupy 1 slot with index 0 and the OIS/Data Channel may occupy up to 7 slots with indices 1 through 7. Each slot shall be transmitted over an interlace. The mapping from slot to interlace varies from OFDM symbol to OFDM symbol and is described in further detail to follow.

FLO Data Rates

In the FLO system the calculation of data rates is complicated by the fact that different MLCs may utilize different modes. The computation of data rates is simplified by assuming that all MLCs use the same transmit mode. Table 5 below gives the Physical layer data rates for the different transmit modes assuming all 7 data slots are used.

TABLE 5

FLO Transmit Modes and Physical Layer Data Rates

| Transmit Mode | Slots per Physical Layer Packet | Physical Layer Data Rate (Mbps) |
|---|---|---|
| 0 | 3 | 2.8 |
| 1 | 2 | 4.2 |
| 2 | 3/2 | 5.6 |
| 3 | 1 | 8.4 |
| 4 | 3/4 | 11.2 |
| 5 | 5 | 1.68 |
| 6 | 3 | 5.6 |
| 7 | 2 | 8.4 |
| 8 | 3/2 | 11.2 |
| 9 | 3 | 5.6 |
| 10 | 2 | 8.4 |
| 11 | 3/2 | 11.2 |

It is noted that in Table 5 above that for the values in the column labeled "Physical layer data rate," the overhead due to the TDM Pilot channel and the outer code is not subtracted. This is the rate at which data is transmitted during the Data channel. For modes 6 through 11, the rate quoted is the combined rate of the two components. The rate for each component will be half of this value.

FLO Physical Layer Channels

The FLO Physical layer is comprised of the following sub-channels: the TDM Pilot Channel; the Wide-area OIS Channel; the Local-area OIS Channel; the Wide-area FDM Pilot Channel; the Local-area FDM Pilot Channel; the Wide-area Data Channel; and the Local-area Data Channel TDM Pilot Channel The TDM Pilot Channel is comprised of the following component channels: TDM Pilot 1 Channel; wide-area identification channel (WIC); Local-area Identification Channel (LIC); and TDM Pilot 2 Channel; Transition Pilot Channel (TPC)

TDM Pilot 1 Channel

The TDM Pilot 1 Channel shall spam one OFDM symbol. It shall be transmitted at the OFDM symbol index 0 in the superframe. It signals the start of a new superframe. It may be used by the FLO device for determining the coarse OFDM symbol timing, the superframe boundary and the carrier frequency offset.

Figures 11, 12:
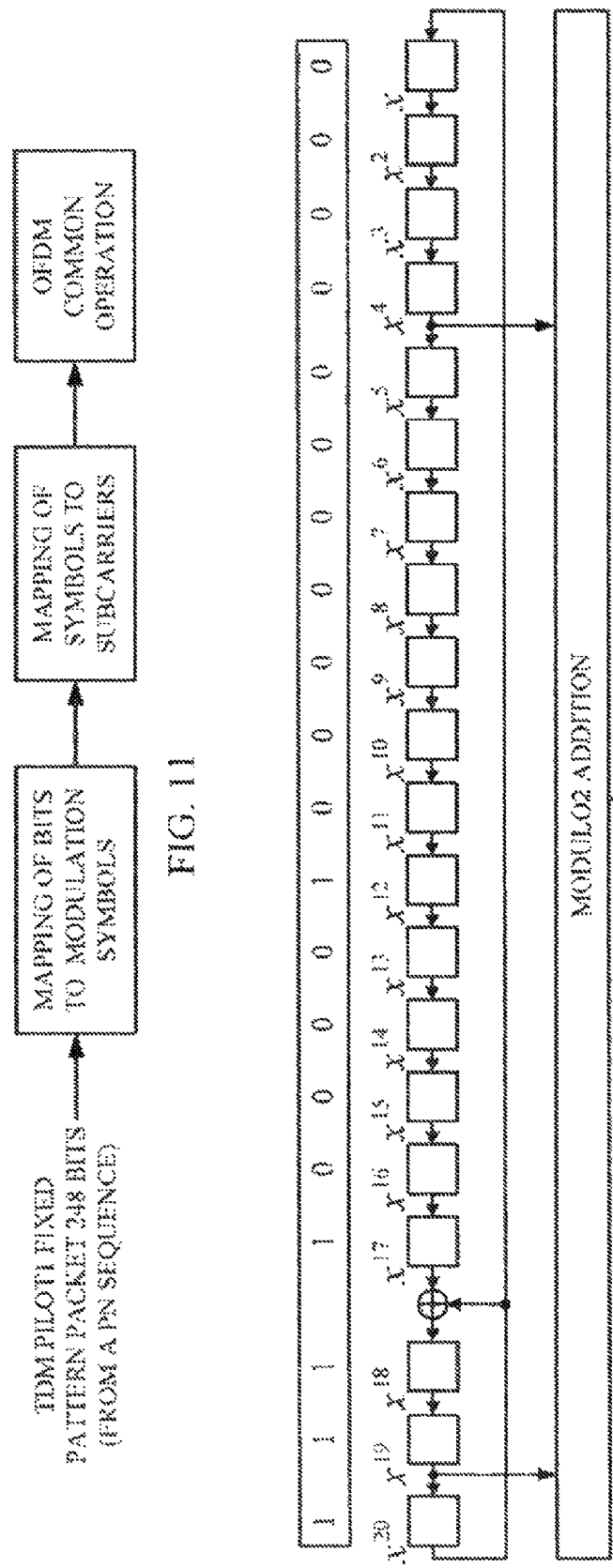
FIG. 11 shows a block diagram of exemplary TDM Pilot 1 Packet Processing in a Transmitter.
FIG. 12 shows an exemplary PN Sequence Generator for Modulating the TDM Pilot 1 Sub carriers

The TDM Pilot 1 waveform shall be generated in the transmitter using the steps illustrated in FIG. 11.

TDM Pilot 1 Sub-carriers

The TDM Pilot 1 OFDM symbol shall be comprised of 124 non-zero sub-carriers in the frequency domain, which are uniformly spaced among the Active sub-carriers. The $i^{th}$ TDM Pilot 1 sub-carrier shall correspond to the sub-carrier index j defined as follows:

$$j = \begin{cases} 64 + (i) \times 32, \forall i \in \{0, 1 \ldots 61\} \\ 64 + (i+1) \times, \forall i \in \{62, \ldots 123\} \end{cases}.$$

Note that the TDM Pilot 1 Channel does not use the sub-carrier with index 2048.

TDM Pilot 1 Fixed Information Pattern

The TDM Pilot 1 sub-carriers shall be modulated with a fixed information pattern. This pattern shall be generated using a 20-tap linear feedback shift register (LFSR) with generator sequence h $(D)=D^{20}+D^{17}+1$ and initial state '11110000100000000000'. Each output bit shall be obtained as follows: if the LFSR state is the vector $\{s_{20}s_{19}s_{18}s_{17}s_{16}s_{15}s_{14}s_{13}s_{12}s_{11}s_{10}s_9s_8s_7s_6s_5s_4s_3s_2s_1\}$ then, the output bit shall be $[s_w \oplus s_4]$, where $\oplus$ denotes modulo-2 addition, which corresponds to the mask associated with slot 1 (see Table 6, which follows later). The LFSR structure shall be as specified in FIG. 12

The fixed information pattern shall correspond to the first 248 output bits. The first 35-bits of the fixed pattern shall be '11010100100110110111001100101100001', with '110' appearing first.

The 248-bit TDM Pilot 1 fixed pattern is called the TDM Pilot 1 Information packet and is denoted as PII.

Each group of two consecutive bits in the PII packet shall be used to generate QPSK modulation symbols.

Modulation Symbols Mapping

In the TDM Pilot 1 information packet, each group of two consecutive bits, PII(2i) and PII(2i+1), i=0,1, . . . 123, which are labeled as $s_0$ and $s_1$, respectively, shall be mapped into a complex modulation symbol MS=(mI, mQ) with D=4 as specified in Table 6 below. This factor is calculated using the fact that only 124 of the 4000 available carriers are being used.

$$\sqrt{\frac{1}{2} \times \frac{4000}{124}} \cong 4.$$

TABLE 6

| QPSK Modulation Table | | | |
|---|---|---|---|
| Input bits | | Modulation Symbols MS | |
| $s_1$ | $s_0$ | $m_I$ | $m_Q$ |
| 0 | 0 | D | D |
| 0 | 1 | −D | D |
| 1 | 0 | D | −D |
| 1 | 1 | −D | −D |

Figure 13:
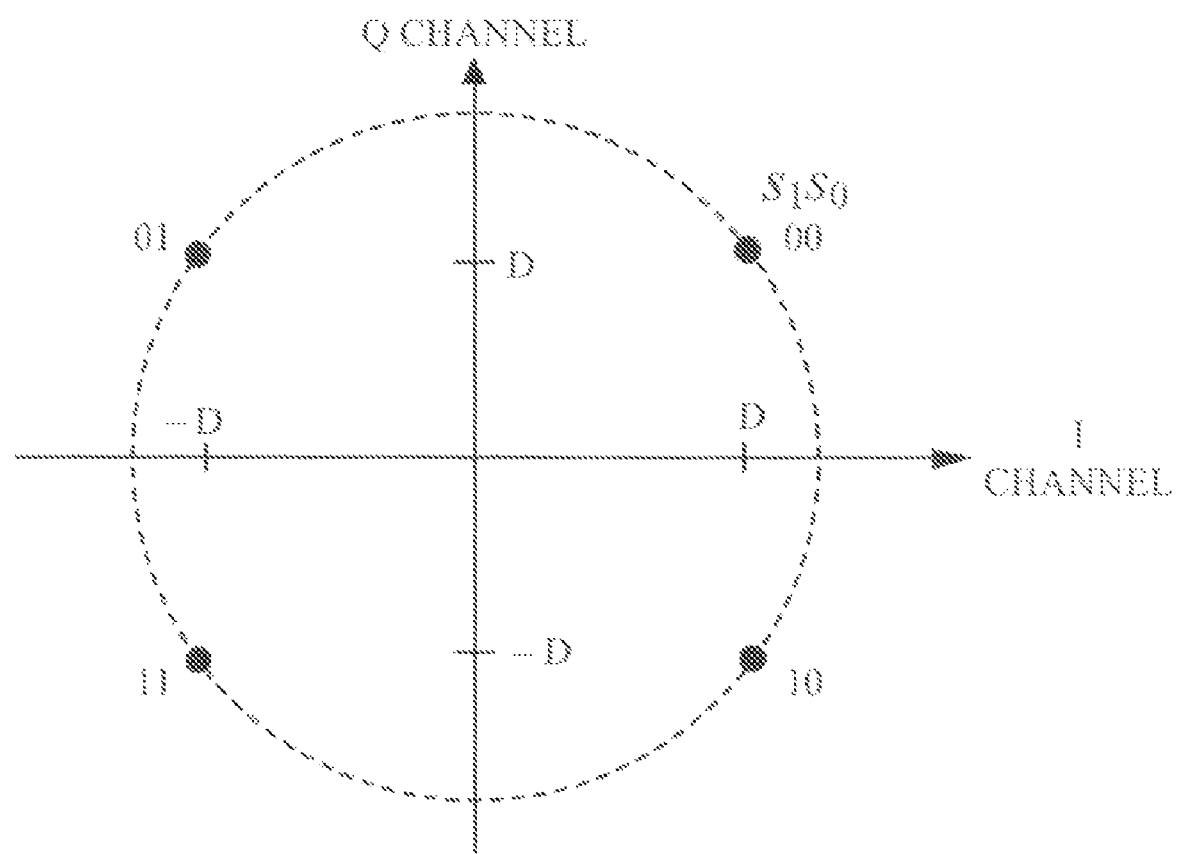
FIG. 13 shows an exemplary signal constellation for QPSK modulation.

FIG. 13 shows the signal constellation for the QPSK modulation.

Modulation Symbols to Sub-Carrier Mapping

The $i^{th}$ modulation symbol Ms(i), i=0,1, . . . 123, shall be mapped to the sub-carrier with index j as specified previously.

OFDM Common Operation

The modulated TDM Pilot 1 sub-carriers shall undergo common operations as will be discussed later.

Wide-Area Identification Channel (WIC)

The Wide-area Identification Channel (WIC) shall span one OFDM symbol. It shall be transmitted at OFDM symbol index 1 in a superframe. It follows the TDM Pilot 1 OFDM symbol. This is an overhead channel that is used for conveying the Wide-area Differentiator information to FLO receivers. All transmit waveforms within a Wide-area (which includes Local-area channels but excludes the TDM Pilot 1 Channel and the PPC) shall be scrambled using the 4-bit Wide-area Differentiator corresponding to that area.

For the WIC OFDM symbol in a superframe only 1 slot shall be allocated. The allocated slot shall use as input a 1000-bit fixed pattern, with each bit set to zero. The input bit pattern shall be processed according to the steps illustrated in FIG. 14. No processing shall be performed for the un-allocated slots.

and the Local-area Data Channel and the 2 Reserved OFDM symbols when the PPC is absent, these bits shall be set to the 4-bit Local-area Differentiator (LID). Bit $b_0$ is a reserved bit and shall be set to '1'. Bits $a_{10}$ through $a_0$ shall correspond to the OFDM symbol index number in a superframe, which ranges from 0 through 1199.

The scrambling sequence for each slot shall be generated by a modulo-2-inner product of the 20-bit state vector of the sequence generator and a 20-bit mask associated with that slot index as specified in Table 7 below.

TABLE 7

Mask Associated with Different Slots

| Slots Index | $m_{19}$ | $m_{18}$ | $m_{17}$ | $m_{16}$ | $m_{15}$ | $m_{14}$ | $m_{13}$ | $m_{12}$ | $m_{11}$ | $m_{10}$ | $m_9$ | $m_8$ | $m_7$ | $m_6$ | $m_5$ | $m_4$ | $m_3$ | $m_2$ | $m_1$ | $m_0$ |
|---|---|---|---|---|---|---|---|---|---|---|---|---|---|---|---|---|---|---|---|---|
| 0 | 0 | 0 | 0 | 1 | 0 | 0 | 0 | 0 | 0 | 0 | 0 | 0 | 0 | 1 | 0 | 0 | 0 | 0 | 1 | 0 |
| 1 | 0 | 1 | 0 | 0 | 0 | 0 | 0 | 0 | 0 | 0 | 0 | 0 | 0 | 0 | 0 | 0 | 1 | 0 | 0 | 0 |
| 2 | 1 | 0 | 0 | 1 | 0 | 0 | 0 | 0 | 1 | 0 | 0 | 0 | 0 | 1 | 1 | 0 | 0 | 0 | 1 | 1 |
| 3 | 0 | 0 | 1 | 0 | 0 | 0 | 0 | 0 | 0 | 0 | 0 | 0 | 1 | 0 | 0 | 0 | 0 | 0 | 0 | 0 |
| 4 | 1 | 1 | 0 | 0 | 0 | 0 | 0 | 0 | 0 | 0 | 1 | 0 | 0 | 0 | 0 | 0 | 0 | 0 | 0 | 0 |
| 5 | 1 | 0 | 0 | 1 | 0 | 0 | 0 | 0 | 1 | 0 | 0 | 0 | 0 | 1 | 0 | 0 | 0 | 0 | 1 | 0 |
| 6 | 0 | 1 | 1 | 0 | 0 | 0 | 1 | 0 | 0 | 0 | 0 | 1 | 0 | 0 | 0 | 0 | 1 | 1 | 0 | 0 |
| 7 | 1 | 0 | 0 | 0 | 0 | 0 | 0 | 0 | 0 | 0 | 0 | 0 | 0 | 0 | 0 | 0 | 0 | 0 | 0 | 0 |

Slot Allocation

The WIC shall be allocated the slot with index 3. The allocated and un-allocated slots in the WIC OFDM symbol are illustrated in FIG. 15. The slot index chosen is the one that maps to interlace 0 for OFDM symbol index 1, which will be discussed later.

Filling of Slot Buffer

The buffer for the allocated slot shall be completely filled with a fixed pattern consisting of 1000 bits, with each bit set to '0'. The buffers for the un-allocated slots shall be left empty.

Slot Scrambling

The bits of each allocated slot buffer shall be XOR'd sequentially with the scrambler output bits to randomize the bits prior to modulation. The scrambled slot buffer corresponding to slot index i is denoted as SB(i), where i∈{0,1, . . . , 7}. The scrambling sequence used for any slot buffer depends on the OFDM symbol index and the slot index.

Figure 16:
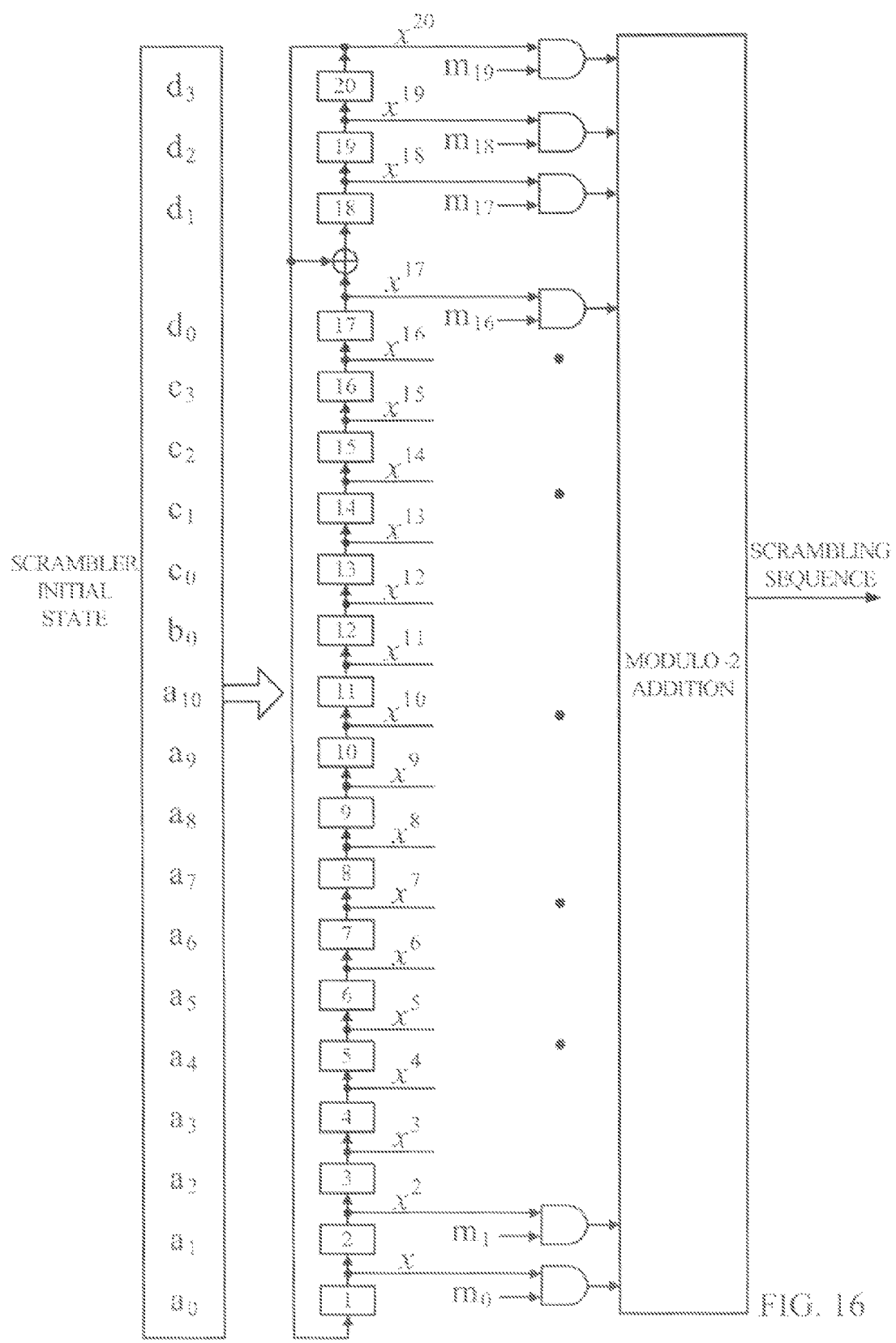
FIG. 16 shows an exemplary Slot Bit Scrambler.
Figure 21:
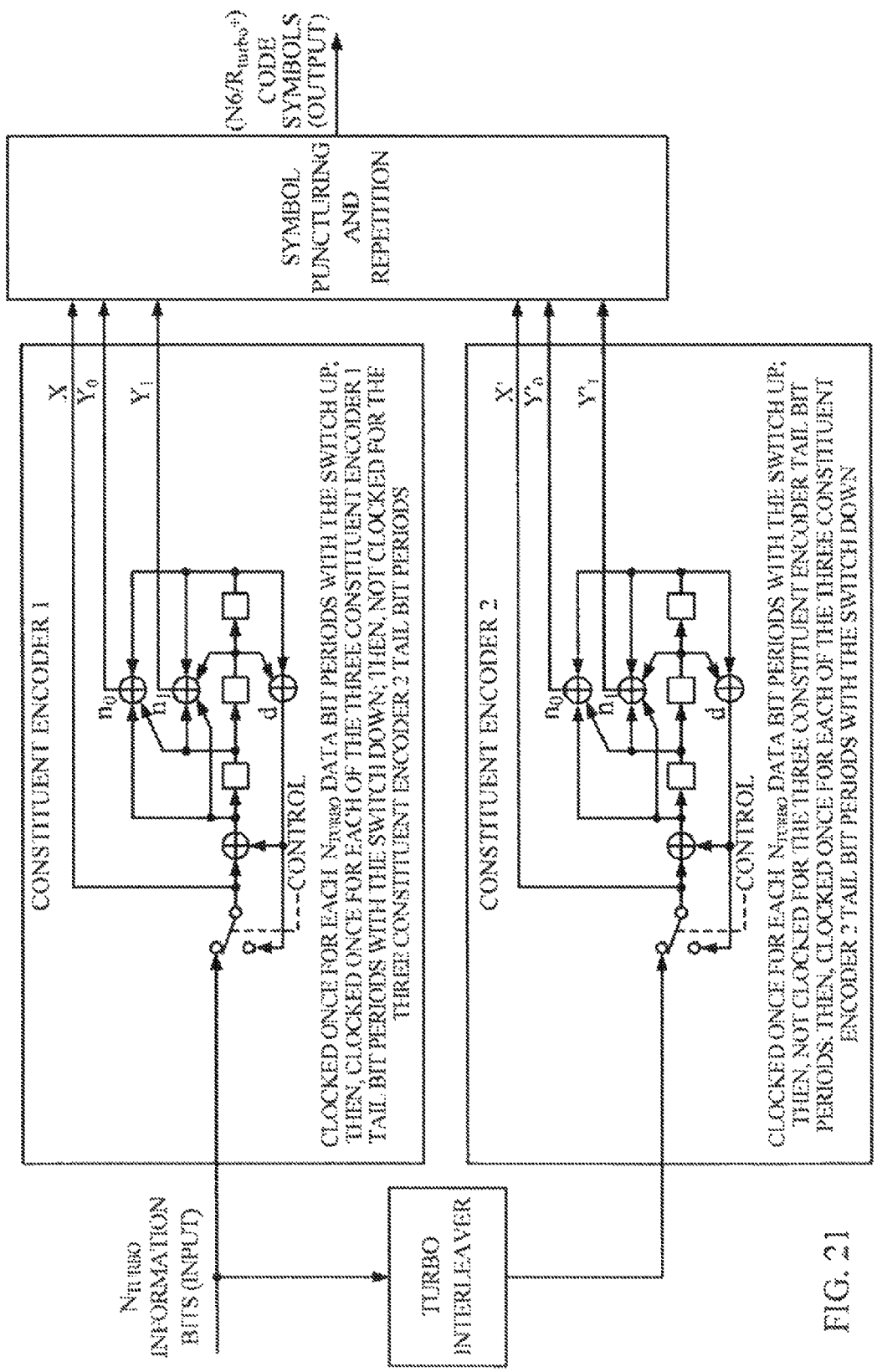
FIG. 21 shows a block diagram of an exemplary Turbo encoder architecture.

The scrambling bit sequence shall be equivalent to one generated with a 20-tap linear feedback shift register (LFSR) with the generator sequence $h(D)=D^{20}+D^{17}+1$, as shown in FIG. 16. The transmitter shall use a single LFSR for all transmissions.

At the start of every OFDM symbol, the LFSR shall be initialized to the state $[d_3d_2d_1d_0c_3c_2c_1c_0b_0a_{10}a_9a_8a_7a_6a_5a_4a_3a_2a_1a_0]$, which depends on the channel type (the TDM Pilot or the Wide-area or the Local-area Channel), and the OFDM symbol index in a superframe.

Bits '$d_3d_2d_1d_0$' shall be set as follows. For all the Wide-area channels )the WIC, the WIPC, the Wide-area OIS and the Wide-area Data Channel), the Local-area channels (the LIC, the LTPC, the Local-area OIS and the Local-area Data Channel) and the TDM Pilot 2 Channel and the 2 Reserved OFDM symbols when the PPC is absent, these bits shall be set to the 4-bit Wide-area Differentiator (WID).

Bits '$c_3c_2c_1c_0$' shall be set as follows: for the TDM Pilot 2 Channel, the Wide-area OIS Channel, the Wide-area Data Channel, the WTPC and the WIC these bits shall be set to '0000'; for the Local-area OIS Channel, the LTPC, the LIC The shift register shall be reloaded with a new state $[d_3d_2d_1d_0c_3c_2c_1c_0b_0a_{10}a_9a_8a_7a_6a_5a_4a_3a_2a_1a_0]$ for each slot at the start of every OFDM symbol.

Modulation Symbol Mapping

Each group of two consecutive bits from the $i^{th}$ scrambled slot buffer, SB(i,2k) and SB(i, 2k+1), i=3, k=0,1, . . . 499, which are labeled as $s_0$ and $s_1$, respectively, shall be mapped into a complex modulation symbol MS=(mI, mQ) as specified in Table 6 with D=2. It is noted that the value of D is chosen to keep the OFDM symbol energy constant, since only 500 of the 4000 available sub-carriers are used. FIG. 13 shows the signal constellation for the QPSK modulation.

Slot to Interlace Mapping

The mapping of slots to interlaces for the WIC OFDM symbol shall be as specified as discussed later in this specification.

Mapping of Slot Buffer Modulation Symbols to Interlace Sub-Carriers

The 500 modulation symbols in the allocated slot shall be sequentially assigned to 500 interlace sub-carriers as follows: the $i^{th}$ complex modulation symbol (where i ∈{0,1, . . . 499}) shall be mapped to the $i^{th}$ sub-carrier of that interlace.

OFDM Common Operation

The modulated WIC sub-carriers shall undergo common operations as specified later is this specification.

Local-Area Identification Channel (LIC)

The Local-area Identification Channel (LIC) shall span one OFDM symbol. It shall be transmitted at OFDM symbol index 2 in a superframe. It follows the WIC channel OFDM symbol. This is an overhead channel that is used for conveying the Local-area Differentiator information to FLO receivers. All Local-area transmit waveforms shall be scrambled using a 4-bit Local-area Differentiator, in conjunction with the Wide-area Differentiator, corresponding to that area.

For the LIC OFDM symbol in a superframe only a single slot shall be allocated. The allocated slot shall use a 1000-bit fixed pattern as input. These bits shall be set to zero. These bits shall be processed according to the steps illustrated in FIG. 14 No processing shall be performed for the on-allocated slots.

Slot Allocation

The LIC shall be allocated the slot with index 5. The allocated and un-allocated slots in the LIC OFDM symbol are illustrated in FIG. 17. The slot index chosen is the one that maps to interlace 0 for OFDM symbol index 2.

Filling of Slot Buffer

The buffer for the allocated slot shall be completely filled with a fixed pattern consisting of 1000 bits, with each bit set to '0'. The buffers for the un-allocated slots shall be left empty.

Slot Scrambling

The bits of the LIC slot buffer shall be scrambled as specified in 0. The scrambled slot buffer is denoted by SB.

Modulation Symbol Mapping

Each group of two consecutive bits from the $i^{th}$ scrambled slot buffer, SB(i, 2k) and SB(i, 2k+1), i=5, k=0,1, ... 499, which are labeled as $s_0$ and $s_1$, respectively, shall be mapped into a complex modulation symbol MS=(mI, mQ) as specified in Table 6 with D=2. The value of D is chosen to keep the OFDM symbol energy constant, since only 500 of the 4000 available sub-carriers are used. FIG. 13 shows the signal constellation for the QPSK modulation.

Slot to Interlace Mapping

The mapping of slots to interlaces for the LIC OFDM symbol shall be as specified as discussed later.

Mapping of Slot Buffer Modulation Symbols to Interlace Sub-Carriers

The 500 modulation symbols in the allocated slot shall be sequentially assigned to 500 interlace sub-carriers as follows: the $i^{th}$ complex modulation symbol (where i ∈ {0,1 ... 499}) shall be mapped to the $i^{th}$ sub-carrier of that interlace.

OFDM Common Operation

The modulated LIC sub-carriers shall undergo common operations as specified as discussed later.

TDM Pilot 2 Channel

The TDM Pilot 2 Channel shall span one OFDM symbol. It shall be transmitted at OFDM symbol index 3 in a superframe. It follows the LIC OFDM symbol. It may be used for fine OFDM symbol timing corrections in the FLO receivers.

For the TDM Pilot 2 OFDM symbol in each superframe only 4 slots shall be allocated. Each allocated slot shall use as input a 1000-bit fixed pattern, with each bit set to zero. These bits shall be processed according to the steps illustrated in FIG. 14 No processing shall be performed for the un-allocated slots.

In FIG. 14 the mapping of slots to interlaces ensures that the allocated slots are mapped into interlaces 0, 2, 4, and 6. Therefore, the TDM Pilot 2 OFDM symbol is comprised of 2000 non-zero sub-carriers which are uniformly spaced among the Active sub-carriers (see [00132]). The $i^{th}$ TDM Pilot 2 sub-carrier shall correspond to the sub-carrier index j defined as follows:

$$j = \begin{cases} 48 + (i) \times 2, & \forall i \in \{0, 1 \ldots 999\} \\ 48 + (i+1) \times 2, & \forall i \in \{1000, \ldots 1999\} \end{cases}$$

Note that the TDM Pilot 2 Channel does not use the sub-carrier with index 2048.

Slot Allocation

For the TDM Pilot 2 OFDM symbol, the allocated slots shall have indices 0, 1, 2, and 7.

The allocated and un-allocated slots in the TDM Pilot 2 OFDM symbol are illustrated in FIG. 18.

Filling of Slot Buffer

The buffer for each allocated slot shall be completely filled with a fixed pattern consisting of 1000 bits, with each bit set to '0'. The buffers for the un-allocated slots shall be left empty.

Slot Scrambling

The bits of the TDM Pilot 2 Channel slot buffers shall be scrambled as specified as discussed above. The scrambled slot buffer is denoted by SB.

Modulation Symbol Mapping

Each group of two adjacent bits from the $i^{th}$ scrambled slot buffer, SB(i,2k) and SB(i, 2k+1), i=0,1,2,7, k=0,1, ... 499, which are labeled as $s_0$ and $s_1$, respectively, shall be mapped into a complex modulation symbol MS=(mI, mQ) as specified in Table 6 with D=1. The value of D is chosen to keep the OFDM symbol energy constant, since only 2000 of the 4000 available sub-carriers are used. FIG. 13 shows the signal constellation for the QPSK modulation.

Slot to Interlace Mapping

The mapping of slots to interlaces for the TDM Pilot 2 Channel OFDM symbol shall be as specified herein.

Mapping of Slot Buffer Modulation Symbols to Interlace Sub-Carriers

The 500 modulation symbols in an allocated slot shall be sequentially assigned to 500 interlace sub-carriers as follows: the $i^{th}$ complex modulation symbol (where i ∈ {0,1, ... 499}) shall be mapped to the $i^{th}$ sub-carrier of that interlace.

OFDM Common Operation

The modulated TDM Pilot 2 Channel sub-carriers shall undergo common operations as specified herein.

Transition Pilot Channel (TPC)

The Transition Pilot Channel consists of 2 sub-channels: the Wide-area Transition Pilot Channel (WTPC) and the Local-area Transition Pilot Channel (LTPC). The TPC flanking the Wide-area OIS and the Wide-area Data channel is called the WTPC. Th TPC flanking the Local-area OIS and the Local-area Data Channel is called the LTPC. The WTPC spans 1 OFDM symbol on either side of every Wide-area channel transmission with the exception of the WIC (the Wide-area Data and the Wide-area OIS Channel) in a superframe. The LTPC spans 1 OFDM symbol on either side of every Local-area Channel transmission with the exception of the LIC (the Local-area Data and the Local-area OIS Channel). The purpose of the TPC OFDM symbol is two-fold: to allow channel estimation at the boundary between the Local-area and the Wide-area channels and to facilitate timing synchronization for the first Wide-area (or Local-area) MLC in each frame. The TPC spans 20 OFDM symbols in a superframe, which are equally divided between the WTPC and the LTPC as illustrated in FIG. 10. There are nine instances where the LTPC and the WTPC transmissions occur right next to each other and two instances where only one of these channels is transmitted. Only the WIPC is transmitted after the TDM Pilot 2 Channel, and only the LTPC is transmitted prior to the Positioning Pilot Channel (PPC)/Reserved OFDM symbols.

It is assumed that P is the number of OFDM symbols in the PPC or the number of Reserved OFDM symbols in the case where the PPC is absent in a superframe, W is the number of OFDM symbols associated with the Wide-area Data Channel in a frame, L is the number of OFDM symbols associated with the Local-area Data Channel in a frame, and F be the number of OFDM symbols in a frame.

The values of P shall be 2, 6, 10, or 14. The number of Data Channel OFDM symbols in a frame shall be F-4. The exact locations of the TPC OFDM symbols in a superframe shall be as specified in Table 8 below.

TABLE 8

TPC Location Indices in a Superframe

| Transition Pilot Channel | Index for the WTPC OFDM Symbol | Index for the LTPC OFDM Symbol |
|---|---|---|
| TDM Pilot 2 Channel→Wide-area OIS Channel | 4 | — |
| Wide-area OIS Channel →Local-area OIS Channel | 10 | 11 |
| Local-area OIS Channel→Wide-area Data Channel | 18 | 17 |
| Wide-area Data Channel→Local-area Data Channel | 19 + W + F × i {i = 0, 1, 2, 3} | 20 + W + F × i {i = 0, 1, 2, 3} |
| Local-area Data Channel →Wide-area Data Channel | 18 + F × i {i = 0, 1, 2, 3} | 17 + F × i {i = 0, 1, 2, 3} |
| Local-area Data Channel → PPC/Reserved Symbols | — | 1199-P |

All slots in the TPC OFDM symbols use as input a 1000-bit fixed pattern, with each bit set to zero. These bits shall be processed according to the steps illustrated in FIG. 14.
Slot Allocation
The TPC OFDM symbol shall be allocated all 8 slots with indices 0 through 7.
Filling of Slot Buffer
The buffer for each allocated slot shall be completely filled with a fixed pattern consisting of 1000 bits, with each bit set to '0'.
Slot Scrambling
The bits of each allocated TPC slot buffer shall be scrambled as specified previously. The scrambled slot buffer is denoted by SB.
Modulation Symbol Mapping
Each group of two consecutive bits from the $i^{th}$ scrambled slot buffer, SB(i, 2k) and SB(i, 2k+1), i=0,1,2, . . . 7, k=0,1, . . . 499, which are labeled as $s_0$ and $s_1$ respectively, shall be mapped into a complex modulation symbol MS=(mI, mQ) as specified in Table 6 with $$D = \frac{1}{\sqrt{2}}.$$

FIG. 13 shows the signal constellation for the QPSK modulation.
Slot to Interlace Mapping
The mapping of slots to interlaces for the TPC OFDM symbol shall be as specified herein.
Mapping of Slot Buffer Modulation Symbols to Interlace Sub-Carriers
The 500 modulation symbols in each allocated slot shall be sequentially assigned to 500 interlace sub-carriers as follows: the $i^{th}$ complex modulation symbol (where i ∈{0,1, . . . 499}) shall be mapped to the $i^{th}$ sub-carrier of that interlace.
OFDM Common Operation
The modulated TPC sub-carriers shall undergo common operations as specified in herein.
Positioning Pilot Channel/Reserved Symbols
The Positioning Pilot Channel (PPC) may appear at the end of a superframe. When present it has a variable duration of 6, 10, or 14 OFDM symbols. When the PPC is absent, there are two Reserved OFDM symbols at the end of the superframe. The presence or absence of the PPC and its duration are signaled over the OIS Channel.
Positioning Pilot Channel
The PPC structure including the information transmitted and the waveform generation is TBD.
The FLO device may use the PPC either autonomously or in conjunction with the GPS signal to determine its geographical location.
Reserved OFDM Symbols
When the PPC is absent, there are two Reserved OFDM symbols at the end of the superframe.
All slots in the Reserved OFDM Symbols use as input a 1000-bit fixed pattern, with each bit set to zero. These bits shall be processed according to the steps illustrated in FIG. 14
Slot Allocation
The Reserved OFDM symbol shall be allocated all 8 slots with indices 0 through 7.
Filling of Slot Buffer
The buffer for each allocated slot shall be completely filled with a fixed pattern consisting of 1000 bits, with each bit set to '0'.
Slot Scrambling
The bits of each allocated Reserved OFDM symbol slot buffer shall be scrambled as specified in 0. The scrambled slot buffer is denoted by SB.
Modulation Symbol Mapping
Each group of two consecutive bits from the $i^{th}$ scrambled slot buffer, SB(i,2k) and SB(i,2k+1), i=0,1,2, . . . 7, k=0,1, . . . 499, which are labeled as $s_0$ and $s_1$, respectively, shall be mapped into a complex modulation symbol MS=(mI, mQ) as specified in Table 6 with D=1/√2. FIG. 13 shows the signal constellation for the QPSK modulation.
Slot to Interlace Mapping
The mapping of slots to interlaces for the Reserved OFDM symbols shall be as specified herein.
Mapping of Slot Buffer Modulation Symbols to Interlace Sub-Carriers
The 500 modulation symbols in each allocated slot shall be sequentially assigned to 500 interlace sub-carriers as follows: the $i^{th}$ complex modulation symbol (where i∈{0,1, . . . 499)} shall be mapped to the $i^{th}$ sub-carrier of that interlace.
OFDM Common Operation
The modulated Reserved OFDM Symbol sub-carriers shall undergo common operations as specified herein.
Wide-Area OIS Channel
This channel is used to convey overhead information about the active MLC's associated with the Wide-area Data Channel, such as their scheduled transmission times and slot allocations, in the current superframe. The Wide-area OIS Channel spans 5 OFDM symbol intervals in each superframe (see FIG. 10).
The Physical layer packet for the Wide-area OIS Channel shall be processed according to the steps illustrated in FIG. 19.
Encoding
The Wide-area OIS Channel Physical layer packets shall be encoded with code rate R=⅕. The encoder shall discard the 6-bit TAIL field of the incoming Physical layer packet and encode the remaining bits with a parallel turbo encoder as specified herein. The turbo encoder shall add an internally generated tail of 6/R (=30) output code bits, so that the total number of turbo encoded bits at the output is 1/R times the number of bits in the input Physical layer packet.
FIG. 20 illustrates the encoding scheme for the Wide-area OIS Channel. The Wide-area OIS Channel encoder parameters shall be as specified in Table 9 below.

TABLE 9

Parameters of the Wide-area/Local-area OIS Channel Encoder

| Bits | Turbo Encoder Input Bits $N_{turbo}$ | Code Rate | Turbo Encoder Output bits |
|---|---|---|---|
| 1000 | 994 | 1/5 | 5000 |

Turbo Encoder

The turbo encoder employs two systematic, recursive, convolutional encoders connected in parallel, with an interleaver, the turbo interleaver, preceding the second recursive convolutional encoder. The two recursive convolutional codes are called the constituent codes of the turbo code. The outputs of the constituent encoders are punctured and repeated to achieve the desired number of turbo encoded output bits.

A common constituent code shall be used for turbo codes of rates 1/5, 1/3, 1/2, and 2/3. The transfer function for the constituent code shall be as follows:

$$C(D) = \begin{bmatrix} 1 & \frac{n_0(D)}{d(D)} & \frac{n_1(D)}{d(D)} \end{bmatrix}$$

where $d(D)=1+D2+D3$, $n0(D)=1+D+D3$, and $n1(D)=1+D+D2+D3$.

The turbo encoder shall generate an output symbol sequence that is identical to the one generated by the encoder shown in FIG. 20. Initially, the states of the constituent encoder's registers in this figure are set to zero. Then, the constituent encoders are clocked with the switches in the position noted.

The encoded data output bits are generated by clocking the constituent encoders $N_{turbo}$ times with the switches in the up positions and puncturing the output as specified in Table 10, which is shown below. Within a puncturing pattern, a '0' means that the bit shall be deleted and a '1' means that the bit shall be passed. The constituent encoder outputs for each bit period shall be passed in the sequence X, $Y_0$, $Y_1$, X', $Y'_0$, $Y'_1$ with the X output first. Bit repetition is not used in generating the encoded data output bits.

The constituent encoder output symbol puncturing for the tail period shall be as specified in Table 11, shown below. Within a puncturing pattern, a '0' means that the symbol shall be deleted and a '1' means that a symbol shall be passed.

For rate 1/5 turbo codes, the tail output code bits for each of the first three tail periods shall be punctured and repeated to achieve the sequence XX$Y_0Y_1Y_1$, and the tail output code bits for each of the last three tail bit periods shall be punctured and repeated to achieve the sequence X'X'$Y'_0Y'_1Y'_1$.

TABLE 10

Puncturing Patterns for the Data Bit Periods for the OIS Channel

| Output | Code Rate 1/5 |
|---|---|
| X | 1 |
| $Y_0$ | 1 |
| $Y_1$ | 1 |
| X' | 0 |
| $Y'_0$ | 1 |
| $Y'_1$ | 1 |

It is noted that in Table 10 above, the puncturing table is to be read from top to bottom

TABLE 11

Puncturing Patterns for the Tail Bit Periods for the OIS Channel

| Output | Code Rate 1/5 |
|---|---|
| X | 111 000 |
| $Y_0$ | 111 000 |
| $Y_1$ | 111 000 |
| X' | 000 111 |
| $Y'_0$ | 000 111 |
| $Y'_1$ | 000 111 |

It is noted that in Table 11, for rate-1/5 turbo codes, the puncturing table is to be read first from top to bottom repeating X, X', $Y_1$, and $Y'_1$ and then from left to right.

Turbo Interleaver

The turbo interleaver, which is part of the turbo encoder, shall block interleave the turbo encoder input data that is fed to the Constituent Encoder 2.

The turbo interleaver shall be functionally equivalent to an approach where the entire sequence of turbo interleaver input bits are written sequentially into an array at a sequence of addresses and then the entire sequence is read out from a sequence of addresses that are defined by the procedure described below.

Let the sequence of input addresses be from 0 to $N_{turbo}-1$. Then, the sequence of interleaver output addresses shall be equivalent to those generated by he procedure illustrated in FIG. 22 and described below. It is noted that this procedure is equivalent to one where the counter values are written into a 25-row by 2n column array by rows, the rows are shuffled according to a bit-reversal rule, the elements within each row are permuted according to a row-specific linear congruential sequence, and tentative output addresses are read out by column. The linear congruential sequence rule is $x(i+1)=(x(i)+c)$ mod 2n, where $x(0)=c$ and c is a row-specific value from a table lookup.

Figure 22:
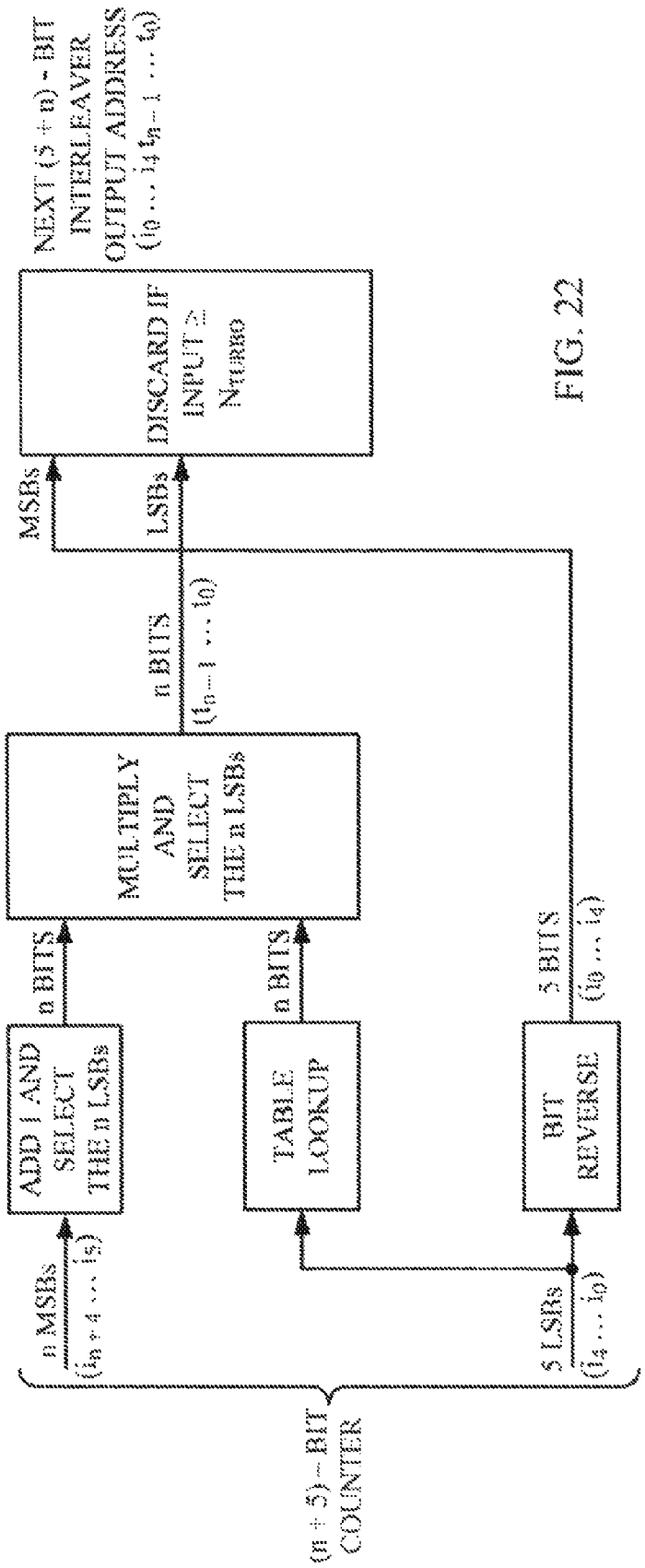
FIG. 22 shows a block diagram of a procedure for calculating Turbo Interleaver output addresses.

Concerning the procedure in FIG. 22, the process includes determining the turbo interleaver parameter, n, where n is the smallest integer such that Nturbo≦2n+5. Table 12 shown below gives this parameter for the 1000-bit physical layer packet. The process also includes initializing an (n+5) bit counter to 0 and extracting the n most significant bits (MSBs) from the counter and adding one to form a new value. Then, discard all except the n least significant bits (LSBs) of this value. The process further includes obtaining the n-bit output of the table lookup defined in Table 13 shown below with a read address equal to the five LSBs of the counter. Note that this table depends on the value of n.

The process further includes multiplying the values obtained in the previous steps of extracting and obtaining, and then discarding all except the n LBSs. Next bit-reverse the five LSBs of the counter is performed. A tentative output address is then formed that has its MSBs equal to the value obtained in the bit-reverse step and its LSBs equal to the value obtained in the multiplying step.

Next, the process includes accepting the tentative output address as an output address if it is less than Nturbo; otherwise, it is discarded. Finally, the counter is incremented and the steps after the initialization step are repeated until all Nturbo interleaver output addresses are obtained.

TABLE 12

Turbo Interleaver Parameter

| Physical Layer Packet Size | Turbo Interleaver Block Size $N_{turbo}$ | Turbo Interleaver Parameter n |
|---|---|---|
| 1,000 | 994 | 5 |

TABLE 13

Turbo Interleaver Lookup Table Definition

| Table Index | n = 5 Entries |
|---|---|
| 0 | 27 |
| 1 | 3 |
| 2 | 1 |
| 3 | 15 |
| 4 | 13 |
| 5 | 17 |
| 6 | 23 |
| 7 | 13 |
| 8 | 9 |
| 9 | 3 |
| 10 | 15 |
| 11 | 3 |
| 12 | 13 |
| 13 | 1 |
| 14 | 13 |
| 15 | 29 |
| 16 | 21 |
| 17 | 19 |
| 18 | 1 |
| 19 | 3 |
| 20 | 29 |
| 21 | 17 |
| 22 | 25 |
| 23 | 29 |
| 24 | 9 |
| 25 | 13 |
| 26 | 23 |
| 27 | 13 |
| 28 | 13 |
| 29 | 1 |
| 30 | 13 |
| 31 | 13 |

Bit Interleaving

For the OIS Channel and the Data Channel, the bit interleaving is a form of block interleaving. The code bits of a turbo encoded packet are interleaved in such a pattern that adjacent code bits are mapped into different constellation symbols.

The Bit Interleaver shall reorder the turbo encoded bits as per the following procedure:

a. For N bits to be interleaved, the bit interleaver matrix M shall be a 4 columns by N/4 rows block interleaver. The N input bits shall be written into the interleaving array column-by-column sequentially. Label the rows of the matrix M by index j, where j=0 through N/4−1 and row 0 is the first row.

b. For every row j, with even index (j mod 2=0), the elements in the $2^{nd}$ and the $3^{rd}$ column shall be interchanged.

c. For every row with odd index (j mod 21=0), the elements in the $1^{st}$ and the $4^{th}$ column shall be interchanged.

d. Denote the resulting matrix by $\overline{M}$. The contents of $\overline{M}$ shall be read out row-wise, from left to right.

Figure 23:
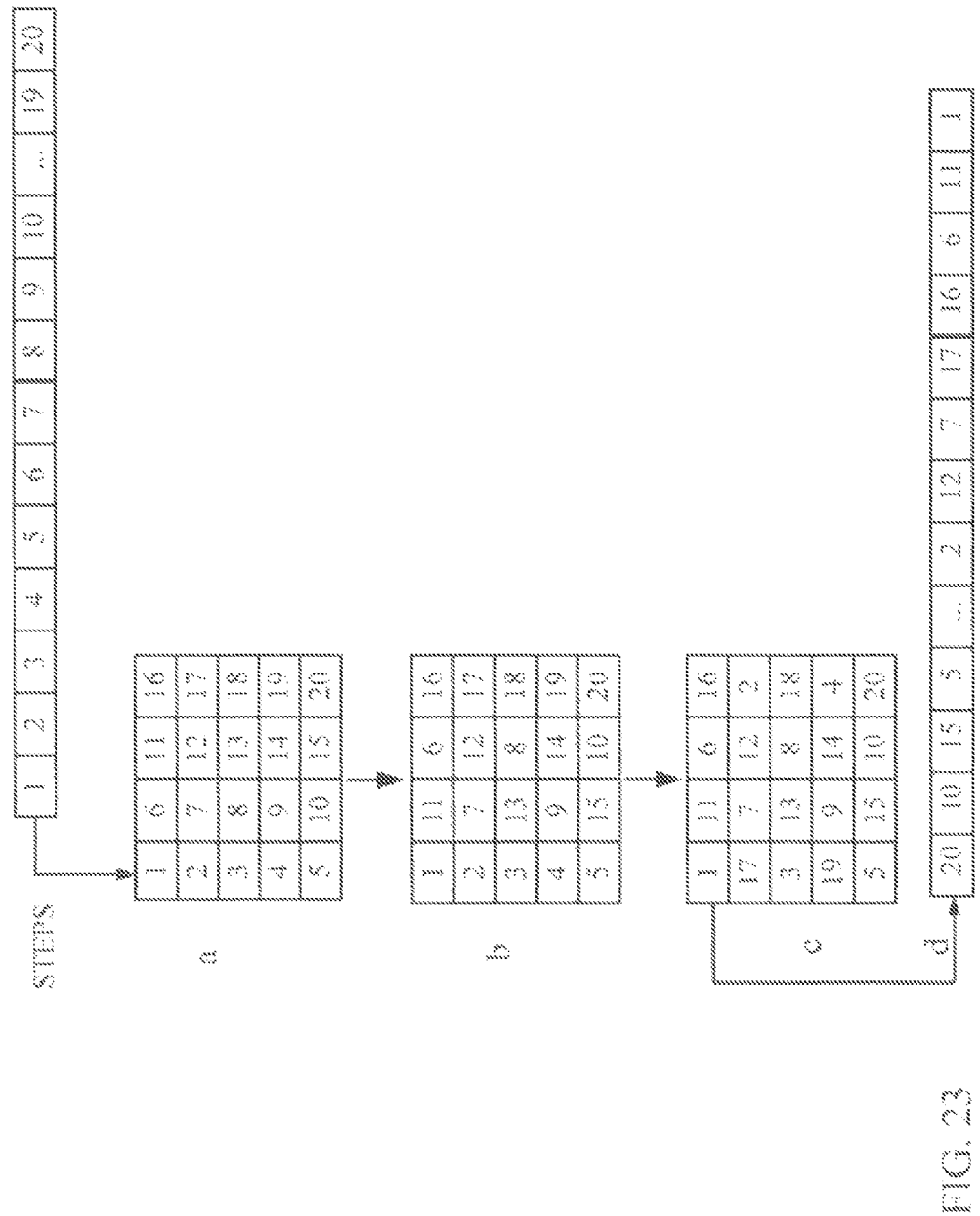
FIG. 23 shows a block diagram of an exemplary bit interleaver operation where N=20.

FIG. 23 illustrates the output of the bit-interleaver for the hypothetical case of N=20.

Data Slot Allocation

For the Wide-area OIS Channel, 7 data slots shall be allocated per OFDM symbol for the transmission of OIS Channel turbo encoded packets. The Wide-area OIS Channel shall use transmit mode 5. Therefore, it requires 5 data slots to accommodate the content of a single turbo encoded packet. Some Wide-area OIS Channel turbo encoded packets may span two consecutive OFSM symbols. The data slot allocations are made at the MAC layer.

Filling of Data Slot Buffer

The bit-interleaved code bits of a Wide-area OIS Channel turbo encoded packet shall be written sequentially into 5 consecutive data slot buffers in either one or two consecutive OFDM symbols as illustrated in FIG. 24. These data slot buffers correspond to slot indices 1 through 7. The data slot buffer size shall be 1000 bits. It is noted that the data slot buffer size is 1000 bits for QPSK and 2000 bits for 16-QAM and layered modulation. The 7 Wide-area OIS Channel turbo encoded packets (TEP) shall occupy consecutive slots over 5 consecutive OFDM symbols in the Wide-area OIS Channel (see FIG. 10).

Slot Scrambling

The bits of each allocated slot buffer shall be scrambled as discussed previously. The scrambled slot buffer is denoted by SB.

Mapping of Bits to Modulation Symbols

Each group of two consecutive bits from the $i^{th}$ scrambled slot buffer, SB(i, 2k) and SB(2k+1), i=1, 2, ... 7, k=0,1, ... 499, which are labeled as $s_0$ and $s_1$, respectively, shall be mapped into a complex modulation symbol MS=(mL, mQ) as specified in Table 6 with D=$1/\sqrt{2}$. FIG. 13 shows the signal constellation for the QPSK modulation.

Slot to Interlace Mapping

The mapping of slots to interlaces for the Wide-area OIS Channel OFDM symbols shall be as specified herein.

Mapping of Slot Buffer Modulation Symbols to Interlace Sub-Carriers

The 500 modulation symbols in each allocated slot shall be sequentially assigned to 500 interlace sub-carriers as per the following procedure:

a. Create an empty Sub-carrier Index Vector (SCIV);
   b. Let i be an index variable in the range (i $\in\{0,511\}$). Initialize i to 0;
   c. Represent i by its 9-bit value $i_b$;
   d. Bit reverse $i_b$ and denote the resulting value as $i_{br}$. If $i_{br}$<500, then append $i_{br}$ to the SCIV;
   e. If i<511, then increment i by 1 and go to step c; and
   f. Map the symbol with index, j (j$\in\{0,499\}$), in a data slot the interlace sub-carrier with index SCIV [j] assigned to that data slot.

It is noted that index SCIV needs to be computed only once and can be used for all data slots.

OFDM Common Operation

The modulated Wide-area OIS Channel sub-carriers shall undergo common operations as specified herein.

Local-Area OIS Channel

This channel is used to convey overhead information about the active MLCs associated with the Local-area Data Channel, such as their scheduled transmission times and slot allocations, in the current superframe. The Local-area OIS channel spans 5 OFDM symbol intervals in each superframe (see FIG. 10).

The Physical layer packet for the Local-area OIS Channel shall be processed according to the steps illustrated in FIG 14

Encoding

The local-area OIS Channel Physical layer packets shall be encoded with code rate R=⅕. The encoding procedure shall be identical to that for the Wide-area OIS Channel Physical layer packets as specified herein.

Bit Interleaving

The Local-area OIS Channel turbo encoded packet shall be bit interleaved as specified herein.

Data Slot Allocation

For the Local-area OIS Channel, 7 data slots shall be allocated per OFDM symbol for the transmission of turbo encoded packets. The Local-area OIS Channel shall use transmit mode 5. Therefore, it requires 5 data slots to accommodate the content of a single turbo encoded packet. Some Local-area OIS turbo-packets may span two consecutive OFDM symbols. The data slot allocations are made at the MAC layer.

Filling of Data Slot Buffers

The bit-interleaved code bits of a Local-area OIS Channel turbo encoded packet shall be written sequentially into 5 consecutive data slot buffers in either one or two consecutive OFDM symbols as illustrated in FIG. 25 These data slot buffers correspond to slot indices 1 through 7. The data slot buffer size shall be 1000 bits. The 7 Local-area OIS Channel turbo encoded packets (TEP) shall occupy consecutive slots over 5 consecutive OFDM symbols in the Local-area OIS Channel (see FIG. 25).

Slot Scrambling

The bits of each allocated slot buffer shall be scrambled as specified in 0. The scrambled slot buffer is denoted by SB.

Mapping of Bits to Modulation Symbols

Each group of two consecutive bits from the $i^{th}$ scrambled slot buffer, $SB(i, 2k)$ and $SB(i, 2k+1)$, $i=1,2, \ldots 7$, $k=0,1, \ldots 499$, which are labeled as $s_0$ and $s_1$ respectively, shall be mapped into a complex modulation symbol $MS=(mI, mQ)$ as specified in Table 6 with $D=1/\sqrt{2}$. FIG. 13 shows the signal constellation for the QPSK modulation.

Slot to Interlace Mapping

The mapping of slots to interlaces for the Local-area OIS Channel OFDM symbols shall be as specified herein.

Mapping of Slot Buffer Modulation Symbols to Interlace Sub-Carriers

This procedure shall be identical to that for the Wide-area OIS Channel as specified herein.

OFDM Common Operation

The modulated Local-area OIS Channel sub-carriers shall undergo common operations as specified herein.

Wide-Area FDM Pilot Channel

The Wide-area FDM Pilot Channel is transmitted in conjunction with the Wide-area Data Channel or the Wide-area OIS Channel. The Wide-area FDM Pilot Channel carries a fixed bit pattern that may be used for Wide-area Channel estimation and other functions by the FLO device.

For the Wide-area FDM Pilot Channel a single slot shall be allocated during every OFDM symbol that carries either the Wide-area Data Channel or the Wide-area OIS Channel.

The allocated slot shall use a 1000-bit fixed pattern as input. These bits shall be set to zero. These bits shall be processed according to the steps illustrated in FIG. 14.

Slot Allocation

The Wide-area FDM Pilot Channel shall be allocated the slot with index 0 during every OFDM symbol that carries either the Wide-area Data Channel or the Wide-area OIS Channel.

Filling of Slot Buffer

The buffer for the slot allocated to the Wide-area FDM Pilot Channel shall be completely filled with a fixed pattern consisting of 1000-bits, with each bit set to '0'.

Slot Scrambling

The bits of the Wide-area FDM Pilot Channel slot buffer shall be scrambled as specified herein. The scrambled slot buffer is denoted by SB.

Modulation Symbol Mapping

Each group of two consecutive bits of the $i^{th}$ scrambled slot buffer, $SB(i, 2k)$ and $SB(i, 2k+1)$, $i=0, k=0,1, \ldots 499$, which are labeled as $s_0$ and $s_1$, respectively, shall be mapped into a complex modulation symbol $MS=(mI, mQ)$ as specified in Table 6 with $D=1/\sqrt{2}$. FIG. 13 shows the signal constellation for the QPSK modulation.

Slot to Interlace Mapping

The mapping of the Wide-area FDM Pilot Channel slots to interlaces shall be as specified herein.

Mapping of Slot Buffer Modulation Symbols to Interlace Sub-Carriers

The 500 modulation symbols in the allocated slot shall be sequentially assigned to 500 interlace sub-carriers as follows: the $i^{th}$ complex modulation symbol (where $i \in \{0, 1, \ldots 499\}$) shall be mapped to the $i^{th}$ sub-carrier of that interlace.

OFDM Common Operation

The modulated Wide-area FDM Pilot Channel sub-carriers shall undergo common operations as specified herein.

Local-Area FDM Pilot Channel

The Local-area FDM Pilot Channel is transmitted in conjunction with the Local-area Data Channel or the Local-area OIS Channel. The Local-area FDM Pilot Channel carries a fixed bit pattern that may be used for Local-area channel estimation and other functions by the FLO device.

For the Local-area FDM Pilot Channel a single slot shall be allocated during every OFDM symbol that carries either the Local-area Data Channel or the Local-area OIS Channel.

The allocated slot shall use a 1000-bit fixed pattern as input. These bits shall be set to zero. These bits shall be processed according to the steps illustrated in FIG. 14.

Slot Allocation

The Local-area FDM Pilot Channel shall be allocated the slot with index 0 during every OFDM symbol that carries either the Local-area Data Channel or the Local-area OIS Channel.

Filling of Pilot Slot Buffer

The buffer for the slot allocated to the Local-area FDM Pilot Channel shall be completely filled with a fixed pattern consisting of 100-bits with each bit set to '0'.

Slot Buffer Scrambling

The bits of the Local-area FDM Pilot slot buffer shall be scrambled as specified in 0. The scrambled slot buffer is denoted by SB.

Modulation Symbols Mapping

Each group of two consecutive bits of the $i^{th}$ scrambled slot buffer, $SB(i,2k)$ and $SB(i, 2k+1)$, $i=0, k=0,1, \ldots 499$ which are labeled as $s_0$ and $s_1$, respectively, shall be mapped into a complex modulation symbol $MS=(mI, mQ)$ as specified in Table 6 with $D=1/\sqrt{2}$. FIG. 13 shows the signal constellation for the QPSK modulation.

Slot to Interlace Mapping

The mapping of the Wide-area FDM Pilot Channel slots to interlaces shall be as specified herein.

Mapping of Slot Buffer Modulation Symbols to Interlace Sub-Carriers

The 500 modulation symbols in the allocated slot shall be sequentially assigned to 500 interlace sub-carriers as follows: the $i^{th}$ complex modulation symbol (where $i \in \{0,1, \ldots, 499\}$) shall be mapped to the $i^{th}$ sub-carrier of that interlace.

OFDM Common Operation

The modulated Local-area FDM Pilot Channel sub-carriers shall undergo common operations as specified herein.

Wide-Area Data Channel

The Wide-area Data Channel is used to carry Physical layer packets meant for Wide-area multicast. The Physical layer packets for the Wide-area Data Channel can be associated with any one of the active MLCs transmitted in the Wide-area.

Wide-Area Data Channel Processing for Allocated Slots

Figure 26:
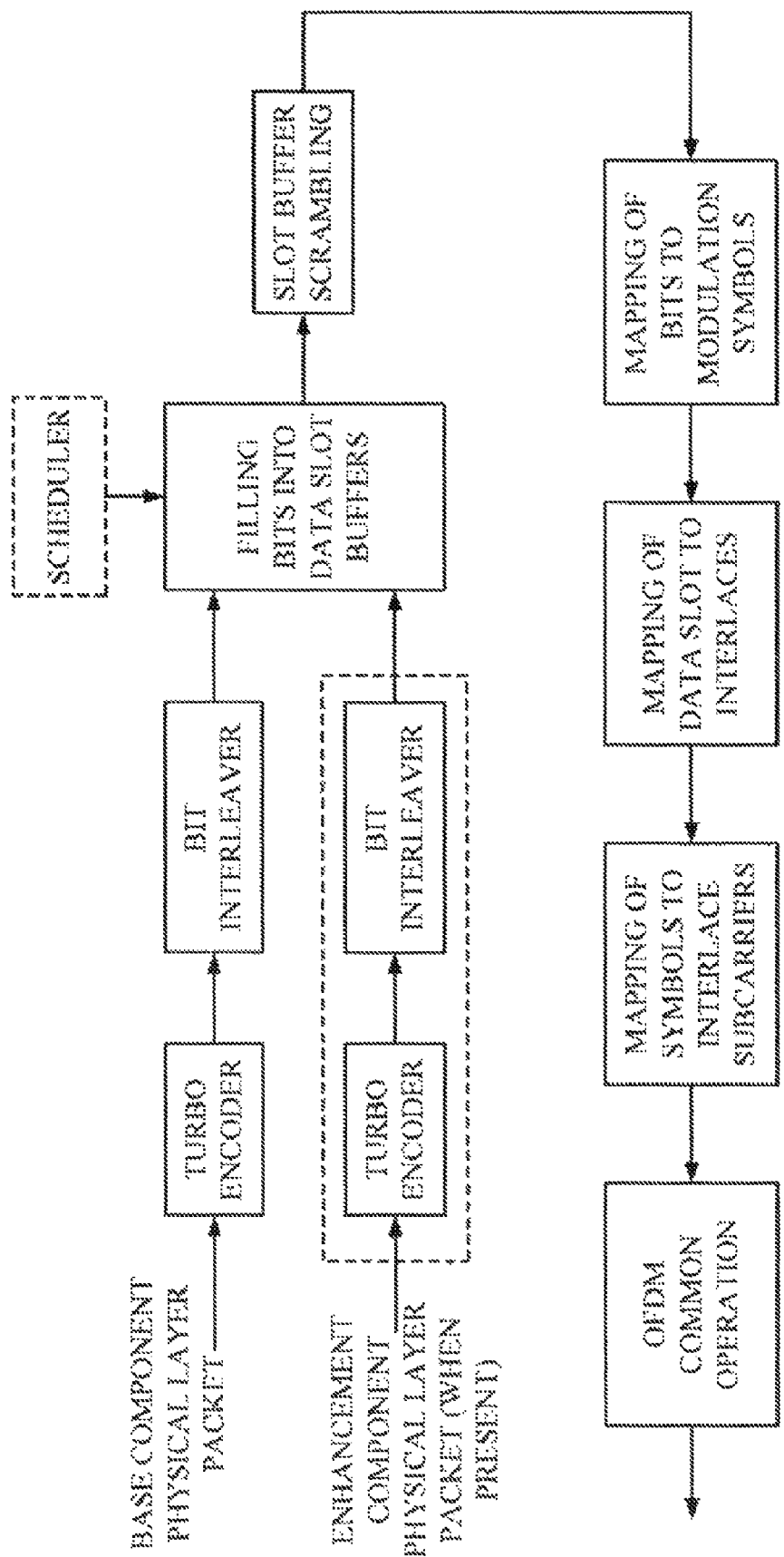
FIG. 26 shows a block diagram illustrating a procedure for processing Data Channel Physical Layer Packets in a transmitter

The Physical layer packet for the Wide-area Data Channel shall be processed according to the steps illustrated in FIG. 26.

For regular modulation (QPSK and 16-QAM), the Physical layer packet is turbo-encoded and bit interleaved before being stored in the Data slot buffer(s). For layered modulation, the base-component Physical layer packet and the enhancement-component Physical layer packet are turbo-encoded and bit interleaved independently before being multiplexed in to the Data slot buffer(s).

Encoding

The Wide-area Data Channel Physical layer packets shall be encoded with code rate R=½, ⅓, or ⅔. The encoder shall discard the 6-bit TAIL field of the incoming Physical layer packet and encode the remaining bits with a parallel turbo encoder as specified herein. The turbo encoder shall add an internally generated tail of 6/R (=12, 18 or 9) output code bits, so that the total number of turbo encoded bits at the output is 1/R times the number of bits in the input Physical layer packet.

Figure 27:
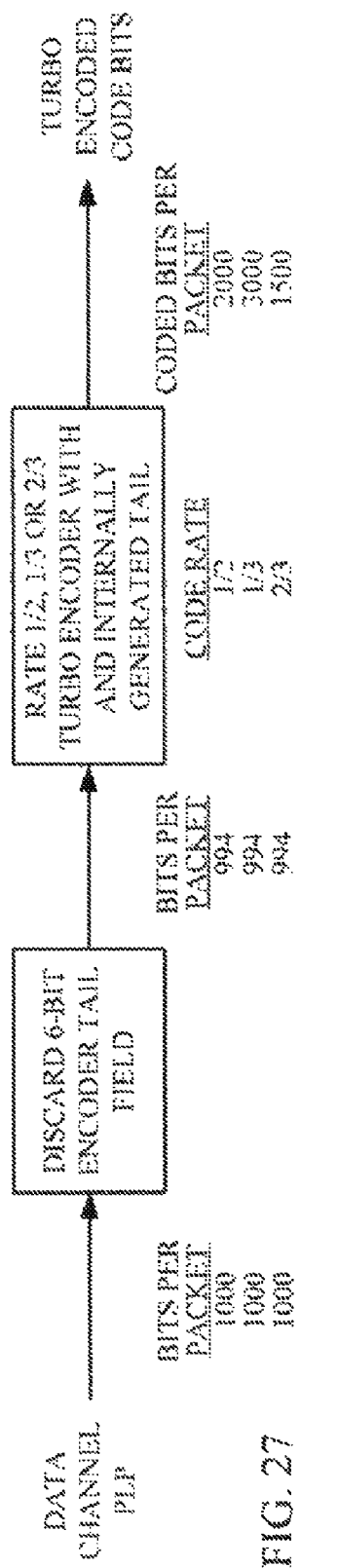
FIG. 27 shows a block diagram of an exemplary Data Channel Encoder.

FIG. 27 illustrates the encoding scheme for the Wide-area Data Channel. The Wide-area Data Channel encoder parameters shall be as specified in Table 14 below.

TABLE 14

Parameters of the Data Channel Encoder

| Bits | Turbo Encoder Input Bits $N_{turbo}$ | Code Rate | Turbo Encoder Output bits |
| --- | --- | --- | --- |
| 1000 | 994 | ½ | 2000 |
| 1000 | 994 | ⅓ | 3000 |
| 1000 | 994 | ⅔ | 1500 |

Turbo Encoder

The turbo encoder used for Wide-area Data Channel Physical layer packets shall be as specified herein.

The encoded data output bits are generated by clocking the constituent encoders $N_{turbo}$ times with the switches in the up positions and puncturing the output as specified in Table 15 shown below. Within a puncturing pattern, a '0' means that the bit shall be deleted and a '1' means that the bit shall be passed. The constituent encoder outputs for each bit period shall be passed in the sequence X, $Y_0$, $Y_1$, X', $Y'_0$, $Y'_1$ with the X output first. Bit repetition is not used in generating the encoded data output symbols.

The constituent encoder output symbol puncturing for the tail period shall be as specified in Table 16 shown below. Within a puncturing pattern, a '0' means that the symbol shall be deleted and a '1' means that a symbol shall be passed.

For rate ½ turbo codes, the tail output code bits for each of the first three tail bit periods shall be $XY_0$, and the tail output code bits for each of the last three tail bit periods shall be $X'Y'_0$.

For rate ⅓ turbo codes, the tail output code bits for each of the first three tail bit periods shall be $XXY_0$, and the tail output code bits for each of the last three tail bit periods shall be $XX'Y'_0$.

For rate ⅔ turbo codes, the tail output code bits for the first three tail bit periods shall be $XY_0$, X and $XY_0$ respectively. The tail output code bits for the last three tail bit periods shall be X',X'$Y'_0$ and X', respectively.

TABLE 15

Puncturing Patterns for the Data Bit Periods

| | Code Rate | | |
| --- | --- | --- | --- |
| Output | ½ | ⅓ | ⅔ |
| X | 11 | 11 | 1111 |
| $Y_0$ | 10 | 11 | 1000 |
| $Y_1$ | 00 | 00 | 0000 |
| X' | 00 | 00 | 0000 |
| $Y'_0$ | 01 | 11 | 0001 |
| $Y'_1$ | 00 | 00 | 0000 |

It is noted that in Table 15 above, the puncturing table is to be read from top to bottom.

TABLE 16

Puncturing Patterns for the Tail Bit Periods

| | Code Rate | | |
| --- | --- | --- | --- |
| Output | ½ | ⅓ | ⅔ |
| X | 111 000 | 111 000 | 111 000 |
| $Y_0$ | 111 000 | 111 000 | 101 000 |
| $Y_1$ | 000 000 | 000 000 | 000 000 |
| X' | 000 111 | 000 111 | 000 111 |
| $Y'_0$ | 000 111 | 000 111 | 000 010 |
| $Y'_1$ | 000 000 | 000 000 | 000 000 |

It is noted concerning Table 16 above, for rate-½ turbo codes, the puncturing table is to be read first from top to bottom and then from left to right. For Rate ⅓ turbo code, the puncturing table is to be read from top to bottom repeating X and X', and then from left to right. For rate-⅔ turbo codes, the puncturing table is to be read first from top to bottom and then from left to right.

Turbo Interleaver

The turbo interleaver for the Wide-area Data Channel shall be as specified herein.

Bit Interleaving

The Wide-area Data Channel turbo encoded packets shall be bit interleaved as specified herein.

Data Slot Allocation

For the Wide-area Data Channel, up to 7 data slots may be allocated per OFDM symbol for the transmission of multiple turbo encoded packets associated with one or more MLCs. For certain modes (2, 4, 8 and 11, see Table 5 above) a turbo encoded packet occupies a fraction of a slot. However, slots are allocated to MCLs in a manner that avoids multiple MLCs sharing slots within the same OFDM symbol.

Filling of Data Slot Buffers

Figure 28:
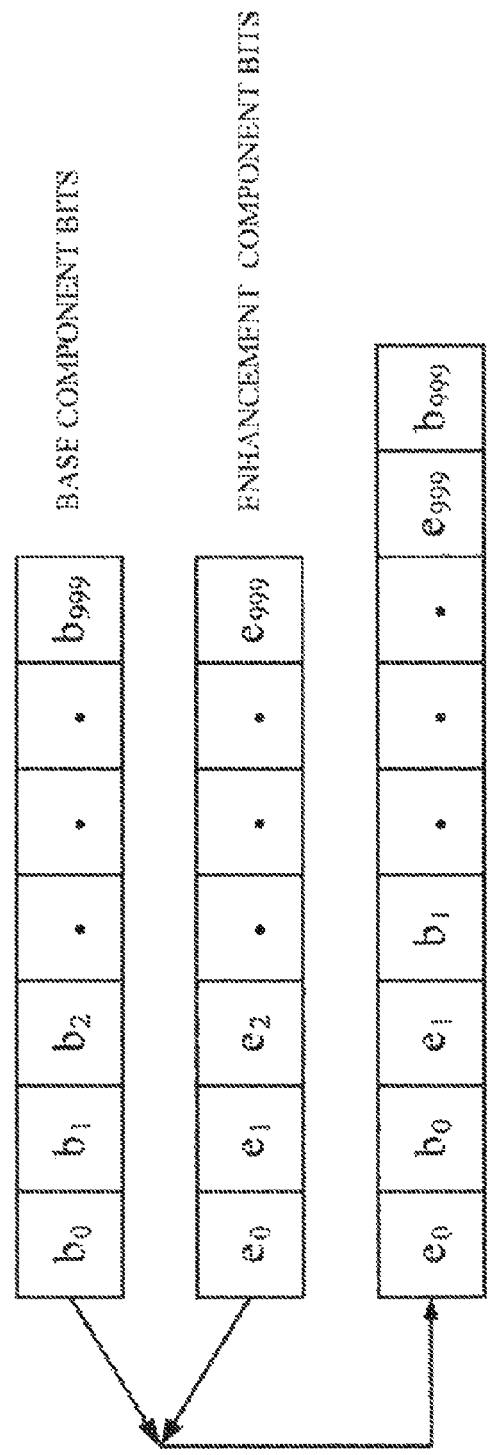
FIG. 28 shows an exemplary interleaving of Base and Enhancement component bits for filling a Slot Buffer for Layered Modulation

The bit-interleaved code bits of a Wide-area Data Channel turbo encoded packet shall be written into one or more data slot buffers. These data slot buffers correspond to slot indices 1 through 7. The data slot buffer size shall be 1000 bits for QPSK and 2000 bits for 16-QAM and layered modulation. For QPSK and 16-QAM modulation, the bit-interleaved code bits shall be sequentially written into the slot buffer(s). For layered modulation, the bit-interleaved code bits corresponding to the base the enhancement components shall be interleaved as illustrated in FIG. 28, prior to filling the slot buffer(s).

Figure 29:
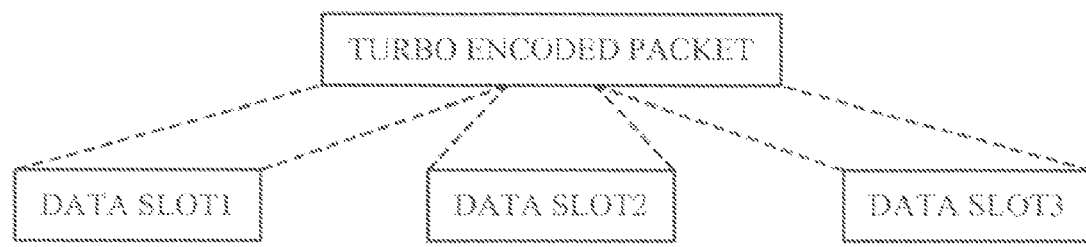
FIG. 29 shows a data channel Turbo Encoded Packet occupying three Data Slot Buffers

FIG. 29 illustrates the case where a single turbo encoded packet spans three data slot buffers.

Figure 30:
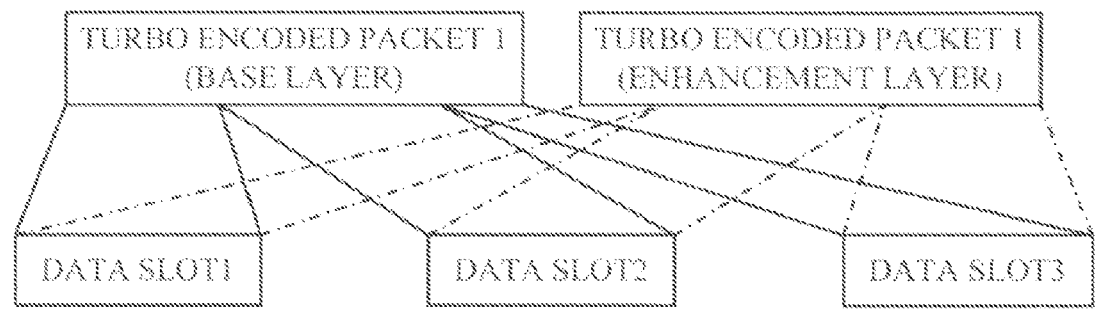
FIG. 30 shows an example of multiplexing of Base and Enhancement Component Turbo Encoded packets occupying three Data Slot Buffers

FIG. 30 illustrates the case where a base component turbo encoded packet with code rate ⅓ is multiplexed with an enhancement component turbo packet (with the same code rate) to occupy 3 data slot buffers.

Figure 31:
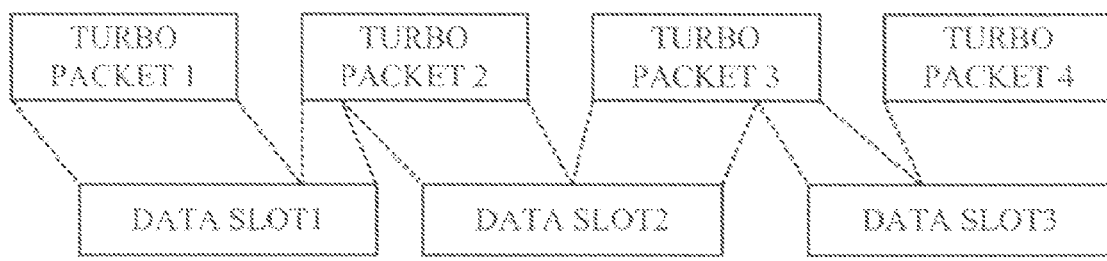
FIG. 31 shows an example of a Data Channel Turbo Encoded Packet Occupying 3 Data Slot Buffers.

FIG. 31 illustrates the case where a Data Channel turbo encoded packet occupies a fraction of a data slot and four turbo encoded packets are required to fill up an integer number of data slots.

The three slots in the FIG. 31 may span one OFDM symbol or multiple consecutive OFDM symbols. In either case, the data slot allocation over an OFDM symbol for an MLC shall have consecutive slot indices.

Figure 32:
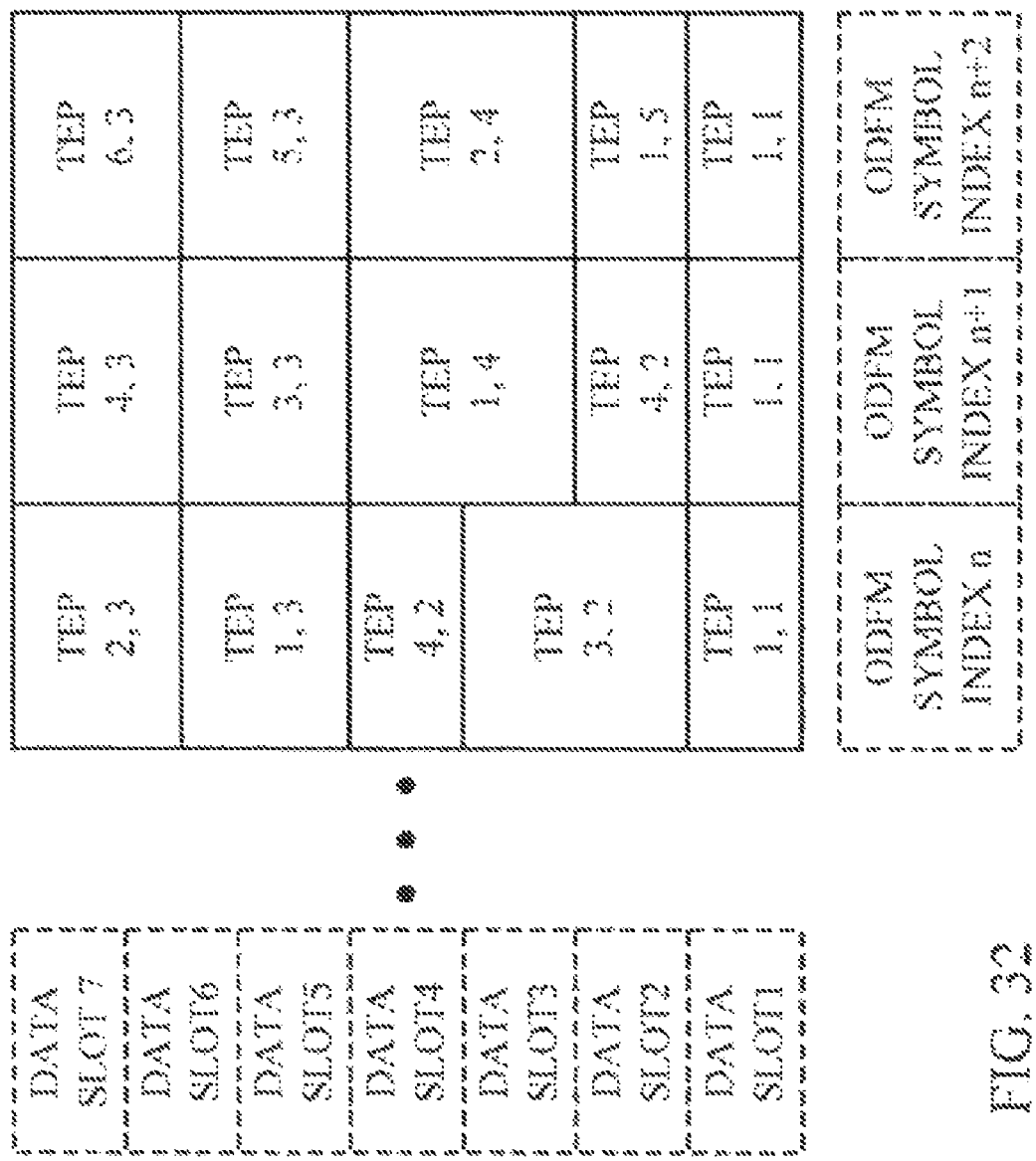
FIG. 32 shows and example of a slow allocation to multiple MLCs over 3 consecutive OFDM symbols in a frame

FIG. 32 illustrates a snapshot of slot allocations to five different MLCs over three consecutive OFDM symbols in a frame. In the figure, TEP n,m denotes $n^{th}$ turbo encoded packet for the $m^{th}$ MLC. In that figure:
  a. MLC 1 uses transmit mode 0 and requires three slots for each turbo encoded packet. It uses 3 consecutive OFDM symbols to send on turbo encoded packet.
  b. MLC 2 uses transmit mode 1 and utilizes 2 slots to transmit a single turbo encoded packet. It uses OFDM symbols n and n+1, to send two turbo encoded packets.
  c. MLC 3 uses transmit mode 2 and requires 1.5 slots for transmitting one turbo encoded packet. It uses three consecutive OFDM symbols to transmit 6 turbo encoded packets.
  d. MLC 4 uses transmit mode 1 and requires 2 slots to transmit a single turbo encoded packet. It uses 2 consecutive OFDM symbols to send two turbo encoded packets.
  e. MLC 5 uses transmit mode 3 and requires 1 slot to transmit a turbo encoded packet. It uses one OFDM symbol to send a turbo encoded packet.

Slot Scrambling

The bits of each allocated slot buffer shall be scrambled as specified in 0. The scrambled slot buffer is denoted by SB.

Mapping of Bits to Modulation Symbols

For the Wide-area Data Channel, depending on the transmit mode, either QPSK, 16-QAM or Layered Modulation may be used.

QPSK Modulation

Each group of two consecutive bits from the $i^{th}$ scrambled slot buffer, SB(i,2k) and SB(i,2k+1), i=1,2 . . . 7, k=0,1, . . . 499, which are labeled as $s_0$ and $s_1$, respectively, shall be mapped into a complex modulation symbol MS=(mI, mQ) as specified in Table 6 with D=1/$\sqrt{2}$. FIG. 13 shows the signal constellation for the QPSK modulation.

16-QAM Modulation

Figure 33:
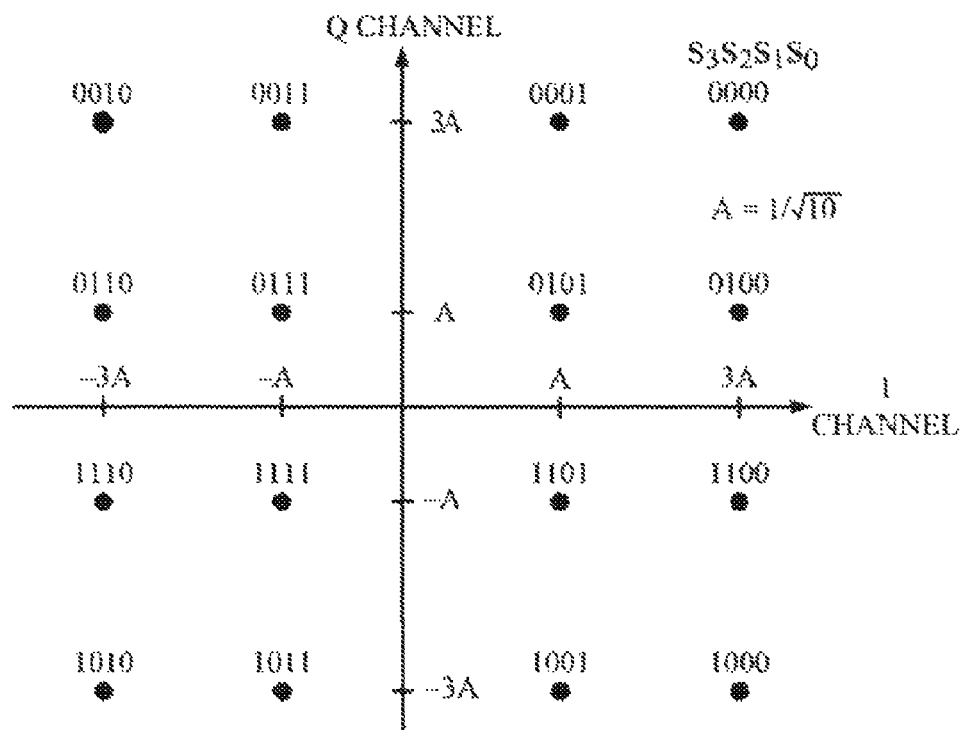
FIG. 33 shows an exemplary signal constellation for 16-QAM Modulation

Each group of four consecutive bits from the $i^{th}$ scrambled data slot buffer, SB(i,4k), SB(i,4k+1), SB(i, 4k+2), and SB(i, 4k+3), i=1,2, . . . 7, k=0,1, . . . 499 shall be grouped and mapped to a 16-QAM complex modulation symbol S(s)=(mI(k), mQ(k)), k=0,1, . . . 499 as specified in Table 17 below with A=1/$\sqrt{10}$. FIG. 33 shows the signal constellation of the 16-QAM modulator, where s0=SB(i,4k), S1=SB(i,4k+1), s2=SB(i,4k+2), and s3=SB(i,4k+3).

TABLE 17

16-QAM Modulation Table

| Interleaved Bits | | | | Modulation Symbols | |
|---|---|---|---|---|---|
| $s_3$ | $s_2$ | $s_1$ | $s_0$ | | |
| SB(i, 4k + 3) | SB(i, 4k + 2) | SB(i, 4k + 1) | SB(i, 4k) | $m_Q(k)$ | $m_I(K)$ |
| 0 | 0 | 0 | 0 | 3A | 3A |
| 0 | 0 | 0 | 1 | 3A | A |
| 0 | 0 | 1 | 1 | 3A | −A |

TABLE 17-continued

16-QAM Modulation Table

| Interleaved Bits | | | | Modulation Symbols | |
|---|---|---|---|---|---|
| $s_3$ | $s_2$ | $s_1$ | $s_0$ | | |
| SB(i, 4k + 3) | SB(i, 4k + 2) | SB(i, 4k + 1) | SB(i, 4k) | $m_Q(k)$ | $m_I(K)$ |
| 0 | 0 | 1 | 0 | 3A | −3A |
| 0 | 1 | 0 | 0 | A | 3A |
| 0 | 1 | 0 | 1 | A | A |
| 0 | 1 | 1 | 1 | A | −A |
| 0 | 1 | 1 | 0 | A | −3A |
| 1 | 1 | 0 | 0 | −A | 3A |
| 1 | 1 | 0 | 1 | −A | A |
| 1 | 1 | 1 | 1 | −A | −A |
| 1 | 1 | 1 | 0 | −A | −3A |
| 1 | 0 | 0 | 0 | −3A | 3A |
| 1 | 0 | 0 | 1 | −3A | A |
| 1 | 0 | 1 | 1 | −3A | −A |
| 1 | 0 | 1 | 0 | −3A | −3A |

Layered Modulation with Base and Enhancement Components

Each group of four consecutive bits from the $i^{th}$ scrambled data slot buffer, SB(i,4k), SB(i,4k+1), SB(i,4k+2), and SB(i, 4k+3), i=1,2, . . . 7, k=0,1, . . . 499 shall be grouped and mapped to a layered modulation complex symbol S(k)=(mI(k), mQ(k)), k=0,1, . . . 499 as specified in Table 18 below. If r denotes the energy ratio between the base component and the enhancement component, then α and β shall be given by $$\alpha = \sqrt{\frac{r}{2(1+r)}} \text{ and } \beta = \sqrt{\frac{1}{2(1+r)}}$$

Figure 34:
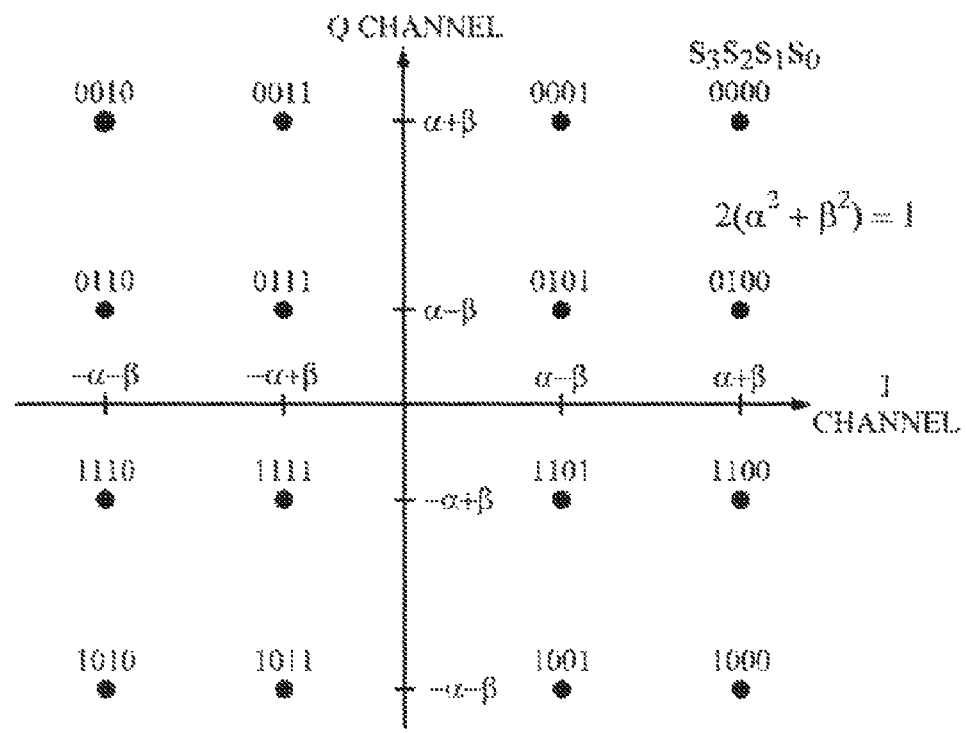
FIG. 34 shows an exemplary signal constellation for Layered Modulation

FIG. 34 shows the signal constellation for the layered modulation, where s0=SB(i,4k), s1=SB(i,4k+1), s2=SB(i,4k+2), and s3=SB(i,4k+3). It should be noted that the procedure for filling the slot buffer(s) ensures (see FIG. 29) that bits $s_0$ and $s_2$ correspond to the enhancement component and bits $s_1$ and $s_3$ correspond to the base component.

TABLE 18

Layered Modulation Table

| Interleaved Bits | | | | Modulation Symbols | |
|---|---|---|---|---|---|
| $s_3$ | $s_2$ | $s_1$ | $s_0$ | | |
| SB(i, 4k + 3) | SB(i, 4k + 2) | SB(i, 4k + 1) | SB(i, 4k) | $m_Q(k)$ | $m_I(k)$ |
| 0 | 0 | 0 | 0 | α + β | α + β |
| 0 | 0 | 0 | 1 | α + β | α − β |
| 0 | 0 | 1 | 1 | α + β | −α + β |
| 0 | 0 | 1 | 0 | α + β | −α − β |
| 0 | 1 | 0 | 0 | α − β | α + β |
| 0 | 1 | 0 | 1 | α − β | α − β |
| 0 | 1 | 1 | 1 | α − β | −α + β |
| 0 | 1 | 1 | 0 | α − β | −α − β |
| 1 | 1 | 0 | 0 | −α + β | α + β |
| 1 | 1 | 0 | 1 | −α + β | α − β |
| 1 | 1 | 1 | 1 | −α + β | −α + β |
| 1 | 1 | 1 | 0 | −α + β | −α − β |
| 1 | 0 | 0 | 0 | −α − β | α + β |
| 1 | 0 | 0 | 1 | −α − β | α − β |
| 1 | 0 | 1 | 1 | −α − β | −α + β |
| 1 | 0 | 1 | 0 | −α − β | −α − β |

Note that $$\alpha = \sqrt{\frac{r}{2(1+r)}}, \beta = \sqrt{\frac{1}{2(1+r)}}$$

the above Table 18, where r is the ratio of the base component energy to the enhancement component energy Layered Modulation with Base Component Only The $2^{nd}$ and $4^{th}$ bits from each group of four consecutive bits from the $i^{th}$ scrambled slot buffer, SB(i, 4k+1) and SB(i, 4k+3), i=1,2, . . . 7, k=0,1, . . . 499, which are labeled as $s_0$ and $s_1$, respectively, shall be mapped into a complex modulation symbol MS=(mI, mQ) as specified in Table 6 with D=1/$\sqrt{2}$. FIG. 13 shows the signal constellation for the QPSK modulation.

Slot to Interlace Mapping

The mapping of slots to interlaces for the Wide-area Data Channel OFDM symbols shall be as specified herein.

Mapping of Slot Buffer Modulation Symbols to Interlace Sub-Carriers

The 500 modulation symbols in each allocated slot shall be sequentially assigned to 500 interlace sub-carriers using the procedure specified herein.

OFDM Common Operation

The modulated Wide-area Data Channel sub-carriers shall undergo common operation specified herein.

Wide-Area Data Channel Processing for Unallocated Slots

The unallocated slots in the Wide-area Data Channel use as input a 1000-bit fixed pattern, with each bit set to zero. These bits shall be processed according to the steps illustrated in FIG. 14.

Filling of Slot Buffer

The buffer for each unallocated slot of the Wide-area Data Channel shall be completely filled with a fixed pattern consisting of 1000 bits, with each bit set to '0'.

Slot Scrambling

The bits of each unallocated slot buffer in the Wide-area Data Channel shall be scrambled as specified in 0. The scrambled slot buffer is denoted by SB.

Modulation Symbol Mapping

Each group of two consecutive bits from the $i^{th}$ scrambled slot buffer, SB(i,2k) and SB(i,2k+1), i=1,2, . . . 7, k=0,1, . . . 499, which are labeled as $s_0$ and $s_1$, respectively, shall be mapped into a complex modulation symbol MS=(mI, mQ) as specified in Table 6 with D=1/$\sqrt{2}$. FIG. 13 shows the signal constellation for the QPSK modulation.

Slot to Interlace Mapping

The mapping of slots to interlaces for the unallocated slots in the Wide-area Data Channel OFDM symbol shall be as specified in 0

Mapping of Slot Buffer Modulation Symbols to Interlace Sub-carriers

The 500 modulation symbols in the slot buffer shall be sequentially assigned to 500 interlace sub-carriers as follows: the $i^{th}$ complex modulation symbol (where i ∈{0,1, . . . 499}) shall be mapped to the $i^{th}$ sub-carrier of that interlace.

OFDM Common Operation

The modulated Wide-area Data Channel OFDM symbol sub-carriers shall undergo common operations as specified herein.

Local-Area Data Channel

The Local-area Data Channel is used to carry Physical layer packets meant for Local-area multicast. The Physical layer packets for the Local-area Data Channel can be associated with any one of the active MLCs transmitted in the Local-area.

Local-Area Data Channel Processing for Allocated Slots

The Physical layer packet for the Local-area Data Channel shall be processed according to the steps illustrated in FIG. 26.

For regular modulation (QPSK and 16-QAM), the physical layer packet is turbo-encoded and bit interleaved before being stored in the Data slot buffer(s). For layered modulation, the base-component Physical layer packet and the enhancement-component Physical layer packet are turbo-encoded and bit interleaved independently before being multiplexed in to the Data slot buffer(s).

Encoding

The Local-area Data Channel Physical layer packets shall be encoded with code rates R=⅓, ½, or ⅔. The encoding procedure shall be identical to that for the Wide-area Data Channel as specified herein.

Bit Interleaving

The Local-area Data Channel turbo encoded packet shall be bit interleaved as specified herein.

Data Slot Allocation

For the Local-area Data Channel, the slot allocation shall be as specified herein Filling of Data Slot Buffers The procedure for filling the slot buffer for the Local-area Data Channel shall be as specified herein.

Slot Scrambling

The bits of each allocated slot buffer shall be scrambled as specified herein. The scrambled slot buffer is denoted by SB.

Mapping of Slot Bits to Modulation Symbols

For the Local-area Data Channel, depending on the transmit mode QPSK, 16-QAM or Layered Modulation may be used.

QPSK Modulation

Each group of two consecutive bits from the scrambled slot buffer shall be mapped in to a QPSK modulation symbol as specified herein.

16-QAM Modulation

Each group of four consecutive bits from the scrambled slot buffer shall be mapped in to a 16-QAM modulation symbol as specified herein Layered Modulation with Base and Enhancement Components Each group of four consecutive bits from the scrambled slot buffer shall be mapped in to a layered modulation symbol as specified herein.

Layered Modulation with Base Component Only

The $2^{nd}$ and $4^{th}$ bits from each group of four consecutive bits from the scrambled slot buffer shall be mapped into a QPSK modulation symbol as specified herein.

Slot to Interlace Mapping

The mapping of slots to interlaces for Local-area Data Channel OFDM symbols shall be as specified herein.

Mapping of Slot Modulation Symbols to Interlace Sub-Carriers

The 500 modulation symbols in each allocated slot shall be sequentially assigned to 500 interlace sub-carriers using the procedure specified herein.

OFDM Common Operation

The modulated Wide-area Data Channel sub-carriers shall undergo common operations as specified herein.

Local-Area Data Channel Processing for Unallocated Slots

The unallocated slots in the Local-area Data Channel use as input a 1000-bit fixed pattern, with each bit set to zero. These bits shall be processed according to the steps illustrated in FIG. 14.

Filling of Slot Buffers

The buffer for each unallocated slot of the Local-area Data Channel shall be completely filled with a fixed pattern consisting of 1000 bits, with each bit set to '0'.

Slot Scrambling

The bits of each unallocated slot buffer in the Wide-area Data Channel shall be scrambled as specified in 0. The scrambled slot buffer is denoted by SB.

Modulation Symbol Mapping

Each group of two consecutive bits from the scrambled slot buffer shall be mapped in to a QPSK modulation symbol as specified herein.

Slot to Interlace Mapping

The mapping of slots to interlaces for the unallocated slots in the Local-area Data Channel OFDM symbol shall be as specified herein.

Mapping of Slot Buffer Modulation Symbols to Interlace Sub-Carriers

The 500 modulation symbols in the slot buffer shall be sequentially assigned to 500 interlace sub-carriers as follows: the $i^{th}$ complex modulation symbol (where $i \in \{0,1, \ldots 499\}$) shall be mapped to the $i^{th}$ sub-carrier of that interlace.

OFDM Common Operation

This modulated Local-area Data Channel OFDM symbol sub-carriers shall undergo common operations as specified herein.

Mapping of Slots to Interlaces

The slot to interlace mapping varies from one OFDM symbol to the next as specified in this section. There are 8 slots in every OFDM symbol. The FDM Pilot Channel shall utilize slot 0. Slot 0 shall be assigned interlace $I_p[j]$ for OFDM symbol index j in a superframe as follows:

if (j mod 2=0), then $I_p[j]$=2.

Otherwise, $I_p[j]$=6

Figure 35:
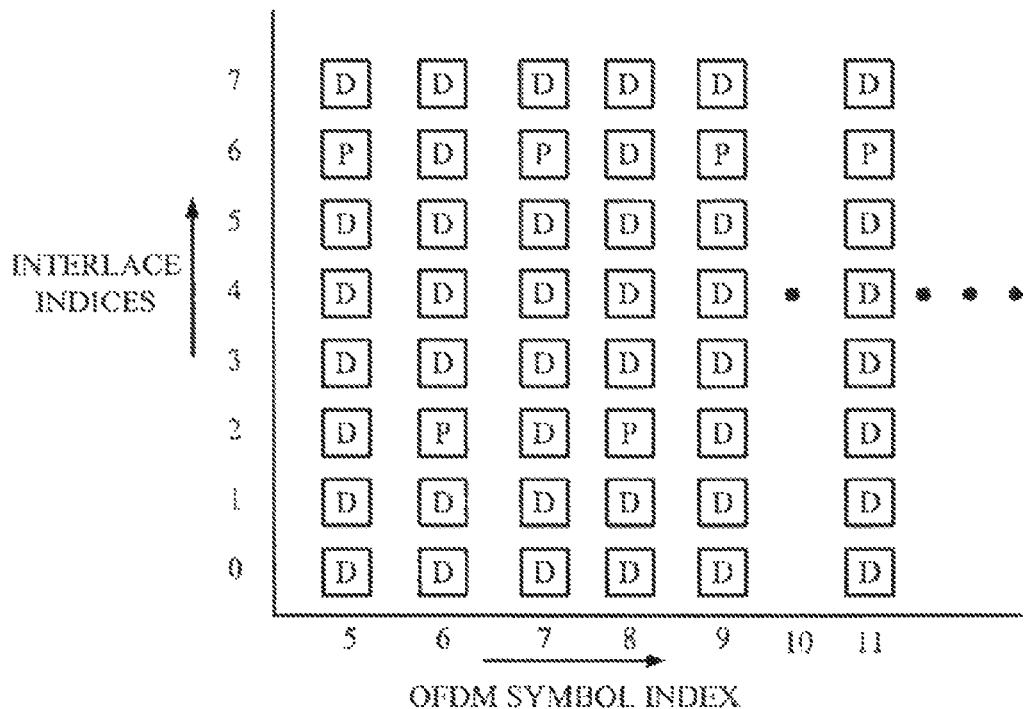
FIG. 35 shows a diagram of interlaced allocations to FDM Pilots.

The interlace assignment procedure for slot 0 ensures that the FDM Pilot Channel is assigned interlace 2 and 6 for even and odd OFDM symbol indices respectively. The remaining 7 interlaces in each OFDM symbol are assigned to slots 1 through 7. This is illustrated in FIG. 35, where P and D denote the interlaces assigned to the slots occupied by the FDM Pilot Channel and the Data Channel, respectively.

The slot to interlace mapping for slots 1 through 7 shall be as follows:

a. Let i be the 3-bit value of the interlace index i ($i \in \{0,7\}$). Denote the bit-reversed value of i as $i_{br}$.

b. Let $I_j$ denote the $j^{th}$ interlace as defined earlier herein. Permute the interlace sequence $\{I_0 \ I_1 \ I_2 I_3 \ I_4 I_5 \ I_6 \ I_7\}$ by replacing the index i ($i \in \{0,7\}$) in I, with $i_{br}$ to generate the permuted sequence, PS=$\{I_0 \ I_4 \ I_2 \ I_6 \ I_1 \ I_5 \ I_3 \ I_7\}$.

c. Club interlaces $I_2$ and $I_6$ in the PS to generate shortened interlace sequence, SIS=$\{I_0 I_4 I_2/I_6 I_1 I_5 I_3 I_7\}$.

d. For the OFDM symbol with index j ($j \in \{1,1199\}$) in a superframe, perform a right hand cyclic shift on SIS in Step 3, by a value equal to ($2 \times j$) mod 7 to generate the permuted shortened interlace sequence PSIS(j).

e. If (j mod 2=0), then choose interlace $I_6$ in the PSIS(j). Otherwise, choose $I_2$ in the PSIS[j].

f. For the $j^{th}$ OFDM symbol interval in a superframe, the $k^{th}$ data slot (for $k \in \{1, \ldots 7\}$) shall be assigned the interlace PSIS(j)[k−1].

It is noted for step c above, since interlaces 2 and interlace 6 are used alternatively for the pilot, the remaining seven interlaces are used for assignment to data slots. Additionally, it is noted that a super-frame spans 1200 OFDM symbol intervals and that slot to interlace mapping for OFDM symbol index 0 is not used. Furthermore, for step d above it is noted that the right hand cyclic shift of the sequences s=$\{1\ 2\ 3\ 4\ 5\}$ by 2 yields the sequence s(2)=$\{4\ 5\ 1\ 2\ 3\}$.

Figure 36:
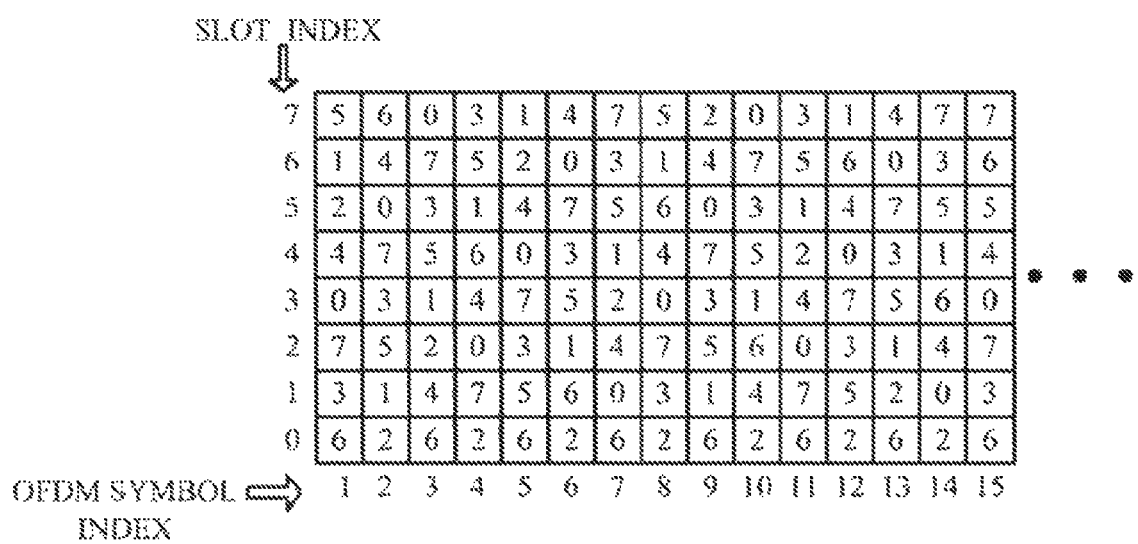
FIG. 36 shows a diagram of interlaced allocations to slots
Figure 37:
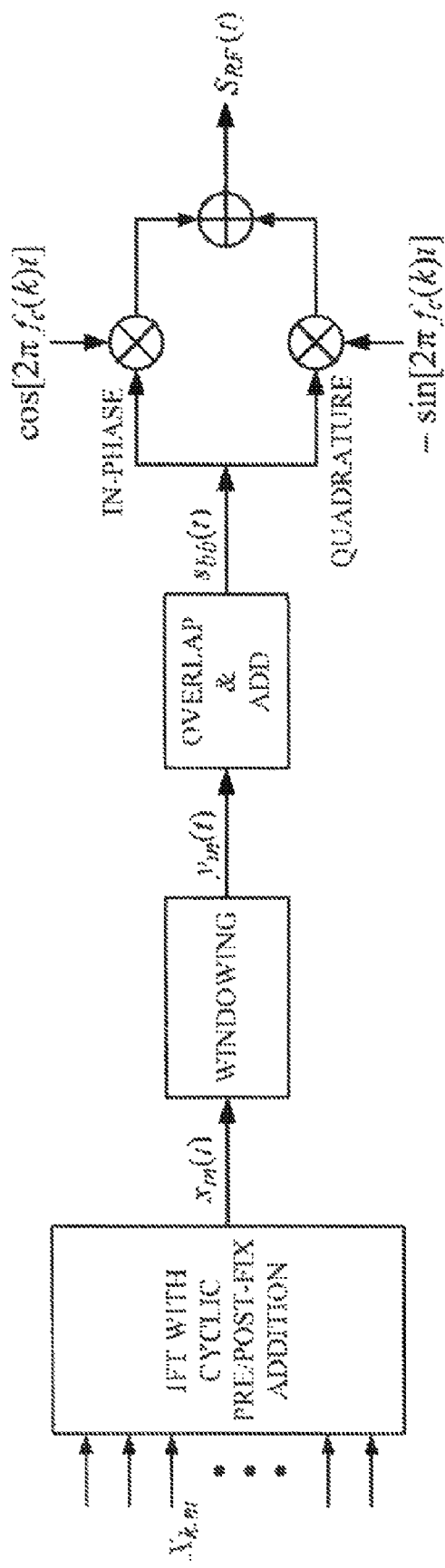
FIG. 37 shows a block diagram of an exemplary OFDM common operation.

FIG. 36 Illustrates the interlace assignment to all 8 slots over 15 consecutive OFDM symbol intervals. The mapping pattern from slots to interlaces repeats after 14 consecutive OFDM symbol intervals. FIG. 36 shows that all interlaces get assigned next to the Pilot Interlace about the same fraction of time, and the channel estimation performance for all interlaces is about the same OFDM Common Operation This block transforms the complex modulation symbols $X_{k,m}$, associated with sub-carrier index k for OFDM symbol interval m, into the RF transmitted signal. The operations are illustrated in FIG. 37.

IFT Operation

The complex modulation symbols $X_{k,m}$, k=0,1, . . . , 4095, associated with the $m^{th}$ OFDM symbol shall be related to the continuous-time signal $x_m(t)$ by the inverse Fourier Transform (IFT) equation. Specifically, $$x_m(t) = \frac{1}{N}\sum_{k=0}^{N-1} X_{k,m} e^{j2\pi t \Delta f\left(k-\frac{N}{2}\right)(t-T_{WGI}-T_{FGI})}, \text{ for } 0 \le t \le T_g$$

In the above equation, $(\Delta f)_{sc}$ is the sub-carrier spacing, while $T_{WGI}$, $T_{FGI}$ and $T_s$ are defined as was discussed previously in this application Windowing The signal $x_m(t)$ shall be multiplied by the window function w(t), where $$w(t) = \begin{cases} 0.5 + 0.5\cos(\pi + \pi t/T_{WGI}) & 0 \le t \le T_{WGI} \\ 1 & T_{WGI} < t < (T_{WGI}+T_{FGI}+T_U) \\ 0.5 + 0.5\cos(\pi + \pi(T_g - t)/T_{WGI}) & (T_{WGI}+T_{FGI}+T_U) \le t \le (2T_{WGI}+T_{FGI}+T_U) \end{cases}$$

The windowed signal is denoted by $y_m(t)$, where $$y_m(t) = x_m(t)w(t).$$

In the above $T_0$ and $T_s$ are as defined previously herein.

Overlap and Add

Figure 38:
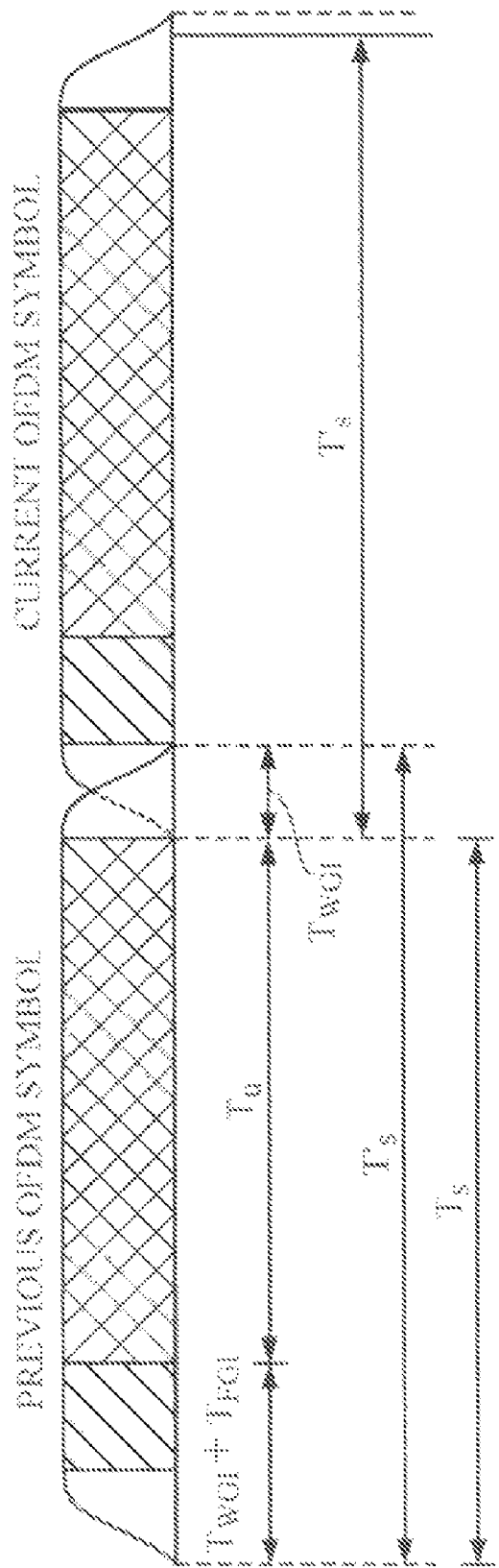
FIG. 38 shows a diagram illustrating an overlap of windowed OFDM Symbols according to an example.

The base-band signal $s_{BB}(t)$ shall be generated by overlapping the windowed, continuous-time signals from successive OFDM symbols by $T_{WGI}$. This is illustrated in FIG. 38. Specifically, $s_{BB}(t)$ is given by:

$$S_{BB}(t) = \sum_{m=-\infty}^{\infty} y_m(t - mT_g).$$

Carrier Modulation

The in-phase and quadrature base-band signals shall be up-converted to RF frequency and summed to generate the RF waveform $s_{RF}(t)$. In FIG. 37, $f_c(k)$ is the centre frequency of the $k^{th}$ FLO RF channel (see Table 1).

Alternative Timing and Frequency Acquisition Pilot Symbol (TDM1)

In another example, it is noted that the superframe structure of FIG. 10 and, in particular, the pilot channel TDM1 may be modified to differently optimize processing of the superframe.

Figure 39:
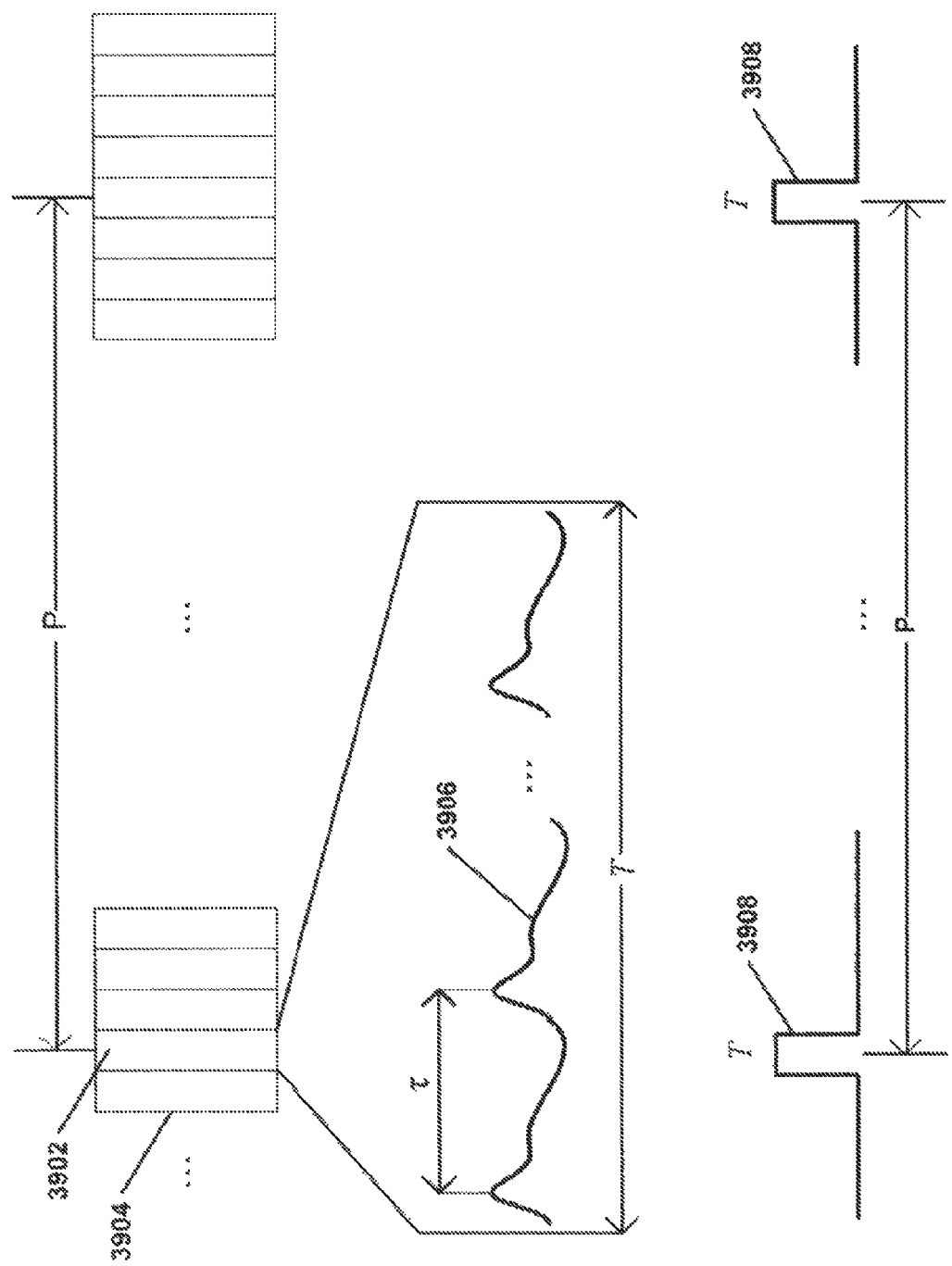
FIG. 39 illustrates a pilot Acquisition symbol utilized within a superframe 39, where the symbol includes a sequence of periodic waveforms in time domain.

It is noted that, as discussed previously in connection with the examples of FIGS. 10-18, the superframe includes a special pilot OFDM symbol (e.g., and "Acquisition Symbol" or TDM1 Pilot symbol) that is used for initial or coarse timing acquisition, frame boundary demarcation, and acquisition of the carrier frequency offset similar to the examples previously described herein. By way of background it is noted that in most OFDM communication systems this special pilot OFDM symbol (i.e., the Acquisition Symbol or TDM Pilot 1 channel) has a prescribed duration T that is transmitted periodically with prescribed period P. In such cases, the special pilot 3902 (e.g., the Acquisition Symbol or TDM Pilot 1) within a frame or superframe 3904 includes a sequence of periodic waveforms 3906 in time domain with a period x, as illustrated in FIG. 39. A delayed correlator at the receiver end is then typically configured with a delay equal to the period x to detect this periodicity. An output of such a correlator will ideally consist of a series of rectangular pulses 3908 that each correspond with each sequence of waveforms 3906 as further shown in FIG. 39 with a periodicity of P. In order to find the boundary of the TDM1 pilot, the detection of the rectangular edge is needed which can be difficult in the presence of noise. Moreover, the delayed correlation requires multiplication of two noisy data samples, and therefore suffers from high noise variance. Thus, poor accuracy of timing and frequency offset estimation is unavoidable as a consequence. In addition, delayed correlation calculations are highly complex.

Moreover, because a receiver is looking for periodic waveforms in the received signal, such schemes are inherently vulnerable to periodic interferences such as tone jammer or any periodic waveform pattern present in the received signal. Although there are remedies to reducing periodic interference effect, often such remedies come with considerable additional complexity.

Instead of using a periodic waveform for the Acquisition or TDM1 Symbol such as that illustrated in FIG. 39, the presently disclosed example utilizes an Acquisition Symbol or TDM1 Pilot that is configured as a time domain QPSK symbol sequence $\{q[i], i=0,1,\ldots,N-1\}$, where the sequence is modulated by a pseudo-random noise (PN) sequence denoted by p[n]. According to an example, the PN sequence has a period L that is greater than or equal to 2N, where N is the OFDM symbol length (or Fast Fourier Transform (FFT) size). This period length ensures that the PN sequence is long enough to avoid repeating the PN sequence during an OFDM symbol of length N, since multiple repetitions of a PN sequence, which result in multiple repetitions of a same waveform in one Acquisition Symbol, may cause timing ambiguity at the receiver. Also, one period of PN sequence allows receivers to have the flexibility of despreading only one portion of the Acquisition Symbol for Automatic Gain Control (AGC) convergence, noise baseline estimation for adaptive thresholding and control of delay.

Additionally, the modulated time domain OFDM or Acquisition Symbol is converted to frequency domain through a fast Fourier transform (FFT). When the time domain OFDM symbol resultant from the modulation of time domain QPSK sequence by PN sequence p[n] is FFT transformed to frequency domain, a spectrum mask is the applied. Application of a spectrum mask ensures that the Acquisition Symbol waveform meets spectrum shape requirements. In the simplest case, as an example, a rectangular spectrum mask can be used, i.e., tones are zeroed out in guard tone areas just like a regular OFDM symbol. The resultant OFDM symbol is then inverse fast Fourier transformed (IFFT) back to time domain.

Figure 40:
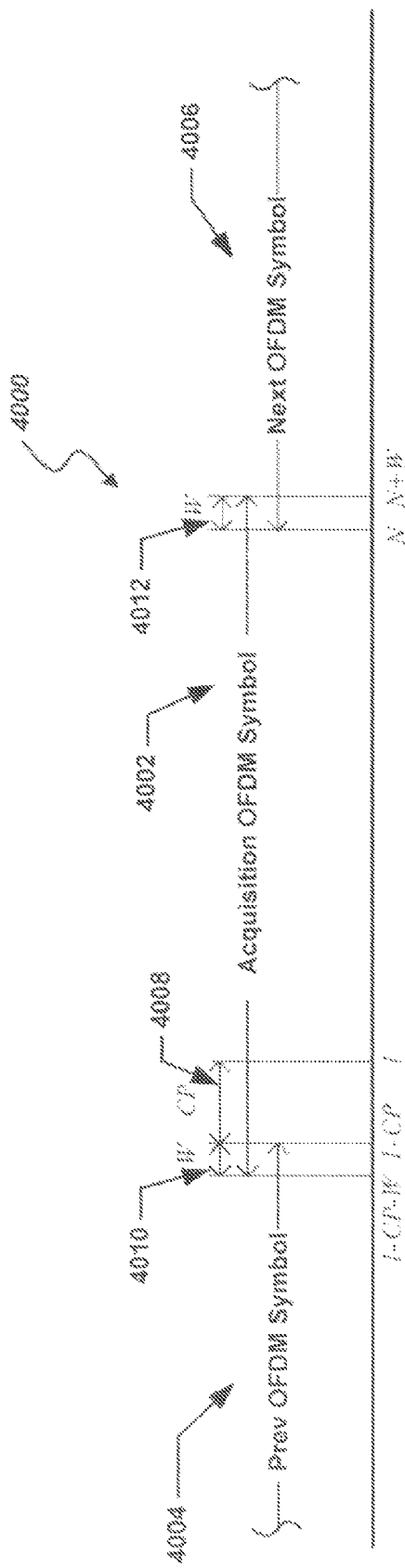
FIG. 40 shows an exemplary construct of a superframe including an Acquisition OFDM symbol

In constructing a frame or superframe is noted that the OFDM symbol length N of the Acquisition symbol is further appended with a cyclic prefix (CP) and two window guard intervals (W) preceding and succeeding the OFDM Acquisition symbol, just as a regular OFDM symbol. As an example, FIG. 40 provides an illustration of an exemplary construct of a frame which may include the exemplary Acquisition OFDM symbol. As shown, an illustrated portion 4000 of a frame shows three OFDM symbols; the Acquisition symbol 4002, an OFDM symbol 4004 preceding or previous to symbol 4002, and a next or succeeding OFDM symbol 4006.

The time domain OFDM Acquisition symbol 4002 is cyclic prefixed (CP), as shown by cyclic prefix 4008. The symbol 4002 is also windowed at the beginning and ends of the symbol as shown by windows (W) 4010 and 4012. Symbol 4002 overlaps adjacent symbols 4004 and 4006 within windows 4010 and 4012, respectively, as illustrated. The symbol 4002 is thus transmitted as a regular OFDM symbol within a frame or superframe.

It is noted that it is possible to use an number (denoted by C) of unique PN sequences (i.e., subsequences) with each unique sequence representing one system configuration (i.e., each unique sequence communicating information about the system, such as system FFT size, etc.), which can be used for system determination. One example of how to generate C number of unique PN sequences is to find a $$1 + \left\lfloor \log_2 \sum_{c=0}^{C-1} N^{(c)} \right\rfloor$$

bit maximum length PN sequence with a length of at least $$2 \sum_{c=0}^{C-1} N^{(c)},$$

where N is the OFDM symbol length. The aggregate PN sequence is divided into C non-overlapping segments or subsequences each having a length 2N, with each subsequence, $p^{(c)}[n]$, $c=1,2,\ldots,C$, $n=1,2,\ldots,2N$ representing one valid system configuration. In other words, different system configurations are represented with different or respective PN masks.

Figure 41:
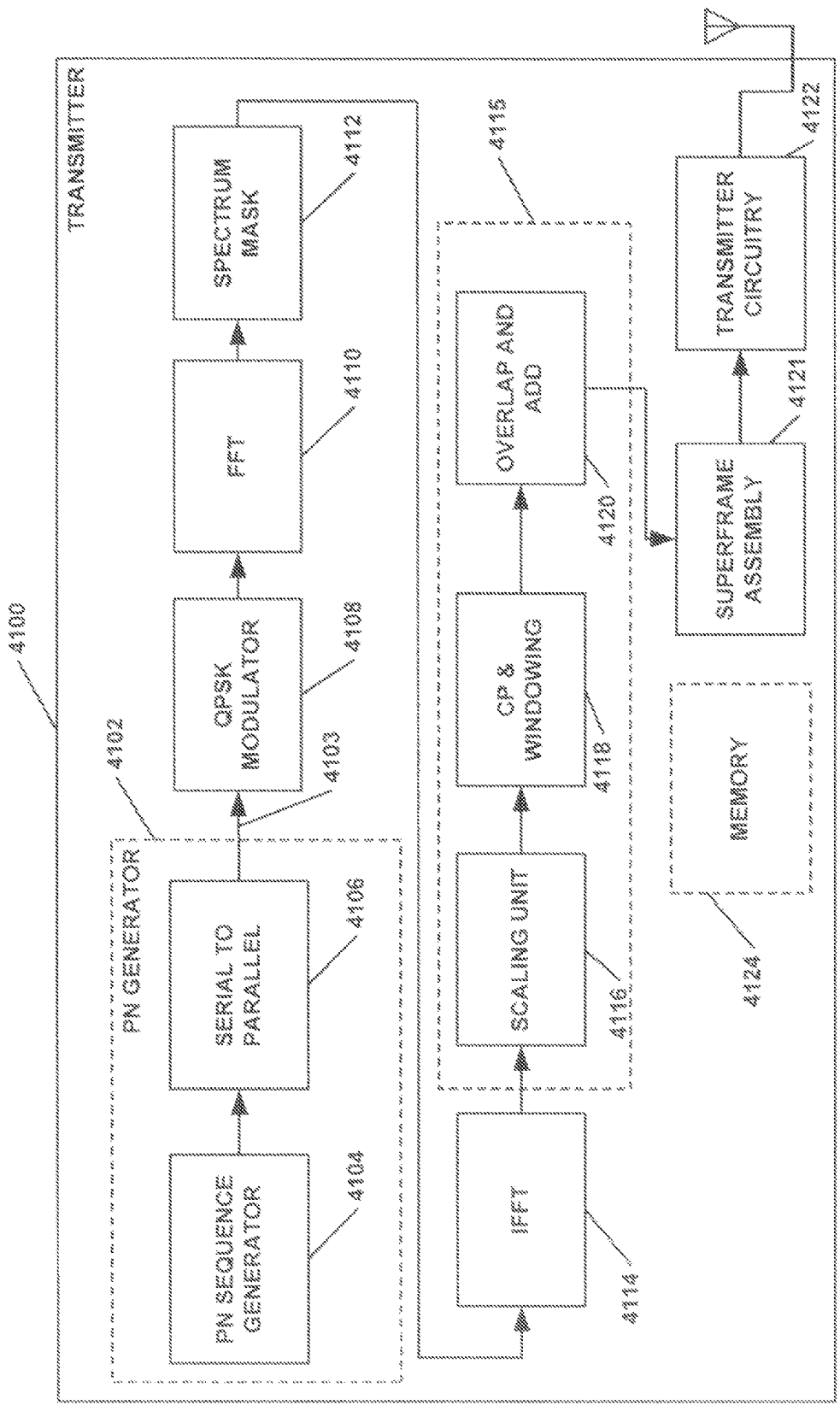
FIG. 41 shows an exemplary transmitter 4100 for constructing and transmitting the frame illustrated in FIG. 40.

An exemplary transmitter (or processor for use in a transmitter) 4100 configured to construct and transmit the frame 4000 of FIG. 40 is illustrated in FIG. 41. Transmitter 4100 includes a PN generator 4102 that generates and outputs the PN sequences 4103 (i.e., one or more sequences, including one sequence of a C number of sequences) used to modulate the time domain QPSK symbol sequence. PN generator 4102 may be implemented with a PN sequence generator 4104, which generates the PN sequences, including the C number of subsequences as detailed previously. Generator 4102 also may include a serial to parallel converter 4106 or equivalent type device that converts the serial bit stream from sequence generator 4102 to two bit symbols, in the case of QPSK modulation. It is noted that for other modulation techniques (e.g., Mary PSK or QAM) the serial to parallel converter may convert the serial bit stream to symbols with 3 or more bits.

Transmitter 4100 further includes a QPSK modulator 4108 that receives the PN sequences 4103 from generator 4102. QPSK modulator 4108 modulates a QPSK symbol sequence (e.g., $\{q[i], i=0,1,\ldots, N-1\}$) with the PN sequences 4103. In one example, the modulator 4108 modulates the symbol sequence with one of the C number of PN subsequences, which correlates to a particular set of system information.

Modulator 4108 outputs the modulated symbol to a fast Fourier transform (FFT) unit 4110, which converts the time domain symbol to a frequency domain symbol. The FFT 4110, in turn, delivers the converted frequency domain symbol to a spectrum mask unit 4112. Spectrum mask unit 4112 applies a spectrum mask to the frequency domain symbol to ensure that the Acquisition Symbol waveform meets spectrum shape requirements, such as FCC requirements, for example. As discussed previously, in the simplest case, a rectangular spectrum mask can be used where tones are zeroed out in guard tone areas just like a regular OFDM symbol.

After application of the spectrum masks by unit 4110, the resultant masked frequency domain OFDM symbol is then inverse fast Fourier transformed (IFFT) back to time domain by IFFT unit 4114. The converted symbol is then input to an assembly unit 4115, which inserts the Acquisition symbol as the TDM1 symbol in a frame of superframe in the manner illustrated by FIG. 40. The unit 4115 includes a scaling unit 4116 to scale the symbol appropriately for the length N available in the frame. Unit 4115 further includes a cyclic prefixing (CP) and windowing unit 4118, which applies the cyclic prefix and beginning and ending windows (see e.g., FIG. 40) to the Acquisition symbol. Finally, unit 4115 includes an overlap and add unit 4120, which adds the symbol to a frame or superframe with appropriate overlapping with preceding and succeeding symbol in the window portions of the symbol as was illustrated in FIG. 40. The acquisition frame from unit 4120 is placed in the superframe by superframe assembly unit 4121. The assembled superframe is then input to transmitter circuitry 4122 for wireless transmission of the frame.

It is noted that the disclosed transmitter 4100 may be implemented as hardware, software, or firmware within a transmitter apparatus. Additionally, in the case of a software implementation, the transmitter 4100 could include an integrated circuit, such as an Application Specific Integrated Circuit (ASIC) including or interfacing with a computer readable medium having instructions stored thereon (such as a memory 4124, for example), the stored instructions, when executed by a processor, cause the processor to execute the methodology described later in this disclosure.

Figure 42:
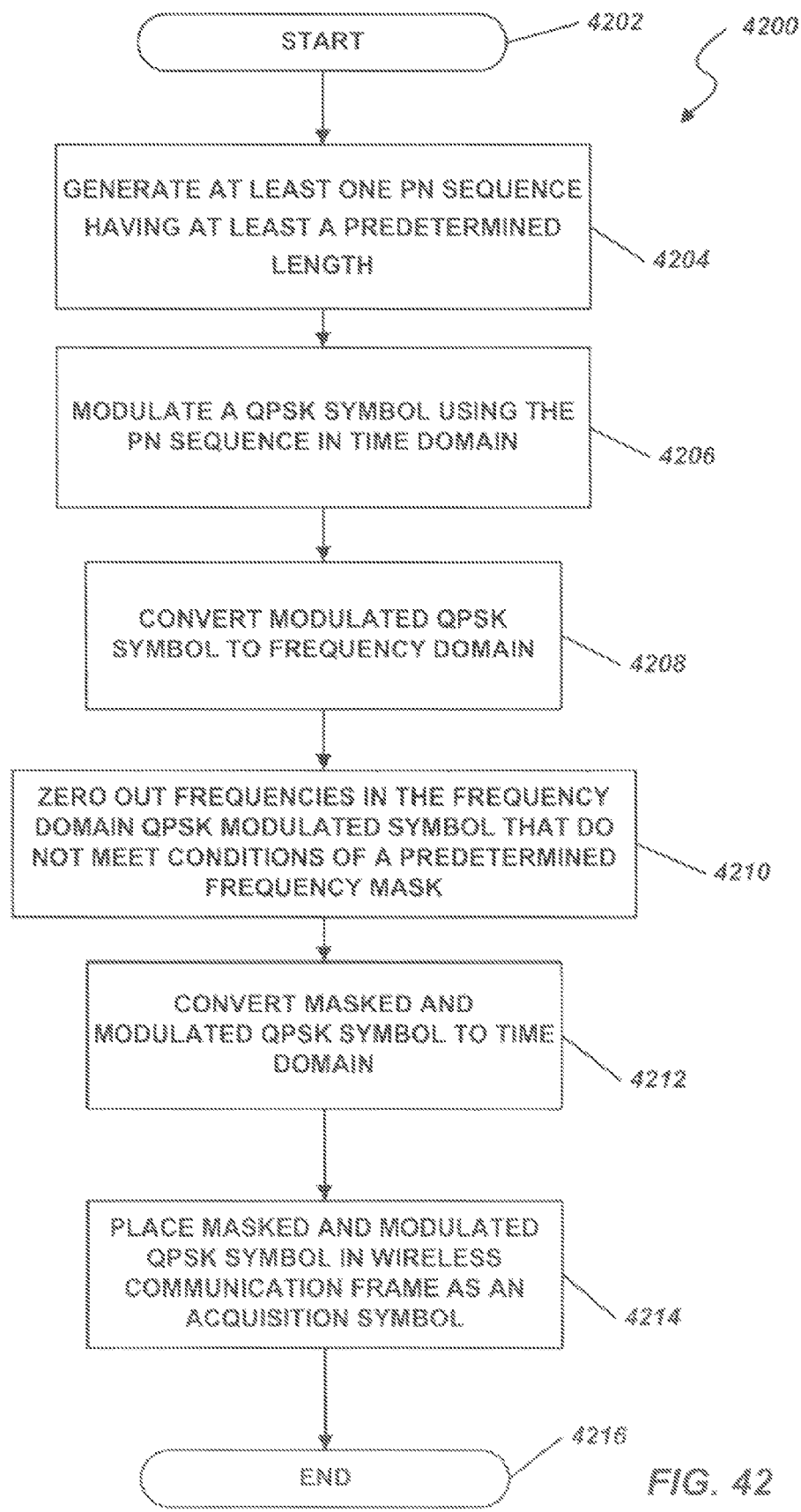
FIG. 42 shows a flow diagram of a method for constructing and transmitting the superframe including the Acquisition symbol as shown in FIG. 40.

FIG. 42 shows a flow diagram of a method for constructing and transmitting the OFDM or Acquisition symbol. The process 4200 begins at block 4202 and flow proceeds to block 4204. At block 4204 at least one PN sequence is generated. As discussed previously, the at least one PN sequence has at least a predetermined length, such as 2L, to ensure that no repeat of the sequence. It is noted that the process of block 4204 may be effected by the PN generator 4102 illustrated in FIG. 41 and discussed above or other suitable device. Furthermore, the process of block 4204 can be implemented such as by generating a sequence $p[n]^{(c)}$ from a C number of sequences each representative of a particular system configuration.

After the PN sequence is generated, flow proceeds to block 4206 where a time domain sequence, such as a QPSK symbol, is modulated using the PN sequence in time domain. This process may be effected by modulator 4108, or other similar device. The modulated symbol is then converted modulated to frequency domain as shown in block 4208. As an example, this conversion may be performed by FFT unit 4110 or other similar device for conversion of time domain symbols to frequency domain.

Once the symbol has been converted to frequency domain, flow proceeds to block 4210 where a frequency mask is applied to the symbol. In the disclosed example, frequencies in the frequency domain QPSK modulated symbol that do not meet conditions of a predetermined frequency mask are zeroed out. This process 4210 may be carried out by spectrum mask 4112 as shown in FIG. 41, or any other suitable device to ensure a desired frequency spectrum.

After the symbol has been masked, the masked and modulated QPSK symbol is converted back to time domain as illustrated in block 4212, such as with an IFFT (e.g., IFFT 4114). The time domain masked and modulated symbol is then placed in a wireless communication frame as the Acquisition or TDM1 symbol as illustrated in block 4214. This process may be effected by assembly unit 4115 and its component units as illustrated in FIG. 41, as an example. The process 4200 then ends at block 4216 and the resultant communication signal frame may then be transmitted.

Figure 43:
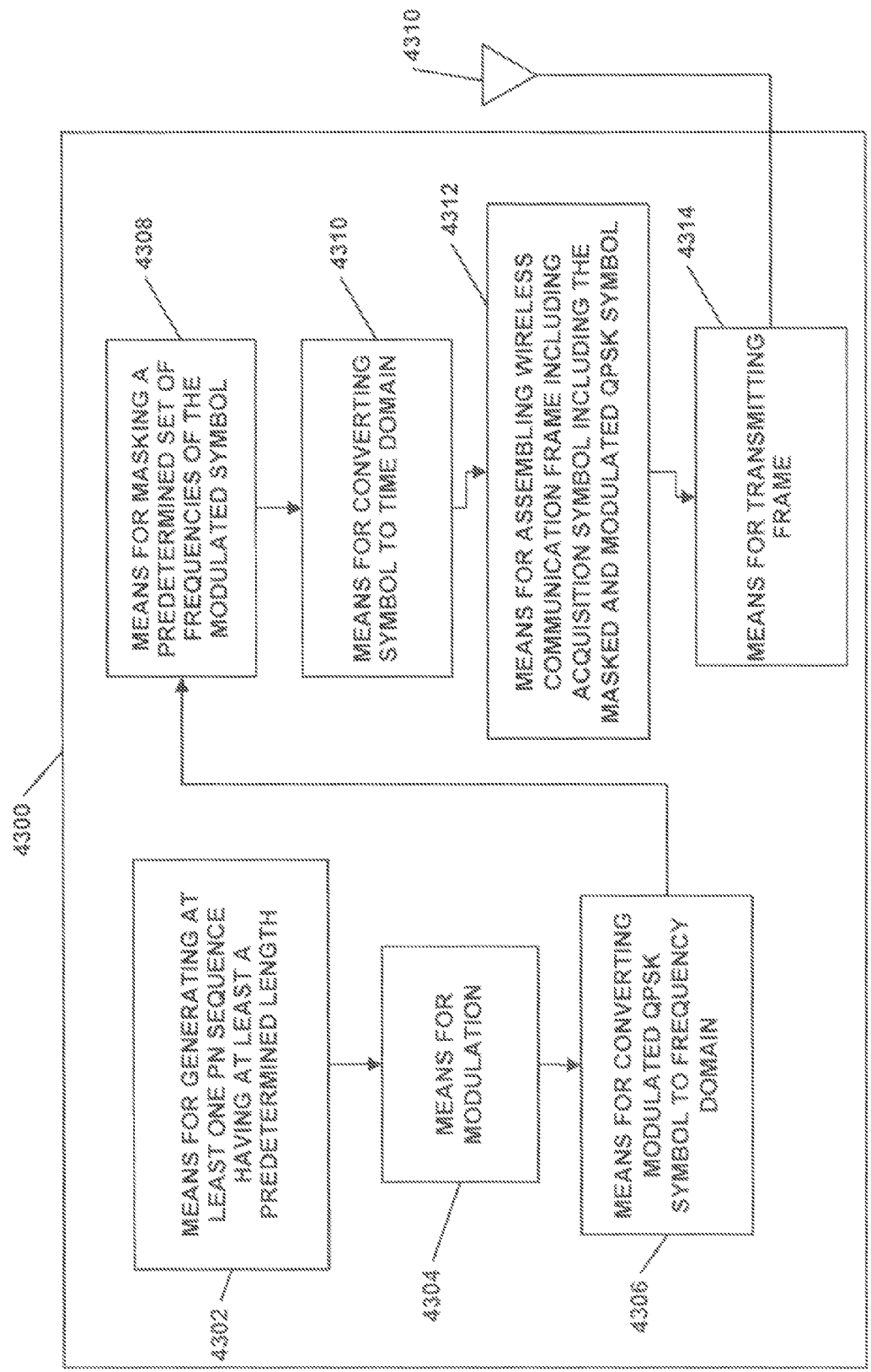
FIG. 43 shows another example of a transmitter for constructing and transmitting a superframe including the Acquisition pilot symbol exemplified in FIG. 40.

FIG. 43 illustrates another example of a transmitter 4300 for constructing and transmitting a frame or superframe including an alternative Acquisition pilot symbol (TDM1). The transmitter includes a means for Generating at least one PN sequence having at least a predetermined length 4302. Means 4302 outputs the PN sequence to means for modulation 4304, which utilizes the PN sequence to modulate a QPSK sequence or other suitable sequence. Means 4304 outputs the modulated symbol to means 4306 for means for converting the modulated QPSK symbol to frequency domain. Means 4306 may be implemented by FFT unit 4110 or equivalent device to convert a symbol from time domain to frequency domain.

Means 4306 outputs the converted modulated symbol to a means for masking a predetermined set of frequencies of the modulated symbol 4308. This means may be effected by a spectrum mask or any other equivalent device for ensuring a desired frequency spectrum of an communication symbol. After the symbol is masked by means 4306, the symbol is output to a means for converting the symbol to time domain 4310. This may be accomplished through use of an IFFT (e.g., 4114) or other equivalent device.

The symbol is then delivered to a means for assembling a wireless communication frame including an Acquisition Symbol including the masked and modulated QPSK symbol 4312. Once assembled, the frame or superframe may be transmitted via a means for transmitting 4314.

It is noted that when the transmitted Acquisition symbol is received by a receiver, for example, the received signal may be correlated against the PN modulated QPSK symbol sequence. As an example, the receiver may employ a match filter, where received signals are checked against the known PN sequences (e.g., the C number of PN sequences). Since the PN modulated QPSK symbol sequence is a sequence of $\pm 1 \pm j$, the correlation calculation can be made very efficient and the correlation output is less noisy than the delayed correlation. If the particular PN sequence being tested engenders a match in the received PN modulated Acquisition or TDM1 signal, the receiver can then derive information that the present system is of the type correlative to that particular PN sequence. In the case of a communication system employing the C number of PN sequence, receivers not yet detecting a TDM1 symbol would repeat checking PN sequences of the C number of sequences until a match is found or all the possible sequences are exhausted, indicating that a TDP Pilot 1 is not present at a given time.

In conclusion, the above-described apparatus and methods for effecting an alternative Acquisition Pilot symbol discussed above in connection with FIGS. 40-43, when compared to the methodology of FIG. 39, affords increased simplification of both transmitter and receiver designs and increased performance as well. The disclosed apparatus and methods are robust to periodic interferences such as tone jammer since a receiver of such transmissions does not look for periodicity in the received signal. Moreover, the presently disclosed apparatus and methods of FIGS. 40-43 afford increase timing accuracy because a PN sequence is used for timing and a correlation delay is thus avoided (e.g., multiplication of two noisy samples). Also afforded is a decrease in complexity (i.e., no delayed correlation calculation), AGC friendly and less delays by utilizing partial despreading. The Acquisition symbol has a minimum peak to average power ratio (PAPR).

The various illustrative logical blocks, modules, and circuits described in connection with the embodiments disclosed herein may be implemented or performed with a general purpose processor, digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, block, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

What is claimed is:

1. A transmitter comprising:
   a pseudo-random noise sequence generator configured to generate a plurality of pseudo-random noise sequences including a C number of pseudo-random noise subsequences, each pseudo-random noise sequence representing a different corresponding system information to be communicated to a receiver, each pseudo-random noise subsequence representing a corresponding configuration of a C number of different wireless system configurations;
   a modulator configured to construct an acquisition pilot symbol by modulating a time domain symbol sequence with one of the plurality of pseudo-random noise sequences;
   a spectrum mask unit configured to mask the acquisition pilot symbol to a prescribed frequency profile; and
   an assembly unit configured to place the modulated acquisition pilot symbol in a frame for wireless transmission.

2. A transmitter as defined in claim 1, wherein the time domain symbol sequence utilized by the modulator is a QPSK time domain symbol sequence.

3. A transmitter as defined in claim 1, wherein at least one pseudo-random noise sequence of the plurality of pseudo-random noise sequences is configured to have a length at least twice the length of the time domain symbol sequence.

4. A transmitter as defined in claim 1, further comprising:
   a fast Fourier transform unit configured to convert the acquisition pilot symbol modulated by the modulator to frequency domain for use by the spectrum mask unit.

5. A transmitter as defined in claim 4, further comprising:
   an inverse fast Fourier transform unit configured to convert the acquisition pilot symbol to frequency domain after the acquisition pilot symbol has been processed by the spectrum mask unit.

6. A transmitter, comprising:
   a pseudo-random noise sequence generator configured to generate a pseudo-random noise sequence that corresponds to predefined system information to be communicated to a receiver;

a modulator configured to construct an acquisition pilot symbol by modulating a time domain symbol sequence with the pseudo-random noise sequence;

a spectrum mask unit configured to mask the acquisition pilot symbol to a prescribed frequency profile; and an assembly unit configured to place the modulated acquisition pilot symbol in a frame for wireless transmission;

wherein the pseudo-random noise sequence generator is further configured to generate a C number of pseudo-random noise sequence segments, where each of the c number of pseudo-random noise sequence segments represents a different corresponding particular wireless system configuration of a C number of different wireless system configurations;

wherein the pseudo-random noise sequence generator is further configured to generate the C number of sequences by:

establishing a maximum length pseudo-random noise sequence having a number of bits as determined by the relationship $$1 + \left\lceil \log_2 \sum_{c=0}^{C-1} N^{(c)} \right\rceil$$

where N is the length of the time domain symbol sequence and c represents one of the C number of sequences, the maximum length pseudo-random noise sequence having with a length of at least $$2\sum_{c=0}^{C-1} N^{(c)};$$

and dividing the maximum length pseudo-random noise sequence into c non-overlapping pseudo-random noise segments each having a length 2N.

7. A method for constructing an acquisition pilot symbol comprising:

generating a plurality of pseudo-random noise sequences having at least a predetermined length including a C number of pseudo-random noise subsequences, each pseudo-random noise sequence representing a different corresponding system information, each pseudo-random noise subsequence representing a corresponding configuration of a C number of different wireless system configurations;

modulating a time domain symbol sequence with one of the plurality of pseudo-random noise sequences to create an acquisition pilot symbol;

masking the acquisition pilot symbol to a prescribed frequency profile; and placing the modulated and masked acquisition pilot symbol in a frame for wireless transmission.

8. A method as defined in claim 7, wherein the time domain symbol sequence is a QPSK time domain symbol sequence.

9. A method as defined in claim 7, wherein at least one pseudo-random noise sequence of the plurality of pseudo-random noise sequences is configured to have a length at least twice the length of the time domain symbol sequence.

10. A method as defined in claim 7, further comprising:
converting the modulated acquisition pilot symbol to frequency domain with a fast Fourier transform prior to masking.

11. A method as defined in claim 10, further comprising:
converting the acquisition pilot symbol to frequency domain using a inverse fast Fourier transform after the acquisition pilot symbol has been masked.

12. A method for constructing an acquisition pilot symbol, comprising:

generating at least one pseudo-random noise sequence having at least a predetermined length, where the at least one pseudo-random noise sequence represents a system configuration of a wireless system;

modulating a time domain symbol sequence with the at least one pseudo-random noise sequence to create an acquisition pilot symbol;

masking the acquisition pilot symbol to a prescribed frequency profile; and placing the modulated and masked acquisition pilot symbol in a frame for wireless transmission;

wherein generating the at least one pseudo-random noise sequence includes generating a C number of pseudo-random noise sequence segments, where each of the C number of pseudo-random noise sequence segments represents a different corresponding particular wireless system configuration of a C number of different wireless system configurations;

wherein generating the C number of pseudo-random noise sequences further includes:

establishing a maximum length pseudo-random noise sequence having a number of bits as determined by the relationship $$1 + \left\lceil \log_2 \sum_{c=0}^{C-1} N^{(c)} \right\rceil$$

where N is the length of the time domain symbol sequence and c represents one of the C number of sequences, the maximum length pseudo-random noise sequence having with a length of at least $$2\sum_{c=0}^{C-1} N^{(c)};$$

and dividing the maximum length pseudo-random noise sequence into C non-overlapping PN segments each having a length 2N.

13. A processor for use in a wireless communication device comprising:

a pseudo-random noise sequence generator configured to generate a plurality of pseudo-random noise sequences including a C number of pseudo-random noise subsequences, each pseudo-random noise sequence representing a different corresponding system information to be communicated to a receiver, each pseudo-random noise subsequence representing a corresponding configuration of a C number of different wireless system configurations;

a modulator configured to construct an acquisition pilot symbol by modulating a time domain symbol sequence with one of the plurality of pseudo-random noise sequences;

a spectrum mask unit configured to mask the acquisition pilot symbol to a prescribed frequency profile; and an assembly unit configured to place the modulated acquisition pilot symbol in a frame for wireless transmission.

14. A processor as defined in claim 13, wherein the time domain symbol sequence utilized by the modulator is a QPSK time domain symbol sequence.

15. A processor as defined in claim 13, wherein at least one pseudo-random noise sequence of the plurality of pseudo-random noise sequences is configured to have a length at least twice the length of the time domain symbol sequence.

16. A processor as defined in claim 13, further comprising:
a fast Fourier transform unit configured to convert the acquisition pilot symbol modulated by the modulator to frequency domain for use by the spectrum mask unit.

17. A processor as defined in claim 16, further comprising:
an inverse fast Fourier transform unit configured to convert the acquisition pilot symbol to frequency domain after the acquisition pilot symbol has been processed by the spectrum mask unit.

18. A processor, comprising:
a pseudo-random noise sequence generator configured to generate a pseudo-random noise sequence that corresponds to predefined system information to be communicated to a receiver;
a modulator configured to construct an acquisition pilot symbol by modulating a time domain symbol sequence with the pseudo-random noise sequence;
a spectrum mask unit configured to mask the acquisition pilot symbol to a prescribed frequency profile; and
an assembly unit configured to place the modulated acquisition pilot symbol in a frame for wireless transmission;
wherein the pseudo-random noise sequence generator is further configured to generate a C number of pseudo-random noise sequence segments, where each of the c number of pseudo-random noise sequence segments represents a different corresponding particular wireless system configuration of a C number of different wireless system configurations;
wherein the pseudo-random noise sequence generator is further configured to generate the C number of sequences by:
establishing a maximum length pseudo-random noise sequence having a number of bits as determined by the relationship $$1 + \left\lceil \log_2 \sum_{c=0}^{C-1} N^{(c)} \right\rceil$$

where N is the length of the time domain symbol sequence and c represents one of the C number of sequences, the maximum length pseudo-random noise sequence having with a length of at least $$2 \sum_{c=0}^{C-1} N^{(c)};$$

and
dividing the maximum length pseudo-random noise sequence into C non-overlapping pseudo-random noise segments each having a length 2N.

19. An apparatus for use in a wireless communication device comprising:
means for generating a plurality of pseudo-random noise sequences having at least a predetermined length including a C number of pseudo-random noise subsequences, each pseudo-random noise sequence representing a different corresponding system information, each pseudo-random noise subsequence representing a corresponding configuration of a C number of different wireless system configurations;
means for modulating a time domain symbol sequence with one of the plurality of pseudo-random noise sequences to create an acquisition pilot symbol;
means for masking the acquisition pilot symbol to a prescribed frequency profile; and
means for placing the modulated and masked acquisition pilot symbol in a frame for wireless transmission.

20. An apparatus as defined in claim 19, wherein the time domain symbol sequence is a QPSK time domain symbol sequence.

21. An apparatus as defined in claim 19, wherein the means for generating the plurality of pseudo-random noise sequences is further configured to generate at least one pseudo-random noise sequence of the plurality of pseudo-random noise sequences to have a length at least twice the length of the time domain symbol sequence.

22. An apparatus as defined in claim 19, further comprising:
means for converting the modulated acquisition pilot symbol to frequency domain with a fast Fourier transform prior to masking.

23. An apparatus as defined in claim 22, further comprising:
means for converting the acquisition pilot symbol to frequency domain using a inverse fast Fourier transform after the acquisition pilot symbol has been masked.

24. A processor for use in a wireless communication device, comprising:
means for generating at least one pseudo-random noise sequence having at least a predetermined length, where the at least one pseudo-random noise sequence represents a system configuration of a wireless system;
means for modulating a time domain symbol sequence with the at least one pseudo-random noise sequence to create an acquisition pilot symbol;
means for masking the acquisition pilot symbol to a prescribed frequency profile; and
means for placing the modulated and masked acquisition pilot symbol in a frame for wireless transmission;
wherein the means for generating the at least one pseudo-random noise sequence is further configured to generate a C number of pseudo-random noise sequence segments, where each of the C number of pseudo-random noise sequence segments represents a different corresponding particular wireless system configuration of a C number of different wireless system configurations;
wherein the means for generating the pseudo-random noise sequences is further configured to generate the C number of pseudo-random noise sequences by:
establishing a maximum length pseudo-random noise sequence having a number of bits as determined by the relationship $$1 + \left[\log_2 \sum_{c=0}^{C-1} N^{(c)}\right]$$

where N is the length of the time domain symbol sequence and c represents one of the C number of sequences, the maximum length PN sequence having with a length of at least $$2 \sum_{c=0}^{C-1} N^{(c)};$$

and dividing the maximum length PN sequence into C non-overlapping PN segments each having a length 2N.

25. A non-transitory computer-readable medium encoded with a set of instructions, the instructions comprising:

an instruction for generating a plurality of pseudo-random noise sequences having at least a predetermined length including a C number of pseudo-random noise subsequences, each pseudo-random noise sequence representing a different corresponding system information, each pseudo-random noise subsequence representing a corresponding configuration of a C number of different wireless system configurations;

an instruction for modulating a time domain symbol sequence with one of the plurality of pseudo-random noise sequences to create an acquisition pilot symbol;

an instruction for masking the acquisition pilot symbol to a prescribed frequency profile; and an instruction for placing the modulated and masked acquisition pilot symbol in a frame for wireless transmission.

26. A non-transitory computer-readable medium as defined in claim 25, wherein the time domain symbol sequence is a QPSK time domain symbol sequence.

27. A non-transitory computer-readable medium as defined in claim 25, wherein at least one pseudo-random noise sequence of the plurality of pseudo-random noise sequences is configured to have a length at least twice the length of the time domain symbol sequence.

28. A non-transitory computer-readable medium as defined in claim 25, further comprising:

an instruction for converting the modulated acquisition pilot symbol to frequency domain with a fast Fourier transform prior to masking.

29. A non-transitory computer readable medium as defined in claim 28, further comprising:

an instruction for converting the acquisition pilot symbol to frequency domain using a inverse fast Fourier transform after the acquisition pilot symbol has been masked.

30. A non-transitory computer readable medium encoded with a set of instructions, the instructions comprising:

an instruction for generating at least one pseudo-random noise sequence having at least a predetermined length, where the at least one pseudo-random noise sequence represents a system configuration of a wireless system;

an instruction for modulating a time domain symbol sequence with the at least one pseudo-random noise sequence to create an acquisition pilot symbol;

an instruction for masking the acquisition pilot symbol to a prescribed frequency profile; and an instruction for placing the modulated and masked acquisition pilot symbol in a frame for wireless transmission;

wherein the instruction for generating the at least one pseudo-random noise sequence includes an instruction for generating a C number of pseudo-random noise sequence segments, where each of the C number of pseudo-random noise sequence segments represents a different corresponding particular wireless system configuration of a C number of different wireless system configurations;

wherein generating the C number of pseudo-random noise sequences further includes:

an instruction for establishing a maximum length pseudo-random noise sequence having a number of bits as determined by the relationship $$1 + \left[\log_2 \sum_{c=0}^{C-1} N^{(c)}\right]$$

where N is the length of the time domain symbol sequence and c represents one of the C number of sequences, the maximum length PN sequence having with a length of at least $$2 \sum_{c=0}^{C-1} N^{(c)};$$

and an instruction for dividing the maximum length PN sequence into C non-overlapping PN segments each having a length 2N.

* * * * *